(12) United States Patent
Kiyotoshi et al.

(10) Patent No.: US 8,766,373 B2
(45) Date of Patent: *Jul. 1, 2014

(54) SEMICONDUCTOR MEMORY AND METHOD OF MANUFACTURING THE SAME

(75) Inventors: Masahiro Kiyotoshi, Sagamihara (JP);
Akihito Yamamoto, Naka-gun (JP);
Yoshio Ozawa, Yokohama (JP);
Fumitaka Arai, Yokohama (JP);
Riichiro Shirota, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

This patent is subject to a terminal disclaimer.

(21) Appl. No.: 13/185,930

(22) Filed: Jul. 19, 2011

(65) Prior Publication Data

US 2011/0272745 A1 Nov. 10, 2011

Related U.S. Application Data

(63) Continuation of application No. 11/858,732, filed on Sep. 20, 2007, now Pat. No. 7,518,011.

(30) Foreign Application Priority Data

Sep. 21, 2006 (JP) .................................. 2006-256194

(51) Int. Cl.
*H01L 21/70* (2006.01)

(52) U.S. Cl.
USPC .................................. 257/390; 257/E27.103

(58) Field of Classification Search
None
See application file for complete search history.

(56) References Cited

U.S. PATENT DOCUMENTS

| | | | |
|---|---|---|---|
| 4,389,705 A * | 6/1983 | Sheppard | ....................... 365/104 |
| 6,380,033 B1 | 4/2002 | He et al. | |
| 6,534,403 B2 | 3/2003 | Cleeves | |
| 2005/0012119 A1 | 1/2005 | Herner et al. | |
| 2005/0012120 A1 | 1/2005 | Herner et al. | |
| 2005/0012154 A1 | 1/2005 | Herner et al. | |

(Continued)

FOREIGN PATENT DOCUMENTS

| | | |
|---|---|---|
| JP | 7-235649 | 9/1995 |
| JP | 2000-353803 | 12/2000 |

(Continued)

OTHER PUBLICATIONS

S. Jung, et al., "Three Dimensionally Stack NAND Flash Memory Technology Using Stacking Single Crystal Si Layers on ILD and TANOS Structure for Beyond 30nm Node", Tech. Digest of IEDM 2006, 2.3.1-2.3.4.

(Continued)

*Primary Examiner* — Vongsavanh Sengdara

(74) *Attorney, Agent, or Firm* — Finnegan, Henderson, Farabow, Garrett & Dunner, LLP

(57) ABSTRACT

A semiconductor memory includes a plurality of stripe-like active areas formed by stacking, in a direction perpendicular to a substrate, a plurality of layers extending parallel to the substrate, a first gate electrode formed on first side surfaces of the active areas, the first side surfaces being perpendicular to the substrate, a second gate electrode formed on second side surfaces of the active areas, the second side surfaces being perpendicular to the substrate. The layers are patterned in self-alignment with each other, intersections of the active areas and the first gate electrode form a plurality of memory cells, and the plurality of memory cells in an intersecting plane share the first gate electrode.

11 Claims, 49 Drawing Sheets

(56) References Cited

U.S. PATENT DOCUMENTS

| | | |
|---|---|---|
| 2005/0012220 A1 | 1/2005 | Vyvoda et al. |
| 2005/0014322 A1 | 1/2005 | Herner et al. |
| 2005/0014334 A1 | 1/2005 | Herner et al. |
| 2006/0186446 A1 | 8/2006 | Kim et al. |
| 2007/0018201 A1* | 1/2007 | Specht et al. ............ 257/204 |
| 2007/0138536 A1 | 6/2007 | Arai et al. |
| 2007/0200168 A1 | 8/2007 | Ozawa et al. |
| 2008/0258203 A1 | 10/2008 | Happ et al. |
| 2008/0259687 A1 | 10/2008 | Specht et al. |

FOREIGN PATENT DOCUMENTS

| | | |
|---|---|---|
| JP | 2004-152893 | 5/2004 |
| JP | 2006-155750 | 6/2006 |
| JP | 2007-42877 | 2/2007 |
| JP | 2008-42206 | 2/2008 |
| JP | 4403356 | 11/2009 |
| KR | 2001-0014937 | 2/2001 |
| KR | 2002-065387 | 8/2002 |

OTHER PUBLICATIONS

A. Walker et al., "3D TFT-SONOS Memory Cell for Ultra-High Density File Storage Applications", 2003 Symposium on VLSI Technology Digest of Technical Papers, (2 pages).

E. Lai, et al. "A Multi-Layer Stackable Thin-Film Transistor (TFT) NAND-Type Flash Memory," International Electron Device Meeting 2006, pp. 41-44.

"Notice of Reasons for Rejection" issued in copending Japanese patent application No. 2006-256194, mailed on Feb. 22, 2011, and English-language translation thereof (9 pages total).

Notification for Filing Opinion issued by the Korean Patent Office in copending Application No. 10-2007-95646 mailed Jul. 28, 2009, and English language translation thereof.

Notification for Filing Opinion in copending application 10-2007-95646, mailed Sep. 16, 2008, and English translation thereof.

Sagara et al., "A 0.72 $\mu m^7$ Receseed STC (RSTC) Technology for 256Mbit DRAMs Using Quarter-Micron Phase-Shit Lithography," *Symposium on VLSI Technology Digest of Technical Papers*, pp. 10-11 (1992).

\* cited by examiner

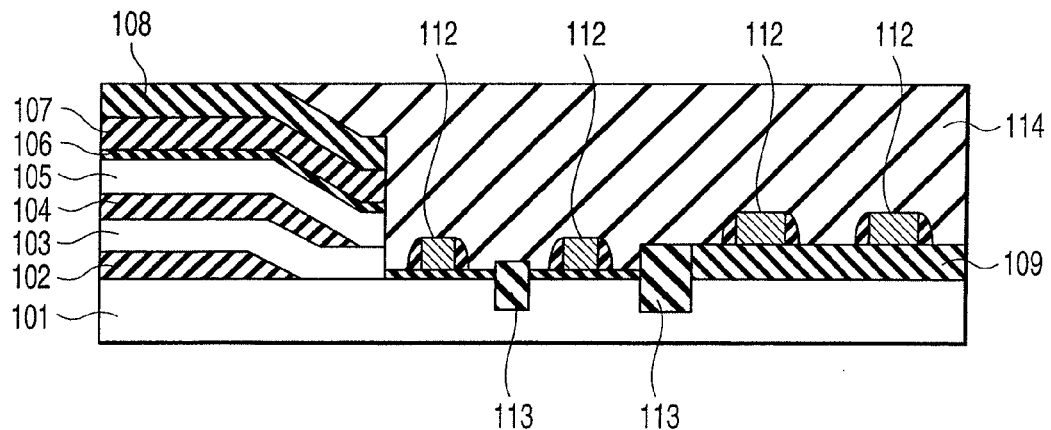
F I G. 3
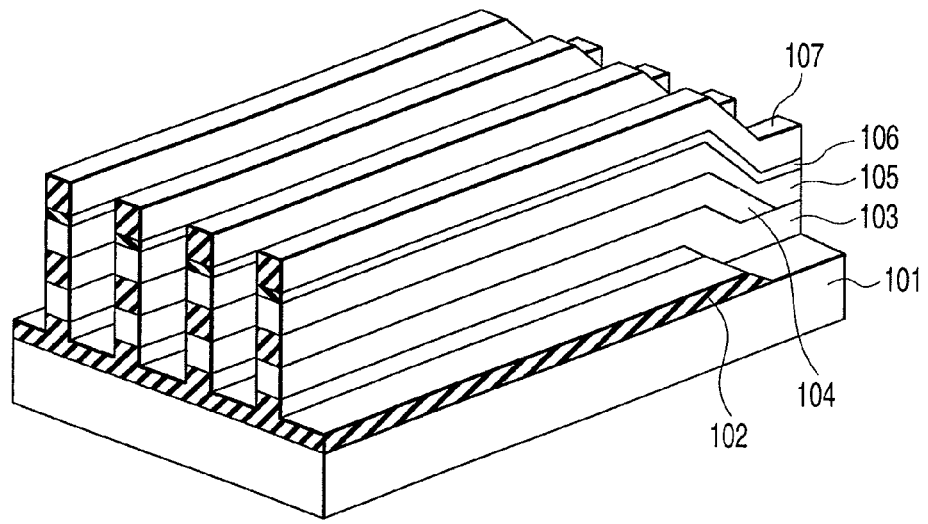
F I G. 4

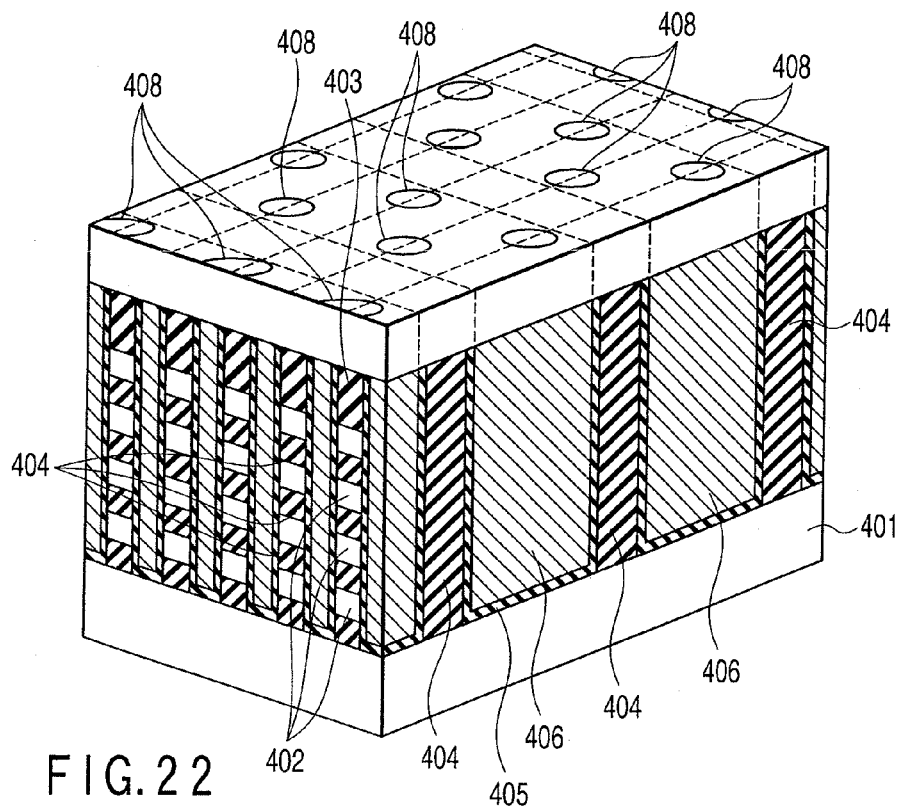
F I G. 22
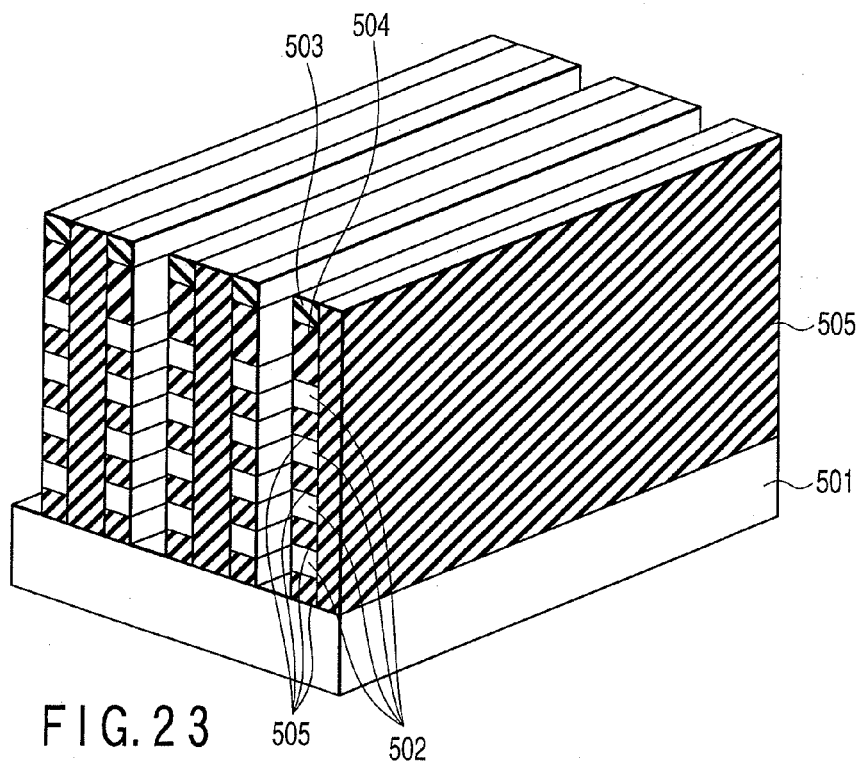
F I G. 23

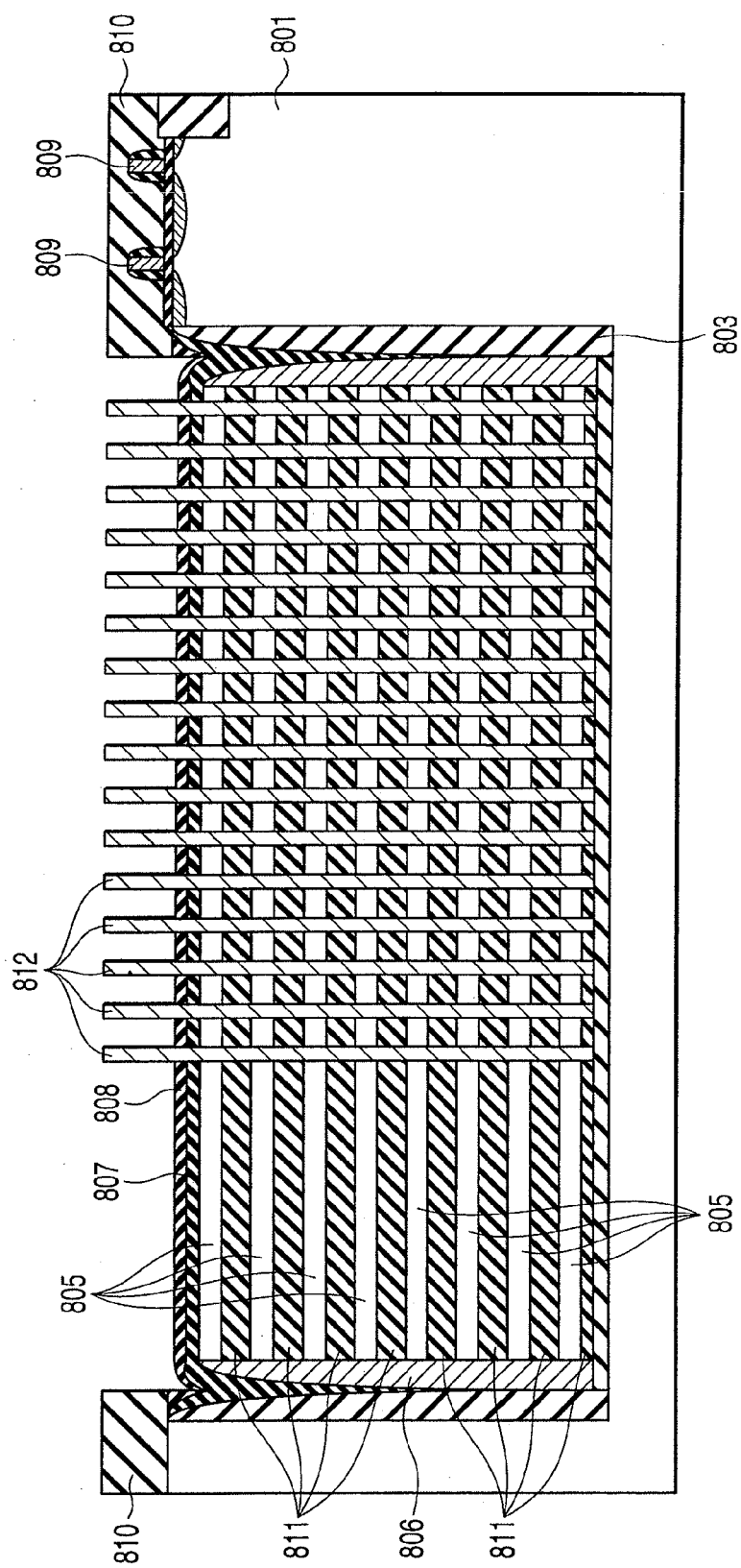
F I G. 45

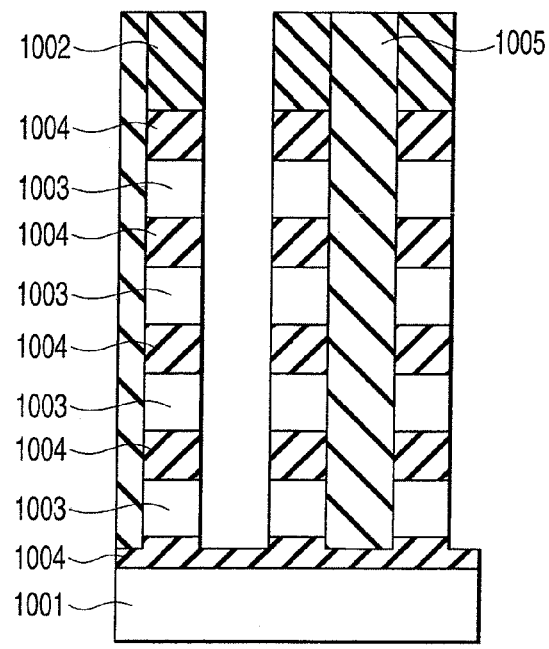
F I G. 5 7
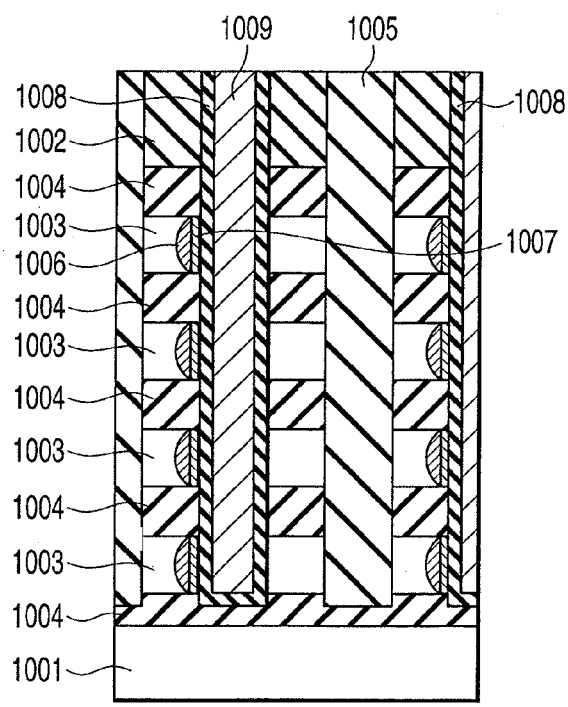
F I G. 5 8

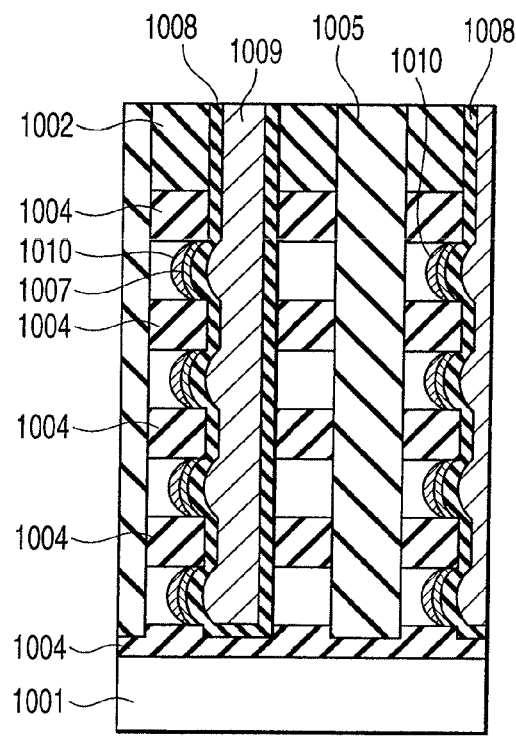
F I G. 5 9
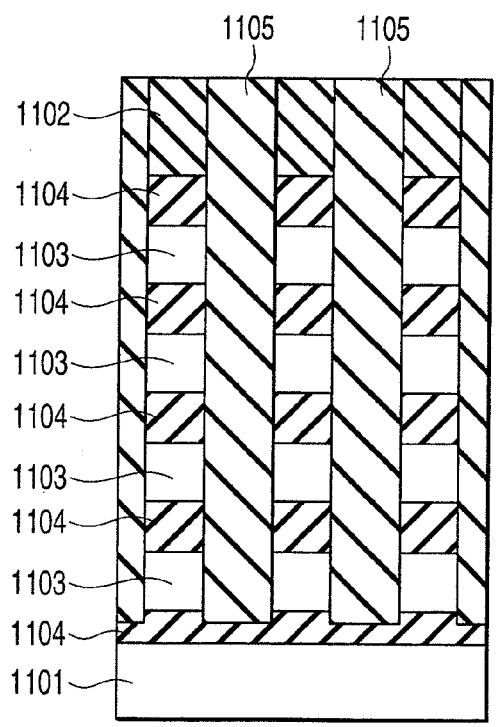
F I G. 6 0

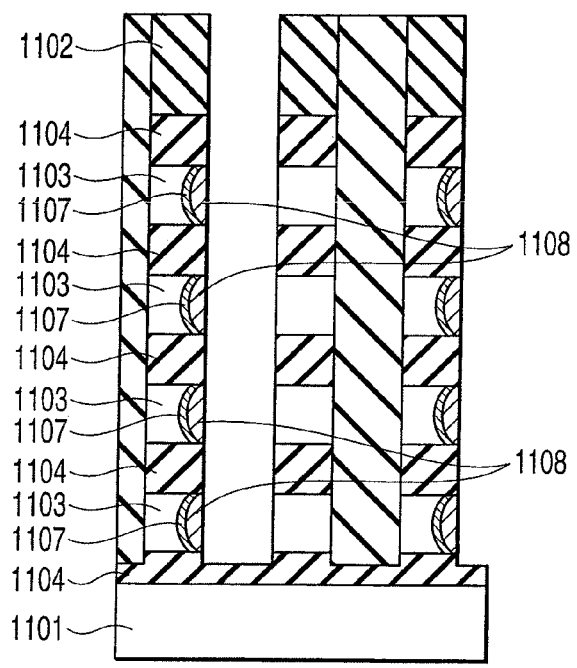
F I G. 6 1
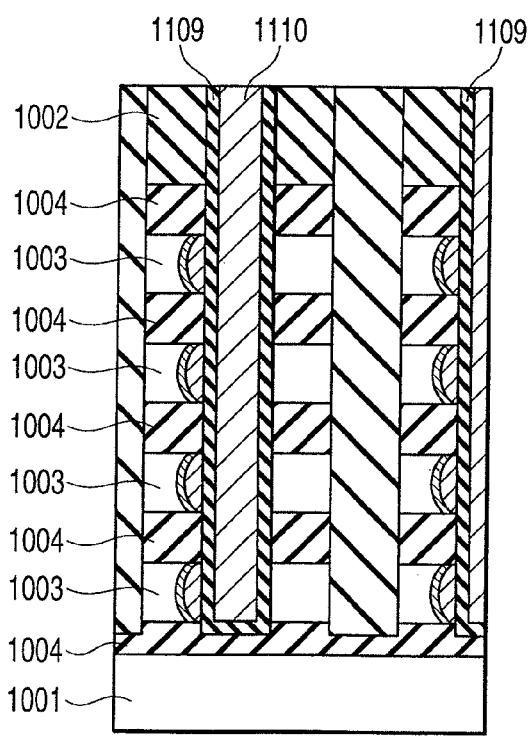
F I G. 6 2

SEMICONDUCTOR MEMORY AND METHOD OF MANUFACTURING THE SAME

CROSS-REFERENCE TO RELATED APPLICATIONS

This is a continuation of Application Ser. No. 11/858,731, filed Sep. 20, 2007, which is incorporated herein by reference.

BACKGROUND OF THE INVENTION

1. Field of the Invention

The present invention relates to a semiconductor memory and a method of manufacturing the same.

2. Description of the Related Art

Flash memories are widely used to store large-volume data in, e.g., cell phones, digital still cameras (DSCs), USB memories, and silicon audio, and the markets of these flash memories keep extending due to the reduction in manufacturing cost per bit (bit cost) resulting from rapid scaling of the device dimension. New applications are also rapidly rising. The result is a favorable cycle in which the rapid scaling-down and the reduction in manufacturing cost find new markets.

In particular, a NAND flash memory has achieved a practical cross-point cell by allowing a plurality of active areas (AAs) to share a gate electrode (GC), and its simple structure allows rapid progress of scaling. NAND flash memories are beginning to be widely used for storage purposes in, e.g., the USB memories and silicon audio described above, since the above-mentioned rapid scaling-down reduces the bit cost. Accordingly, the recent NAND flash memories are leading devices of LSI (Large Scale Integration) scaling, and the minimum half pitch has reached 0.1 µm or less even on the mass-production level. Although the technical difficulties are also abruptly increasing with the rapid scaling of the dimension, demands are arising for further scaling in the future.

Unfortunately, many problems must be solved to further scaling of flash memories. The problems are enumerated below:

(1) The development of lithography techniques cannot follow the rapid device scaling. Presently, mass-production of lithography apparatuses starts immediately after they are put on sale. In the future, therefore, it is necessary to increase the bit density while keeping the lithography techniques in status quo.

(2) Since the dimensions of elements decrease as micropatterning progresses, the short-channel effect or narrow-channel effect abruptly worsens. This makes it difficult to ensure the reliability and increase the operating speed of nonvolatile memories generation by generation.

(3) As scaling advances, the dimensions of elements decrease. Therefore, statistical variations in numbers of atoms of dopant impurities of transistors and the like presumably worsen the device characteristics or the variations in device characteristics in the future.

Accordingly, it is highly likely to become difficult to continuously increase the bit density in the future by simple scaling of elements size in the horizontal plane only.

The present inventor, therefore, has invented a stacked memory as a semiconductor memory structure capable of relatively easily increasing the bit density of memory elements, without entirely depending upon micropatterning of the lithography techniques, and a method of manufacturing the stacked memory.

As well-known examples of stacked memories, methods of sequentially stacking memory layers as described in patent references 1 to 8, and some stacked memories are presently mass-produced. However, any of these methods forms memory layers by stacking one layer at a time. If the number of memory layers increases, therefore, the number of manufacturing steps largely increases.

[Patent reference 1] Jpn. Pat. Appln. KOKAI Publication No. 7-235649

[Patent reference 2] U.S. Pat. No. 6,534,403B2

[Patent reference 3] United States Patent Application Publication Pub. No. US2005/0014334A1

[Patent reference 4] United States Patent Application Publication Pub. No. US2005/0012119A1

[Patent reference 5] United States Patent Application Publication Pub. No. US2005/0012120A1

[Patent reference 6] United States Patent Application Publication Pub. No. US2005/0012154A1

[Patent reference 7] United States Patent Application Publication Pub. No. US2005/0012220A1

[Patent reference 8] United States Patent Application Publication Pub. No. US2005/0014322A1

BRIEF SUMMARY OF THE INVENTION

A semiconductor memory according to the first aspect of the present invention comprises a plurality of stripe-like active areas formed by stacking, in a direction perpendicular to a substrate, a plurality of layers extending parallel to the substrate, a first gate electrode formed on first side surfaces of the active areas, the first side surfaces being perpendicular to the substrate, a second gate electrode formed on second side surfaces of the active areas, the second side surfaces being perpendicular to the substrate, and wherein the layers are patterned in self-alignment with each other, intersections of the active areas and the first gate electrode form a plurality of memory cells, and the plurality of memory cells in an intersecting plane share the first gate electrode.

A semiconductor memory manufacturing method according to the second aspect of the present invention comprises depositing a plurality of layers on a substrate, forming a plurality of stripe-like active areas by processing the layers in self-alignment with each other, and forming a plurality of gate electrodes intersecting the active areas in a longitudinal direction thereof, wherein each of the active areas uses, as a channel region, at least one of two side surfaces perpendicular to the substrate, intersections of the active areas and the gate electrodes form memory cells, and a plurality of memory cells in an intersecting plane share the gate electrode.

BRIEF DESCRIPTION OF THE SEVERAL VIEWS OF THE DRAWING

FIG. 3 is a sectional view showing a main manufacturing step of the semiconductor memory according to the first embodiment of the present invention;

FIG. 4 is a perspective view showing a main manufacturing step of the semiconductor memory according to the first embodiment of the present invention;

FIG. 22 is a perspective view showing a main manufacturing step of the semiconductor memory according to the fourth embodiment of the present invention;

FIG. 23 is a perspective view showing a main manufacturing step of a semiconductor memory according to the fifth embodiment of the present invention;

FIG. 45 is a sectional view showing a main manufacturing step of the semiconductor memory according to the seventh embodiment of the present invention;

FIG. 57 is a sectional view showing a main manufacturing step of the semiconductor memory according to the ninth embodiment of the present invention;

FIG. 58 is a sectional view showing a main manufacturing step of the semiconductor memory according to the ninth embodiment of the present invention;

FIG. 59 is a sectional view showing a semiconductor memory according to a modification of the ninth embodiment of the present invention;

FIG. 60 is a sectional view showing a main manufacturing step of a semiconductor memory according to the 10th embodiment of the present invention;

FIG. 61 is a sectional view showing a main manufacturing step of the semiconductor memory according to the 10th embodiment of the present invention;

FIG. 62 is a sectional view showing a main manufacturing step of the semiconductor memory according to the 10th embodiment of the present invention;

DETAILED DESCRIPTION OF THE INVENTION

Figure 1:
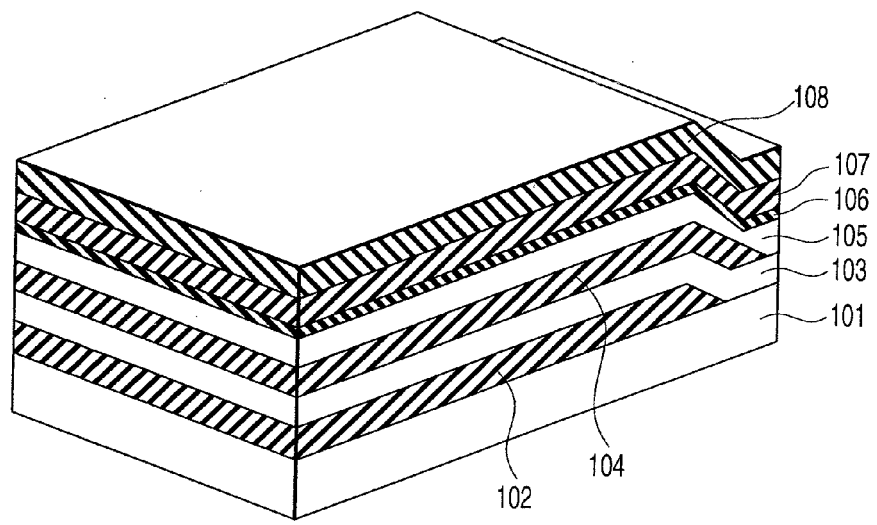
FIG. 1 is a perspective view showing a main manufacturing step of a semiconductor memory according to the first embodiment of the present invention.

Outlines of semiconductor memories and methods of manufacturing the same to be disclosed in the following embodiments are:

A semiconductor memory that is a stacked memory in which a plurality of active area (AA) layers are stacked parallel to a substrate, and these stacked AAs are controlled by a common gate electrode (GC).

A semiconductor memory manufacturing method comprising a step of stacking, as AA layers, a plurality of single-crystal silicon layers, polysilicon layers, or amorphous silicon layers to be finally converted into polysilicon layers, via interlayer dielectrics or single-crystal silicon germanium films, and simultaneously processing the stacked layers, thereby forming a plurality of AAs stacked parallel to a substrate, and a step of forming a conductor film serving as a GC on the entire substrate surface, and processing the conductor film by reactive ion etching (RIE) or chemical-mechanical polishing (CMP), thereby forming GCs of the stacked AAs at once.

The stacked memory and the method of manufacturing the same described above can further increase the bit density compared to the conventional memories and methods.

Also, the stacked memory has layer selection gate transistors for selecting a layer among the stacked layers. This makes it possible to use peripheral circuits without largely changing the conventional flash memories, while the number of times of lithography is small and the bit density is high.

Several embodiments of the present invention will be explained below with reference to the accompanying drawing. Note that the same reference numerals denote the same parts in the drawing.

(First Embodiment)

Each of FIGS. 1 to 7 is a perspective, sectional, or plan view showing a semiconductor memory (flash memory) according to the first embodiment of the present invention in a predetermined main manufacturing step.

This embodiment is directed to a two-layered memory in which single-crystal silicon layers serving as AA regions are formed by solid-phase epitaxial growth.

First, as shown in FIG. 1, a silicon thermal oxide film 102 serving as an interlayer dielectric (ILD) is formed to have a thickness of, e.g., about 50 nm on a semiconductor substrate 101. Then, the conventional lithography technique and etching technique are used to expose portions of the substrate as seeds of solid-phase growth. An amorphous silicon film about, e.g., 60 nm thick is formed on the entire surface of the substrate. Subsequently, annealing is performed to cause solid-phase epitaxial growth of the amorphous silicon film from the exposed portions of the substrate, thereby forming a single-crystal silicon film 103 about, e.g., 60 nm thick on the thermal oxide film 102. A CVD silicon oxide film 104 serving as an interlayer dielectric is formed to have a thickness of, e.g., about 50 nm. Then, the conventional lithography technique and RIE technique are used to expose portions of the substrate as seeds of solid-phase growth again. An amorphous silicon film about, e.g., 60 nm thick is formed on the entire surface of the substrate. Subsequently, annealing is performed to cause solid-phase growth of the amorphous silicon film from the exposed portions of the substrate, thereby forming a single-crystal silicon film 105 about, e.g., 60 nm thick on the CVD silicon oxide film 104. After that, a silicon thermal oxide film 106 about, e.g., 2 nm thick is formed on the single-crystal silicon film 105, a silicon nitride film 107 about, e.g., 60 nm thick is formed on the silicon thermal oxide film 106, and a CVD silicon oxide film 108 about, e.g., 100 nm thick is formed on the silicon nitride film 107.

Figure 2:
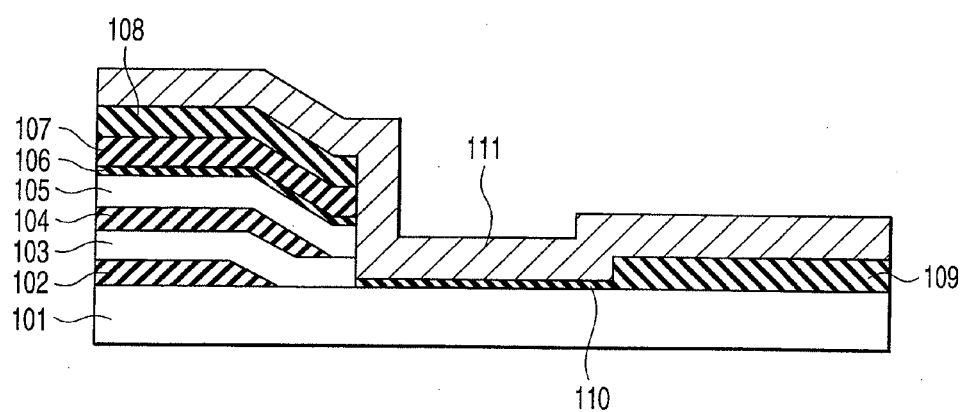
FIG. 2 is a sectional view showing a main manufacturing step of the semiconductor memory according to the first embodiment of the present invention.

Then, as shown in FIG. 2, the conventional lithography technique and RIE technique are used to sequentially remove the CVD silicon oxide film 108, silicon nitride film 107, silicon thermal oxide film 106, single-crystal silicon film 105, CVD silicon oxide film 104, single-crystal silicon film 103, and silicon thermal oxide film 102 from a peripheral circuit portion, thereby exposing the surface of the semiconductor substrate 101. A thermal oxide film 109 serving as a gate oxide film of a high-voltage transistor is formed to have a thickness of, e.g., about 35 nm on the exposed surface of the semiconductor substrate 101. Subsequently, the conventional lithography technique and wet etching are used to remove the thermal oxide film 109 from a low-voltage transistor region. On this region from which the thermal oxide film 109 is removed, a thermal oxide film 110 serving as a gate oxide film of a low-voltage transistor is formed to have a thickness smaller than that of the thermal oxide film 109. After that, a polysilicon film 111 serving as a gate electrode is formed to have a thickness of, e.g., 100 nm on the entire substrate surface.

As shown in FIG. 3, the conventional transistor formation procedure is used to form transistors 112 and shallow trench isolations (STIs) 113 in the peripheral circuit portion. An interlayer dielectric 114 is formed on the entire substrate surface, and the upper surface of the interlayer dielectric 114 is planarized.

Subsequently, as shown in FIG. 4, the conventional lithography technique and RIE technique are used to process the polysilicon film 111 and CVD silicon oxide film 108. The processed polysilicon films 111 and CVD silicon oxide films 108 are used as hard masks to sequentially process the silicon nitride film 107, CVD silicon oxide film 106, single-crystal silicon film 105, CVD silicon oxide film 104, and single-crystal silicon film 103, and over-etch the silicon thermal oxide film 102, thereby forming stripe patterns serving as AA regions of a multilayered memory.

Figure 5:
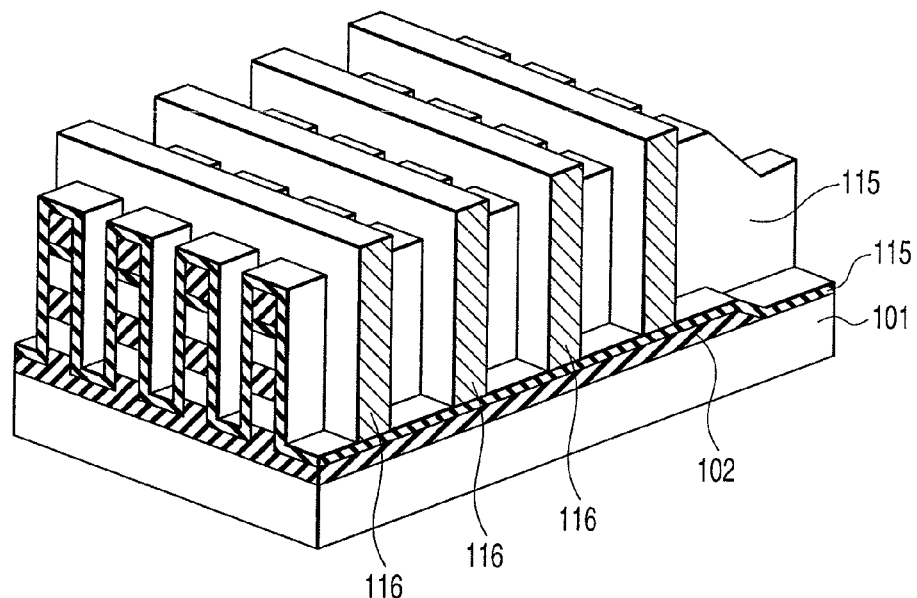
FIG. 5 is a perspective view showing a main manufacturing step of the semiconductor memory according to the first embodiment of the present invention.

As shown in FIG. 5, the end faces of the AA regions exposed by the processing are thermally oxidized, and the thermal oxide films are removed by dry pre-treatment, thereby removing the processing damage. Then, silicon thermal oxide films/CVD silicon nitride films/ALD-alumina films 115 serving as memory dielectric layers are sequentially formed. Subsequently, phosphorus (P)-doped polysilicon films 116 serving as gate electrodes are filled between the AAs. This embodiment processes the gate electrodes by using the conventional lithography technique and reactive ion etching. Consequently, the stacked AA regions share the gate electrodes.

Figure 6:
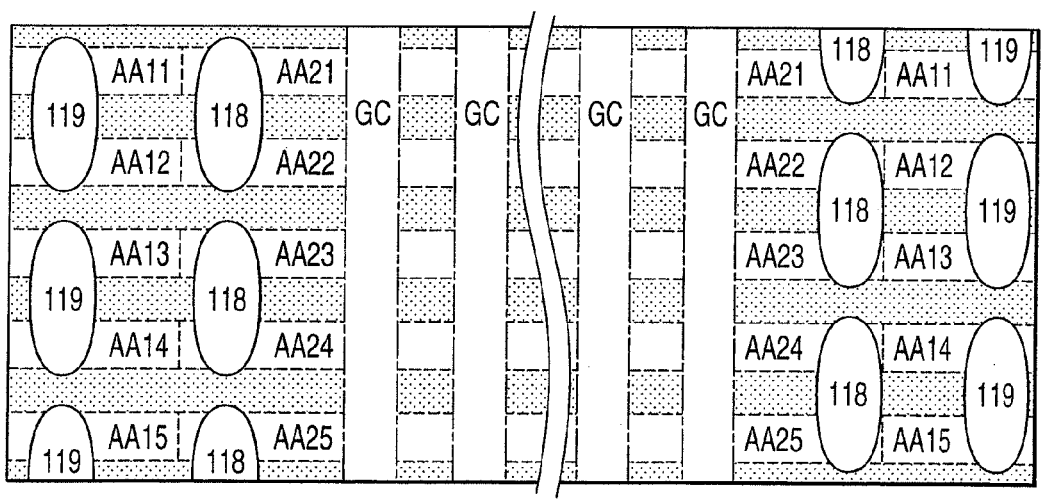
FIG. 6 is a plan view showing a main manufacturing step of the semiconductor memory according to the first embodiment of the present invention.

As shown in FIG. 6, diffusion layers serving as source/drain regions are formed by gas phase doping (GPD), and spin-on-glass (SOG) films 117 serving as interlayer dielectrics are filled between the gate electrodes made of the polysilicon films 116. Then, contact plugs connecting to the AA regions and gate electrodes (GCs) are formed. That is, the conventional lithography technique and RIE technique are used to partially remove the upper AA regions of the stacked AA regions, and the interlayer dielectrics 117 are filled. After the upper surfaces of the interlayer dielectrics 117 are planarized, contact plugs 118 and 119 are formed. The contact plugs 118 correspond to the upper AA regions (AA21 to AA25), and the contact plugs 119 correspond to the lower AA regions (AA11 to AA15). One contact plug is formed over two AA regions, and the contact plugs at the two ends of each AA region are in zigzag alignment with each other by one active area. Accordingly, an arbitrary AA region can be selected by selecting two contact plugs. FIG. 6 is a plan view showing the arrangement of the contact plugs.

Figure 7:
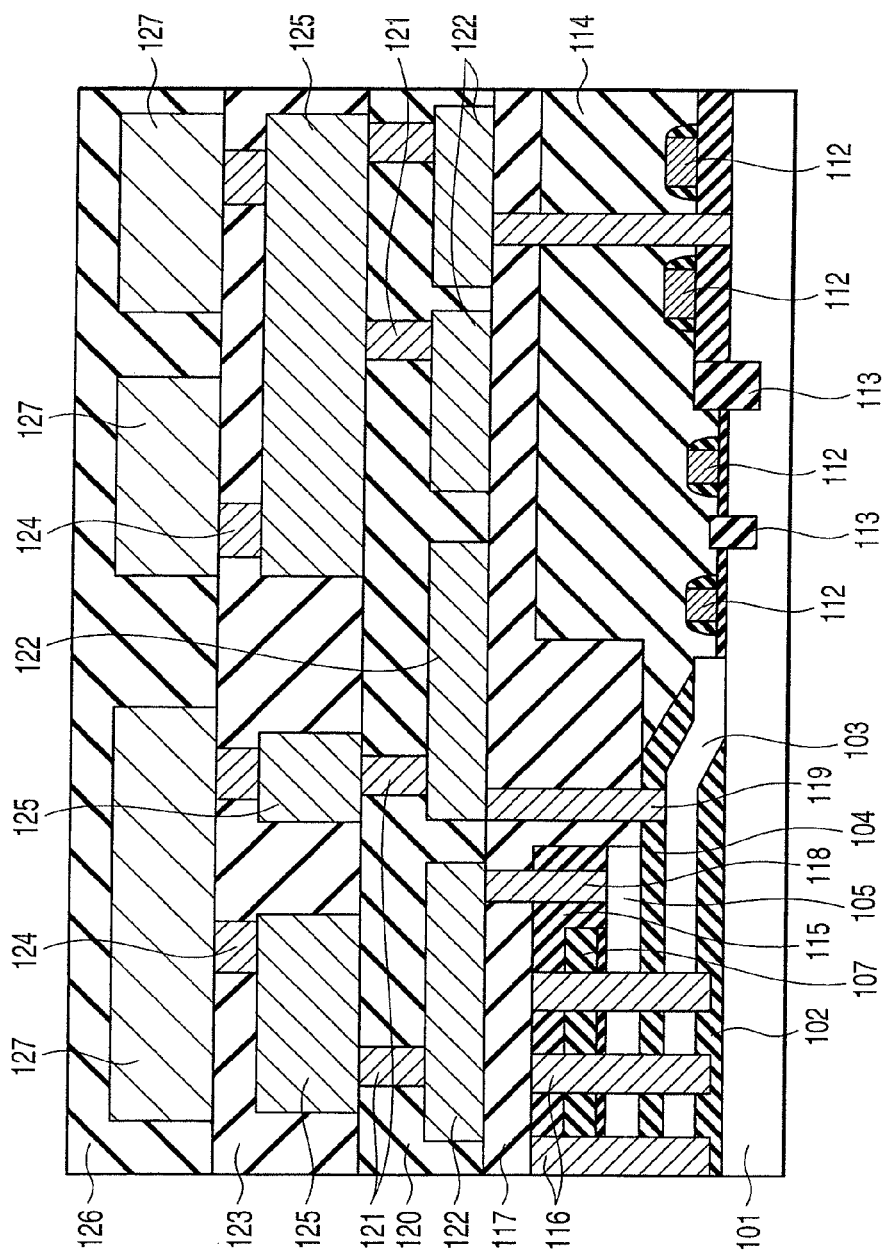
FIG. 7 is a sectional view showing a main manufacturing step of the semiconductor memory according to the first embodiment of the present invention.

Multilayered interconnection formation steps start after the formation of the contact plugs. These steps form interlayer dielectrics 120, 123, and 126, interconnections 122, 125, and 127, and contact plugs 121 and 124. Although a flash memory is formed by repeating the above procedure, the details will not be explained. FIG. 7 shows the final shape.

This embodiment achieves the storage density twice that of the conventional memories. Although the AA regions are stacked on the substrate, each of AA region processing and GC processing need only be performed once as in the conventional unstacked memories.

In this embodiment, the source/drain area of the cell transistor is formed by GPD. The cell transistor is SOI structure. Because of this, it is possible that it is used as a cell transistor of depletion type. For example, instead of forming the source/drain area by doping, it dopes impurities such as P at the time of forming an amorphous silicon film or it dopes impurities such as P after forming the single-crystal silicon film 103. By this process, impurities are doped in the single crystal silicon film 103 of the cell region uniformly, the depletion layer which appears by providing a voltage in the gate electrode is used, and ON/off of the cell transistor works.

Also, in the structure of the present invention, each cell transistor has an SOI structure, and this SOI structure is a double-gate structure in which the gate electrodes (GCs) sandwich the AA region. This makes the structure of the present invention tough against the short-channel effect.

Furthermore, the channel region is formed perpendicularly to the substrate, and hence the channel width can be set regardless of the design rules. This achieves the advantage that it is possible to manufacture a transistor tough against the narrow-channel effect as well.

As described above, the structure of this embodiment can increase the bit density without any micropatterning, and does not increase the number of critical lithography steps which are essential for minimum half pitch patterning.

(Second Embodiment)

Each of FIGS. 8 to 13 is a perspective or sectional view showing a semiconductor memory (flash memory) according to the second embodiment of the present invention in a predetermined main manufacturing step.

This embodiment is directed to a four-layered memory in which single-crystal silicon layers serving as AA regions are formed by sequentially stacking and growing epitaxial silicon and epitaxial silicon germanium, and removing the silicon germanium films by selective etching.

Figure 8:
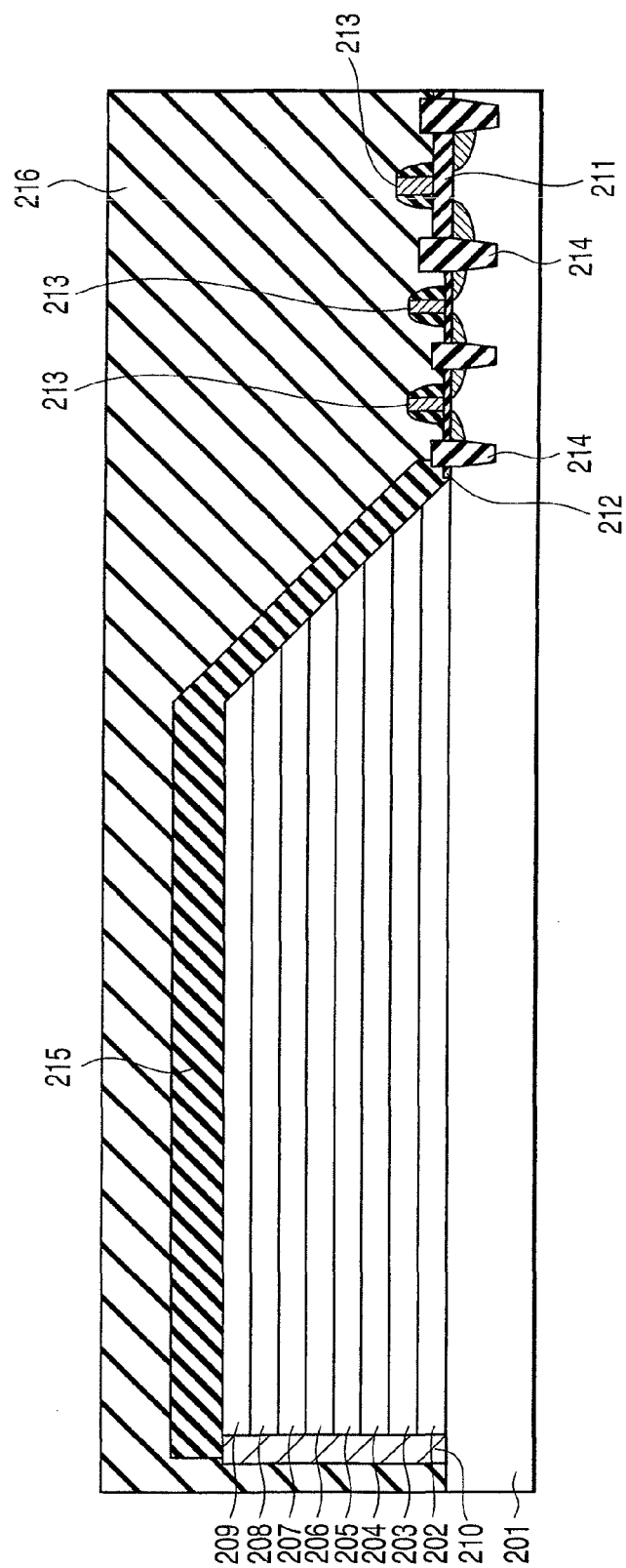
FIG. 8 is a sectional view showing a main manufacturing step of a semiconductor memory according to the second embodiment of the present invention.

First, as shown in FIG. 8, a first epitaxial silicon germanium film 202 about, e.g., 50 nm thick, first epitaxial silicon film 203 about, e.g., 60 nm thick, second epitaxial silicon germanium film 204 about, e.g., 50 nm thick, second epitaxial silicon film 205 about, e.g., 60 nm thick, third epitaxial silicon germanium film 206 about, e.g., 50 nm thick, third epitaxial silicon film 207 about, e.g., 60 nm thick, fourth epitaxial silicon germanium film 208 about, e.g., 50 nm thick, and fourth epitaxial silicon film 209 about, e.g., 70 nm thick are sequentially formed on a semiconductor substrate 201. Then, a plasma CVD silicon oxide film about, e.g., 100 nm thick is formed on the entire substrate surface. The conventional lithography technique and reactive ion etching are used to simultaneously process the plasma CVD silicon oxide film and layered epitaxial films in a cell region. Subsequently, an epitaxial silicon film 210 about, e.g., 100 nm thick is formed on the exposed end faces of the layered epitaxial films. The conventional lithography technique and RIE technique are used to remove the plasma CVD silicon oxide film from a contact plug region. The remaining plasma CVD silicon oxide film is used as a mask to etch the epitaxial silicon germanium films and epitaxial silicon films with an aqueous alkaline solution. Since the etching rate changes from one crystal orientation to another, the stacked epitaxial films are facet-etched at an inclination angle of 45° as shown in FIG. 8. On the exposed surface of the semiconductor substrate 201, a thermal oxide film 211 serving as a gate oxide film of a high-voltage transistor is formed to have a thickness of, e.g., about 35 nm. Subsequently, the conventional lithography technique and wet etching are used to remove the thermal oxide film 211 and the above-mentioned plasma CVD silicon oxide film from a low-voltage transistor region, and a thermal oxide film 212 serving as a gate oxide film of a low-voltage transistor is formed. A 100-nm thick polysilicon film serving as a gate electrode is formed on the entire substrate surface. Then, as in the first embodiment, the conventional transistor formation procedure is used to process the polysilicon film, form diffusion layers serving as source/drain regions, form transistors 213 and STIs 214 in a peripheral circuit portion, and selectively form a silicon nitride film 215 in the cell portion. After that, an interlayer dielectric 216 is formed on the entire substrate surface, and the upper surface of the interlayer dielectric 216 is planarized.

Figure 9:
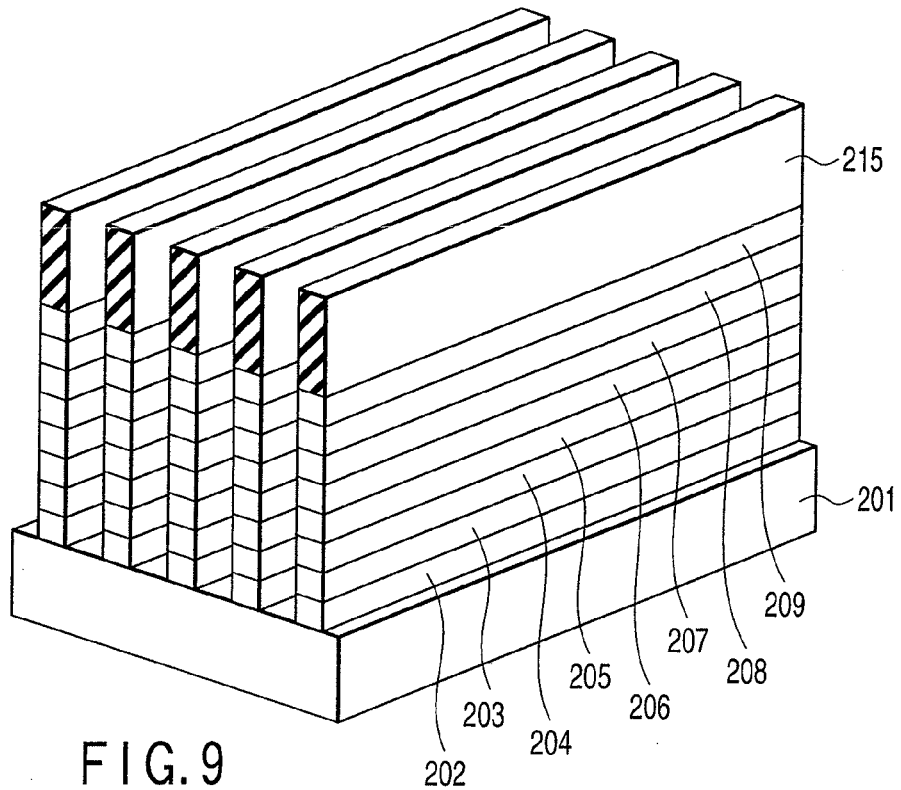
FIG. 9 is a perspective view showing a main manufacturing step of the semiconductor memory according to the second embodiment of the present invention.

Then, as shown in FIG. 9, the conventional lithography technique and reactive ion etching are used to simultaneously process the interlayer dielectric film 216, silicon nitride film 215, and layered epitaxial films in the cell region into stripe patterns of AA regions. Unlike in the first embodiment, the epitaxial silicon films serving as AA regions are stacked via the epitaxial silicon germanium films. Since this makes RIE processing relatively easy, it is possible to form even the stripe patterns of AA regions of a multilayered memory having a large number of layers.

Figure 10:
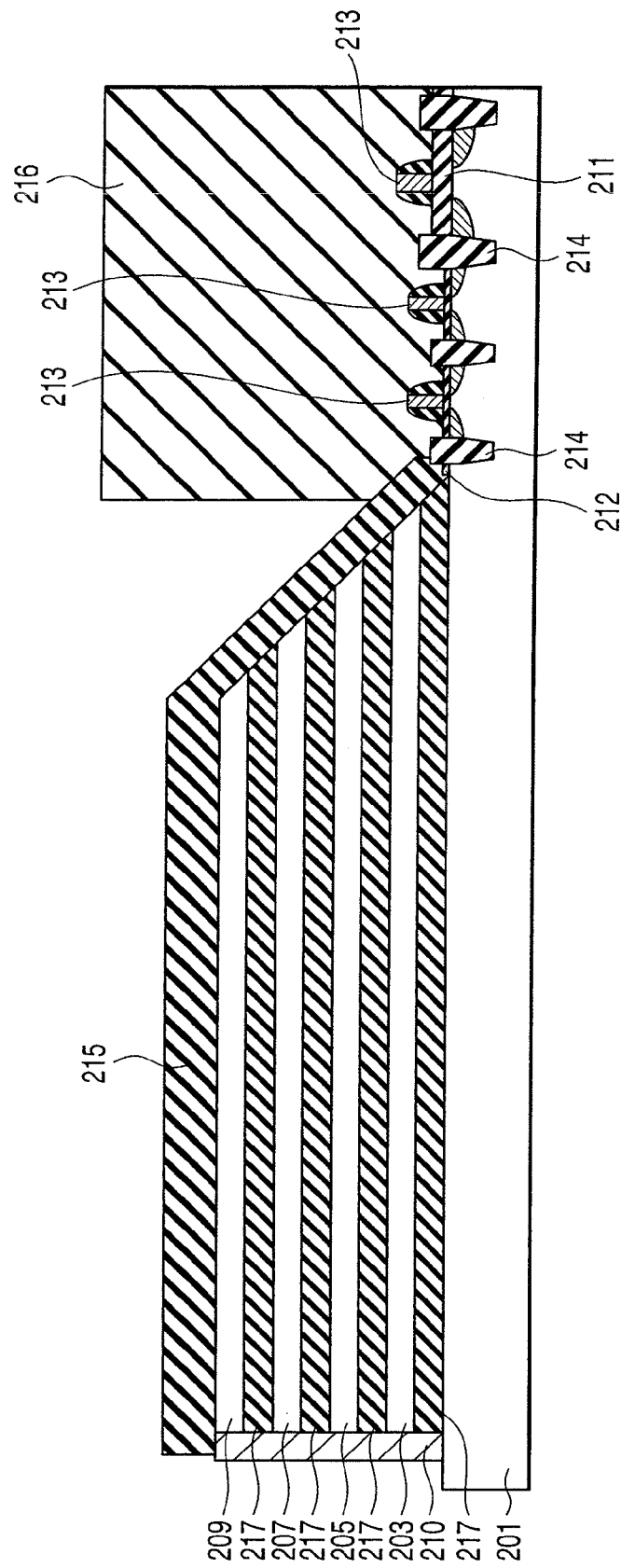
FIG. 10 is a sectional view showing a main manufacturing step of the semiconductor memory according to the second embodiment of the present invention.

As shown in FIG. 10, only the epitaxial silicon germanium films of the layered epitaxial films are removed by selective etching. The selective etching is wet etching by mixture of fluoric acid and nitric acid or gas etching with $CF_4/O_2$ system. This forms a shape in which the linear AA regions float as they are supported at their two ends by the epitaxial silicon film 210 and the silicon nitride film 215 formed in the facet-etched region. Then, an SOG film 217 is formed by coating and changed into an oxide film under appropriate annealing conditions, thereby filling all the spaces between the linear AA regions with the SOG film 217. Although this embodiment employs the SOG film filled in the inter-layer spaces, it is also possible to fill a flowable dielectric by Chemical Vapor Condensation or the like. Also, the epitaxial silicon film 203 about, e.g., 60 nm thick, the epitaxial silicon germanium film 204 about, e.g., 20 nm thick are formed. The epitaxial silicon germanium film 204 is removed by etching to form the space. The epitaxial silicon film 203 on the top and bottom of the space is thermally oxidized to form the thermally oxide film between the epitaxial silicon films 203. Although this embodiment can be filled the insulating film in the inter-layer spaces.

Figure 11:
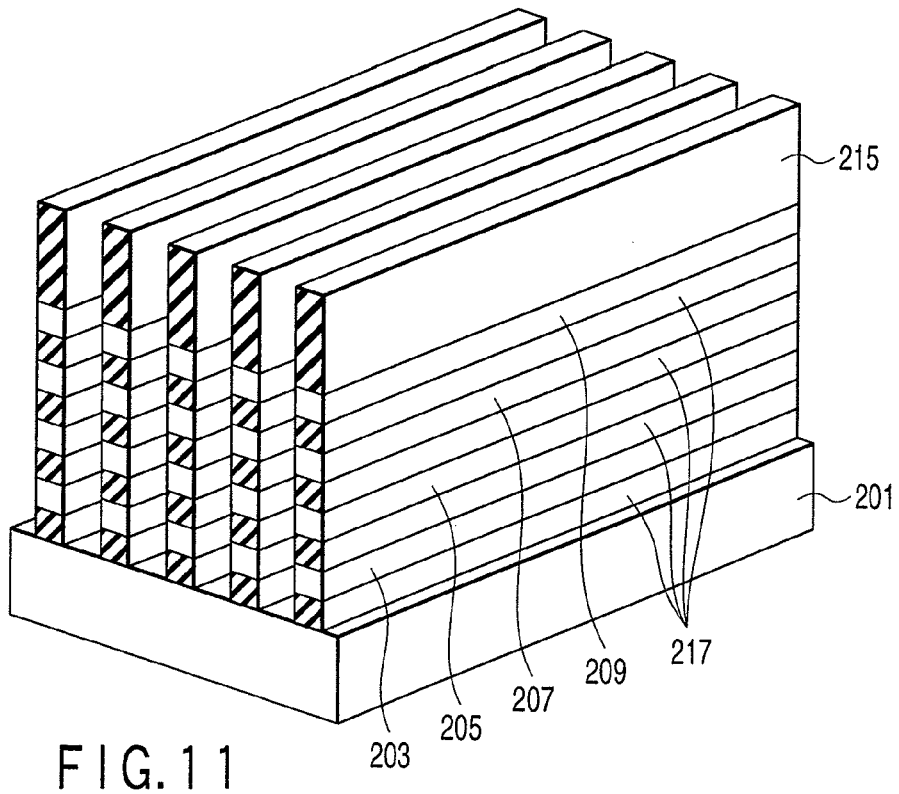
FIG. 11 is a perspective view showing a main manufacturing step of the semiconductor memory according to the second embodiment of the present invention.

Subsequently, as shown in FIG. 11, the SOG film 217 is etched back by reactive ion etching and left behind only between the vertically stacked AA regions. This forms interlayer dielectrics between the stacked AA regions.

Figure 12:
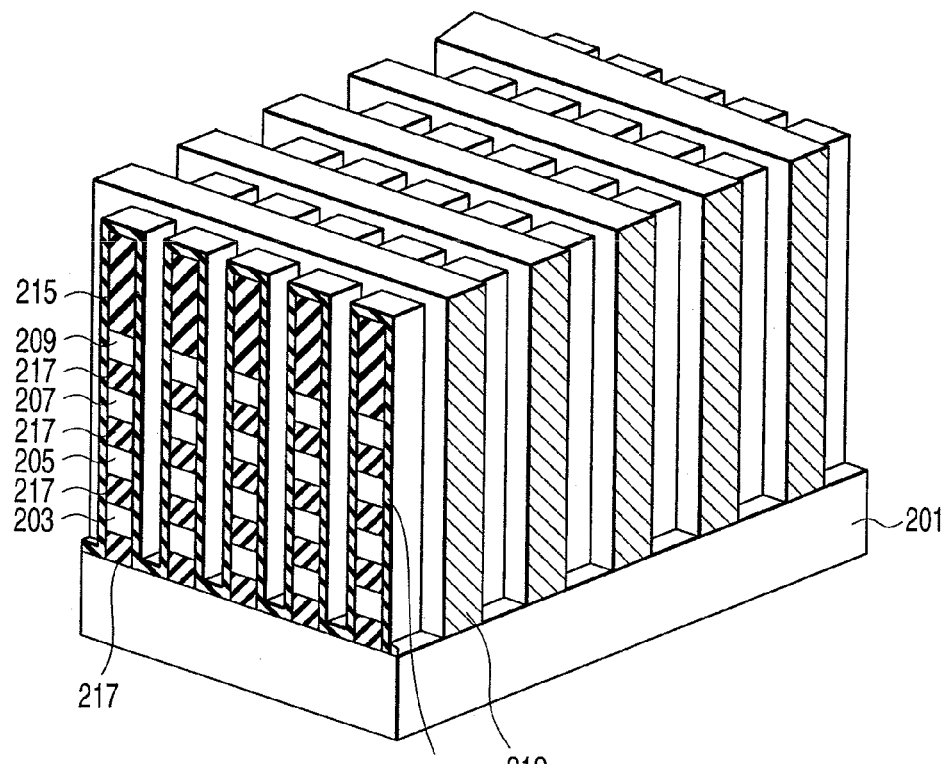
FIG. 12 is a perspective view showing a main manufacturing step of the semiconductor memory according to the second embodiment of the present invention.

As shown in FIG. 12, the end faces of the AA regions exposed by the processing are thermally oxidized, and the thermal oxide films are removed by dry pre-treatment, thereby removing the process damage. Then, thermal oxide films/CVD silicon nitride films/ALD-hafnium oxide films 218 serving as memory dielectric layers are sequentially formed. Subsequently, phosphorus (P)-doped polysilicon films 219 serving as gate electrodes are filled between the AA regions. This embodiment processes the gate electrodes by using the conventional lithography technique and reactive ion etching. This forms gate electrodes (GCs) that the stacked AA regions share in the plane perpendicular to the AA regions.

Figure 13:
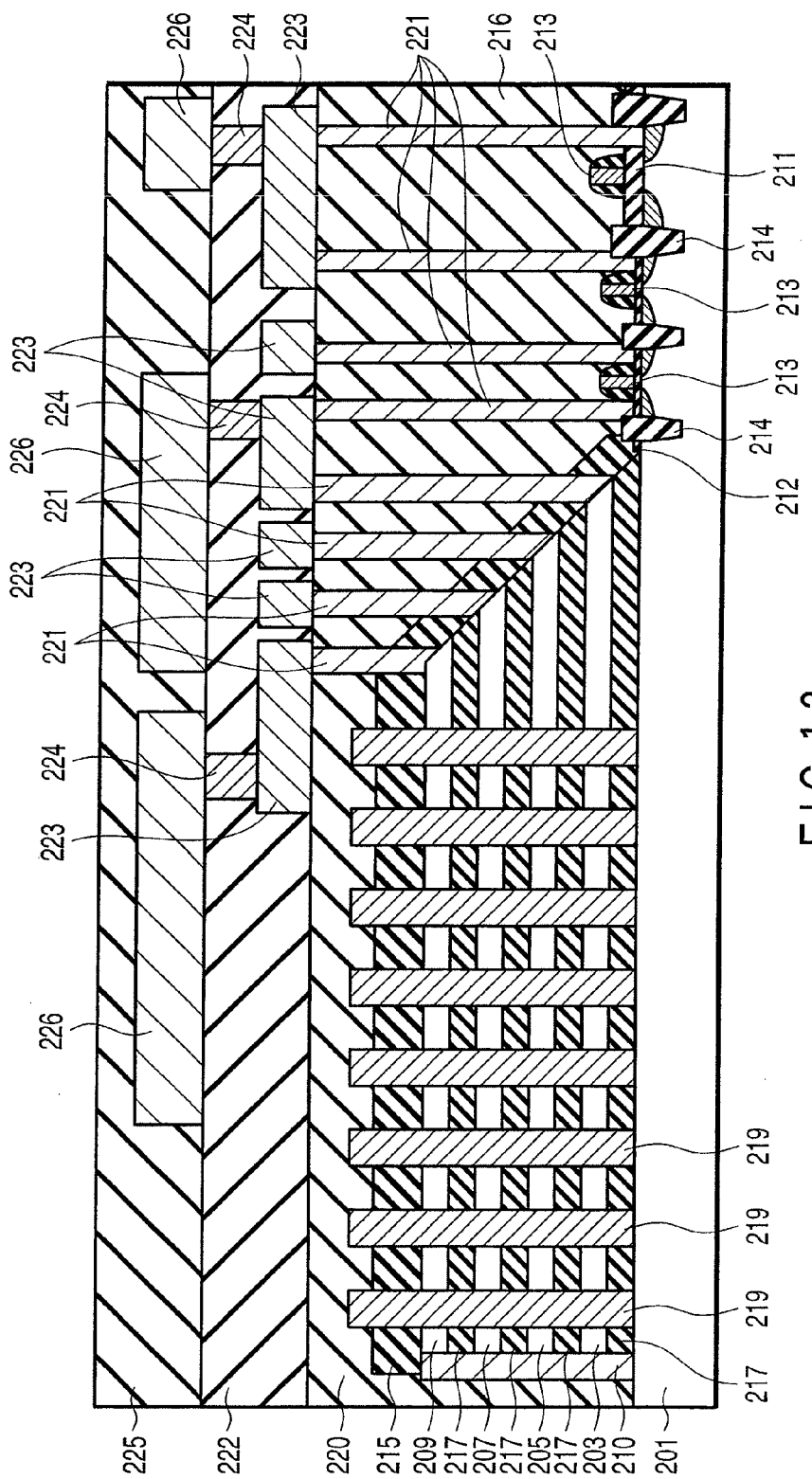
FIG. 13 is a sectional view showing a main manufacturing step of the semiconductor memory according to the second embodiment of the present invention.

As shown in FIG. 13, diffusion layers are formed by gas phase doping, and an SOG film 220 serving as an interlayer dielectric is filled between the gate electrodes and planarized. Next, silicidation of GCs is performed. In case of conventional stacked memory which is manufactured by sequential stacking of individual memory layer, underlying memory layer is influenced with the thermal budget of upper memory layer formation, therefore it is difficult to employ GC silicidation process which is fragile against thermal treatment. This invention has an advantage of easier employment of silicidation since silicidation should be done only at once after GCs formation. After that, contact plugs 221 connecting to the AA regions and CG electrodes are formed. In particular, contact plugs connecting to the AAs can be simultaneously formed because the end portions of the AA regions are offset by facet etching. After the contact plugs are formed, multilayered interconnection formation steps begin. These steps form interlayer dielectrics 222 and 225, interconnections 223 and 226, and contact plugs 224, thereby forming a flash memory. However, the details will not be explained, and only the final shape is shown. Note that the SOG film 220 is intentionally unshown in the cell portion illustrated in FIG. 13 in order to clearly show the relationship between the AA regions and gate electrodes (GCs).

This embodiment achieves the storage density four times that of the conventional memory having only one memory layer. Although the AA regions are stacked on the substrate, each of AA region processing and GC processing need only be performed once as in the conventional memory having only one storage layer. The result is the advantage that the number of processing steps does not largely increase.

Also, similar to the first embodiment, the structure of the present invention is tough against the short-channel effect and narrow-channel effect.

In this embodiment, similar to the first embodiment, it is possible that it is used as a cell transistor of depletion type. For example, instead of forming the source/drain area by doping, it dopes impurities such as P at the time of forming the epitaxial silicon films 203 or it dopes impurities such as P after forming the epitaxial silicon films 203. By this process, impurities are doped in the epitaxial silicon films 203 of the cell region uniformly, the depletion layer which appears by providing a voltage in the gate electrode is used, and ON/off of the cell transistor works.

Also, the epitaxial silicon germanium film is removed by selective etching after the lamination layer of the epitaxial silicon film/the epitaxial silicon germanium film process to cell size by micropatternnig. Accordingly the etching amount is little. With a viewpoint of processing of RIE, the minute processing whose precision is high is possible because of the lamination layer of silicon/silicon germanium which is the same kind of film. In stead of this, before processing it in full detail to the cell size, an active area is processed to the size of (about the cell area) of about a several microns×several microns. The epitaxial silicon germanium film is removed from the processed end part by wet etching under the condition. After the insulating (misspelling) film is formed in that gap, it is possible that it is processed into the line-shaped in full detail as well as the first embodiment.

As described above, the structure of this embodiment can increase the bit density without any special micropatterning, and does not increase the number of lithography steps (generally, AA processing, GC processing, formation of contact plugs to cells, and extraction of interconnections from the contact plugs in a memory) requiring the minimum half pitch, particularly, the numbers of AA processing steps and GC processing steps.

(Third Embodiment)

Each of FIGS. 14 to 19 is a perspective or sectional view showing a semiconductor memory (flash memory) according to the third embodiment of the present invention in a predetermined main manufacturing step.

This embodiment is directed to a four-layered memory similar to the second embodiment, but gate electrodes are processed by using the CMP technique.

Figure 14:
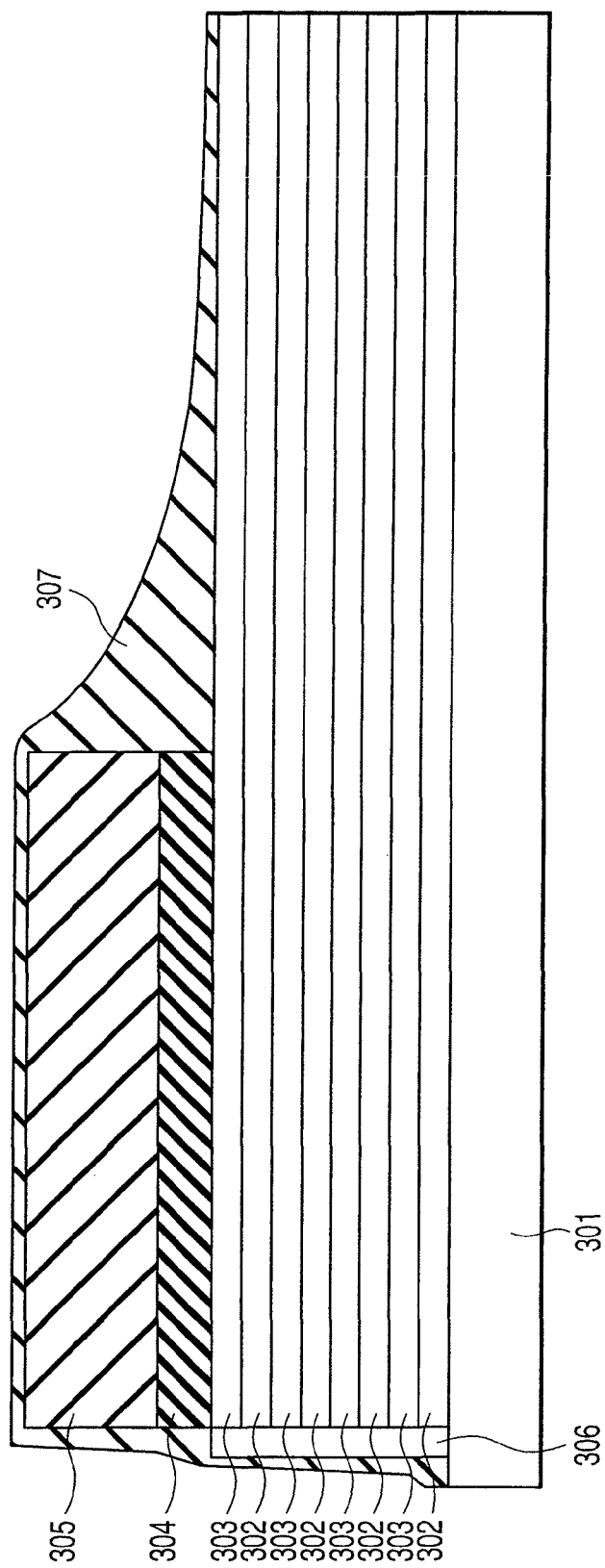
FIG. 14 is a sectional view showing a main manufacturing step of a semiconductor memory according to the third embodiment of the present invention.

First, as shown in FIG. 14, following the same procedure as in the second embodiment, four epitaxial silicon germanium films 302 and four epitaxial silicon films 303 are alternately stacked on a semiconductor substrate 301, and a silicon nitride film 304 and plasma CVD silicon oxide film 305 are formed on the layered epitaxial films. Then, the conventional lithography technique and etching technique are used to expose the end portions of the layered epitaxial films in a cell portion, and an epitaxial silicon film 306 is formed on the exposed portions. The silicon nitride film 304 and plasma CVD silicon oxide film 305 are removed from a contact plug region by using the conventional lithography technique and RIE technique. As a consequence, a recess is formed in the contact plug region. Subsequently, an SOG film 307 is formed by coating so as to have a thickness with which the SOG film 307 does not fill the recess, thereby forming a gentle slope shape as shown in FIG. 14.

Figure 15:
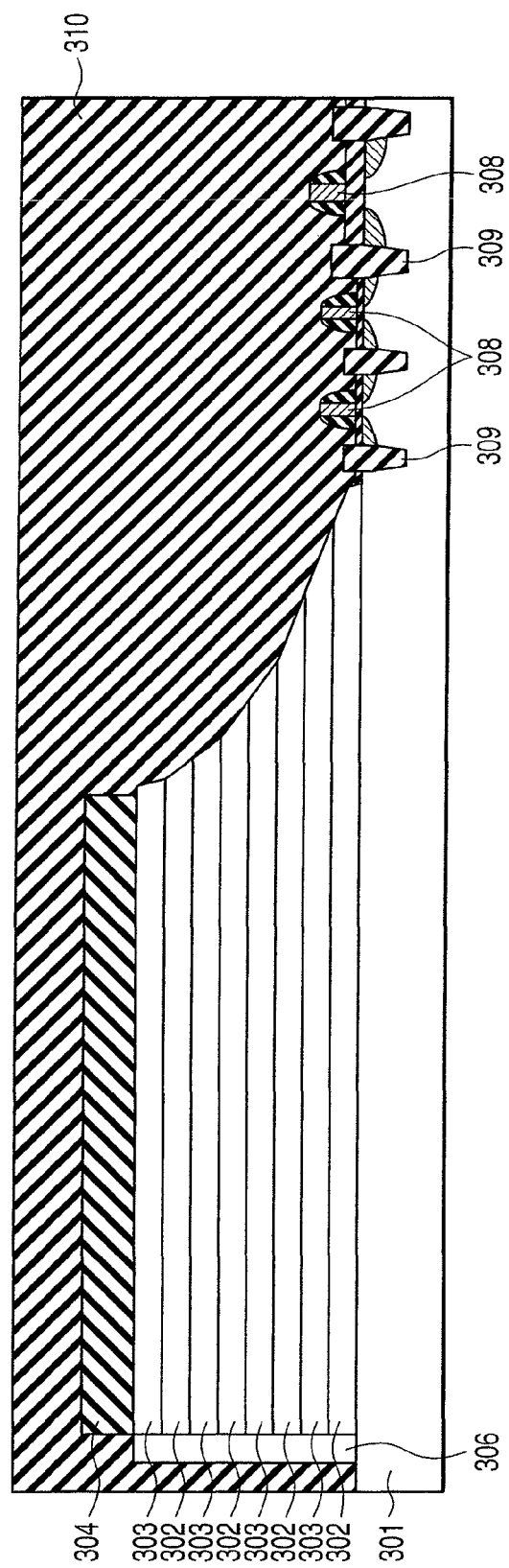
FIG. 15 is a sectional view showing a main manufacturing step of the semiconductor memory according to the third embodiment of the present invention.

Then, as shown in FIG. 15, the SOG film 307 is used as a mask to etch back the stacked epitaxial films. Since the mask film thickness changes from one portion to another, the stacked epitaxial films are processed into a shape reflecting the gentle slope shape of the SOG film 307 as shown in FIG. 15. Following the same procedure as explained in the second embodiment, transistors 308 and STIs 309 of high- and low-voltage circuits are formed, an interlayer dielectric 310 is formed, and the upper surface of the interlayer dielectric 310 is planarized.

Figure 16:
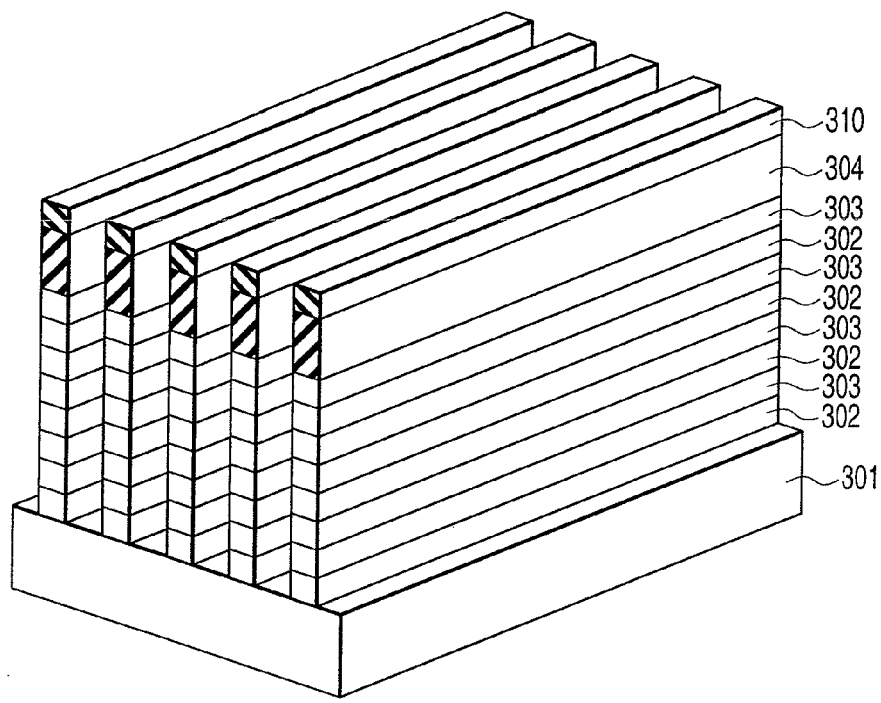
FIG. 16 is a perspective view showing a main manufacturing step of the semiconductor memory according to the third embodiment of the present invention.

As shown in FIG. 16, similar to the second embodiment, the conventional lithography technique and reactive ion etching are used to simultaneously process the interlayer dielectric film 310, silicon nitride film 304, and layered epitaxial films in the cell region into stripe patterns of AA regions.

Figure 17:
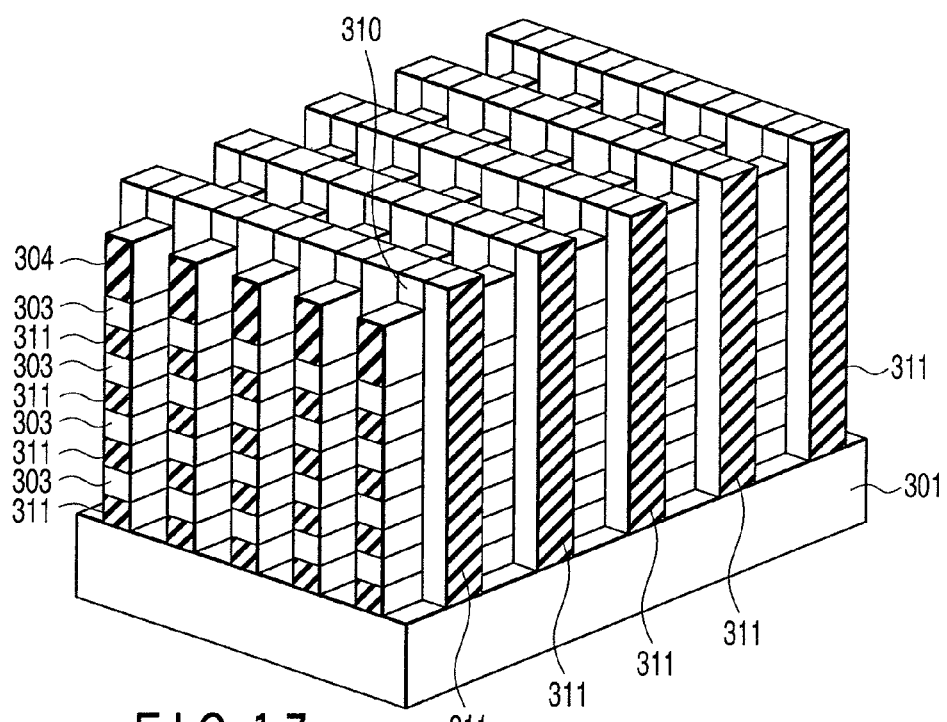
FIG. 17 is a perspective view showing a main manufacturing step of the semiconductor memory according to the third embodiment of the present invention.

Subsequently, as shown in FIG. 17, only the epitaxial silicon germanium films 303 of the layered epitaxial films are removed by selective etching. The selective etching is wet etching by mixture of flioroc acid and nitric acid or gas etching with $CF_4/O_2$ system. This forms a shape in which the linear AA regions float as they are supported at their two ends by the epitaxial silicon film 306 and interlayer dielectric 310. Then, SOG is formed by coating and changed into an oxide film under appropriate annealing conditions, thereby filling all the spaces between the linear AA regions with an SOG film 311. Since an impurity is doped into the SOG film 311, diffusion layers are formed by contact diffusion of this impurity. The conventional lithography technique and reactive ion etching are used to etch back the interlayer dielectric 310 and SOG film 311, thereby forming gaps as templates of gate electrodes. Consequently, interlayer dielectrics are formed between the vertically stacked AA regions and between adjacent gate electrodes (GC).

Figure 18:
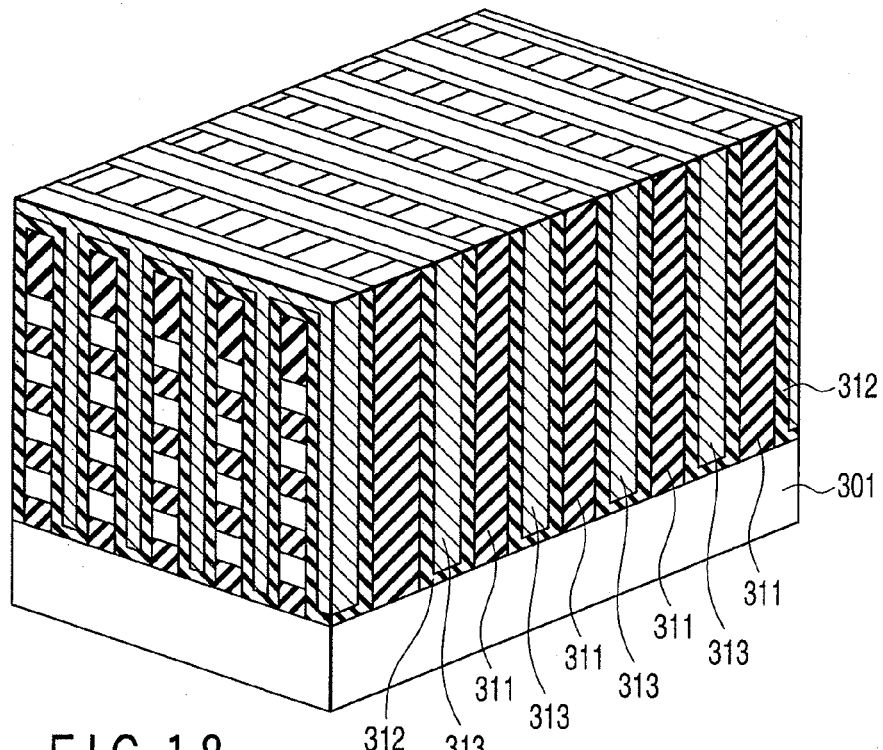
FIG. 18 is a perspective view showing a main manufacturing step of the semiconductor memory according to the third embodiment of the present invention.

As shown in FIG. 18, the end faces of the AA regions exposed by the processing are thermally oxidized, and the thermal oxide films are removed by dry pre-treatment, thereby removing the process damage. Then, thermal oxide films/CVD silicon nitride films/ALD-lanthanum aluminum oxide films 312 serving as memory dielectric layers are sequentially formed. Subsequently, CVD titanium nitride films 313 serving as gate electrodes are filled in the gaps, and planarized by CMP. Since this embodiment processes the gate electrodes by CMP, metal electrodes can be easily processed. In addition, the use of metal electrodes is relatively easy because the damage of GC processing requiring a relatively high temperature can be removed before the metal electrodes are filled.

Figure 19:
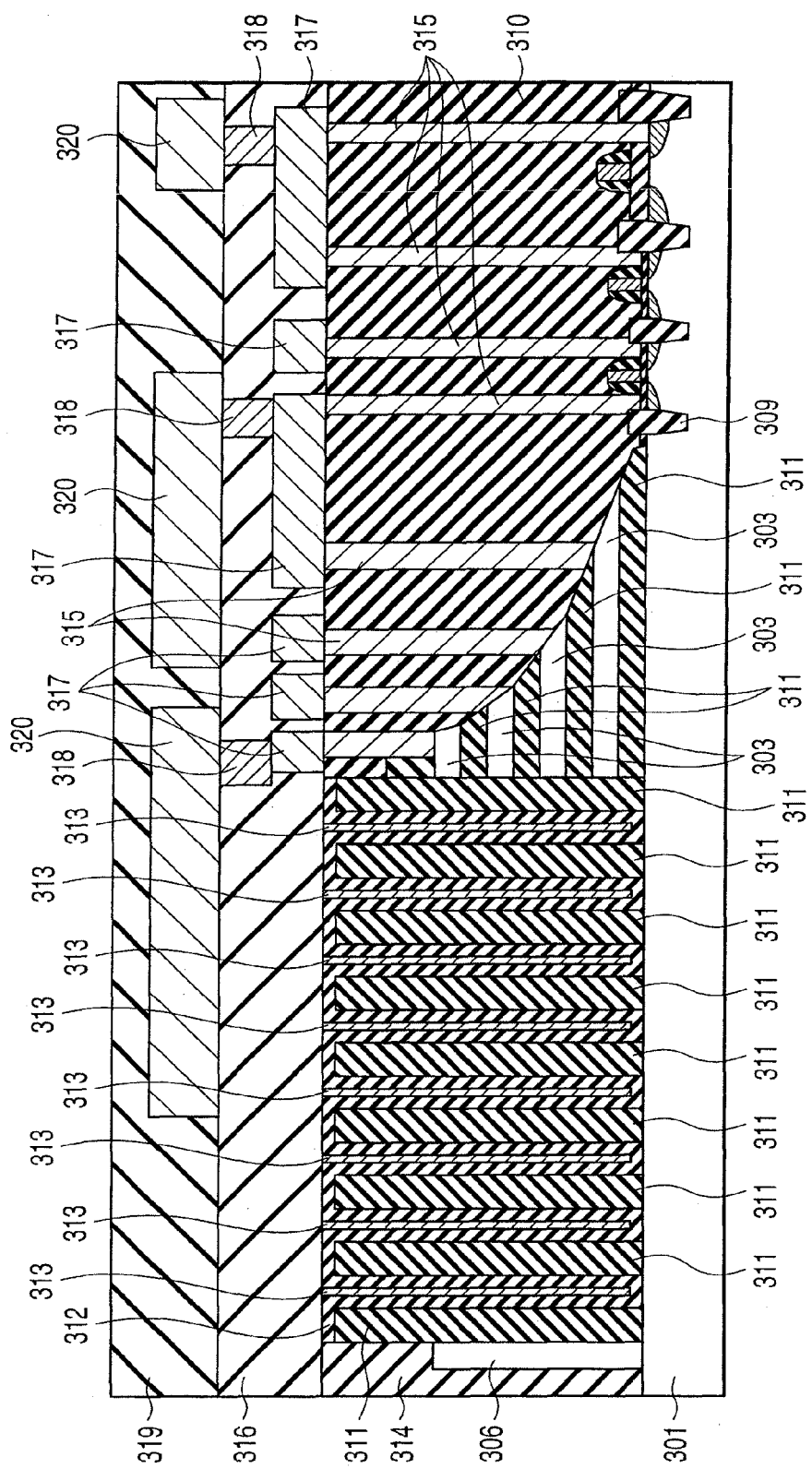
FIG. 19 is a sectional view showing a main manufacturing step of the semiconductor memory according to the third embodiment of the present invention.

As shown in FIG. 19, an interlayer dielectric 314 is formed and planarized, and contact plugs 315 connecting to the AA regions and gate electrodes (GCs) are formed. Contact plugs connecting to the AA regions can be simultaneously formed because the end portions of the AA regions are offset into the shape of a gentle slope by etching using the SOG film. After the contact plugs are formed, a multilayered interconnection is formed by forming interlayer dielectrics 316 and 319, interconnections 317 and 320, and contact plugs 318, thereby forming a flash memory. However, the details will not be explained, and only the final shape is shown.

Similar to the second embodiment, this embodiment achieves the storage density four times that of the conventional memory having only one memory layer. Although this embodiment forms the AA regions by stacking four layers on the substrate, each of AA processing and GC processing need only be performed once as in the conventional memory having only one memory layer.

Also, similar to the first embodiment, the structure of this embodiment is tough against the short-channel effect and narrow-channel effect.

As described above, this embodiment can increase the degree of integration of cells without any micropatterning, and does not increase the number of lithography steps requiring the minimum half pitch.

(Fourth Embodiment)

Figure 20:
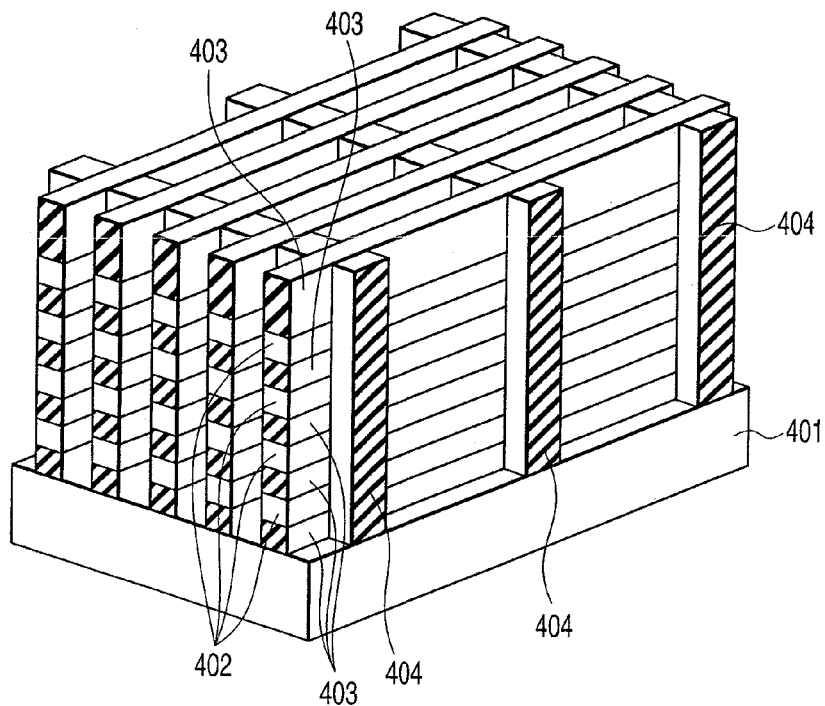
FIG. 20 is a perspective view showing a main manufacturing step of a semiconductor memory according to the fourth embodiment of the present invention.
Figure 21:
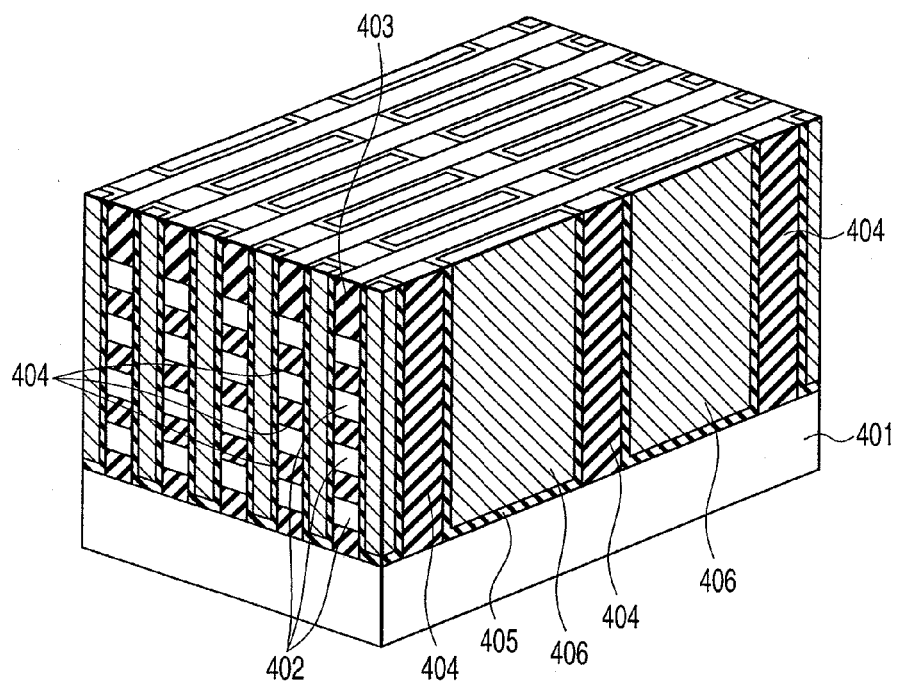
FIG. 21 is a perspective view showing a main manufacturing step of the semiconductor memory according to the fourth embodiment of the present invention.

FIGS. 20 to 22 are perspective views showing a semiconductor memory (flash memory) according to the fourth embodiment of the present invention in predetermined main manufacturing steps.

This embodiment is directed to a four-layered memory similar to the third embodiment, but implements a dual-gate electrode structure.

First, as shown in FIG. 20, layered epitaxial films are formed by alternately stacking four epitaxial silicon germanium films and four epitaxial silicon films 402 on a semiconductor substrate 401 following the same procedure as in the third embodiment, and a peripheral circuit portion is formed in the same manner as in the first to third embodiments. Subsequently, following the same procedure as in the third embodiment, a silicon nitride film 403 and the layered epitaxial films in a cell region are simultaneously processed into stripe patterns of AA regions by using the conventional lithography technique and reactive ion etching, and only the epitaxial silicon germanium films of the layered epitaxial films are removed by selective wet etching. Then, SOG is formed by coating and changed into an oxide film under appropriate annealing conditions, thereby filling all the spaces between the linear AA regions with SOG films 404. The conventional lithography technique and reactive ion etching are used to etch back the silicon oxide film described above, thereby forming gaps as templates of gate electrodes. Unlike in the previous embodiments, the width of the template is "3F" ("F" is the minimum half pitch) in this embodiment.

As shown in FIG. 21, the end faces of the AA regions exposed by the processing are thermally oxidized, and the thermal oxide films are removed by dry pre-treatment, thereby removing the process damage. Then, thermal oxide films/CVD silicon nitride films/ALD-silicon oxide films 405 serving as memory dielectric layers and phosphorus (P)-doped polysilicon films 406 are sequentially filled in the gaps, and planarized by CMP. Similar to the third embodiment, this embodiment processes the gate electrodes by CMP, and hence requires no high-aspect-ratio RIE patterning.

As shown in FIG. 22, a plasma CVD silicon oxide film 407 serving as an interlayer dielectric is formed on the entire substrate surface, and contact plugs 408 communicating with the gate electrodes are formed. These contact plugs are formed into a zigzag pattern. Then, interconnections that connect the contact plugs are formed. These interconnections connect alternate phosphorus (P)-doped polysilicon films 405 filled between the AA regions adjacent to each other in the horizontal direction. That is, a dual-gate electrode structure in which two independent gate electrodes sandwich one AA region is formed.

After that, similar to the first to third embodiments, contact plugs connecting to the AA regions and gate electrodes (GCs) are formed, and a flash memory is formed through multilayered interconnection formation steps. However, the details will not be explained.

In this embodiment, information can be independently written in the two thermal oxide films/CVD silicon nitride films/ALD-silicon oxide films sandwiching the AA region. This makes it possible to write information having one or more bits in one cell. For example, multilevel write of 2×2=4 (i.e., two bits/cell) or 3×3=9 (i.e., three bits/cell) is possible if a binary or ternary threshold value is written in the alumina/silicon nitride films/silicon oxide films on the two sides of the AA region.

Also, similar to the first to third embodiments, the structure of this embodiment is tough against the short-channel effect and narrow-channel effect.

As described above, the structure of the fourth embodiment can increase the bit density without any special micropatterning, and does not increase the number of lithography steps requiring the minimum half pitch.

(Fifth Embodiment)

FIGS. 23 to 26 are perspective views showing a semiconductor memory (flash memory) according to the fifth embodiment of the present invention in predetermined main manufacturing steps.

This embodiment is directed to a four-layered memory similar to the second to fourth embodiments, but forms back gate electrodes for improving the erase characteristic of memory cells.

First, as shown in FIG. 23, layered epitaxial films are formed by alternately stacking four epitaxial silicon germanium films and four epitaxial silicon films 502 on a semiconductor substrate 501 following the same procedure as in the second to fourth embodiments, and a peripheral circuit portion is formed in the same manner as in the first to fourth embodiments. Subsequently, following the same procedure as in the second to fourth embodiments, a plasma CVD silicon oxide film 503, a silicon nitride film 504, and the layered epitaxial films in a cell region are simultaneously processed into stripe patterns of AA regions by using the conventional lithography technique and reactive ion etching, and only the epitaxial silicon germanium films of the layered epitaxial films are removed by selective etching. The selective etching is wet etching by mixture of fluoric acid and nitric acid or gas etching with $CF_4/O_2$ system. Then, SOG is formed by coating and changed into an oxide film under appropriate annealing conditions, thereby filling all the spaces between the linear AA regions with SOG films 505. After that, back gate electrodes parallel to the AAs are formed. That is, the conventional lithography technique and RIE technique are used to etch back alternate SOG films 505 filled between the AAs, thereby forming gaps as templates of back gate electrodes. Since the processing is performed on every other SOG film, no minimum half pitch patterning is necessary.

Figure 24:
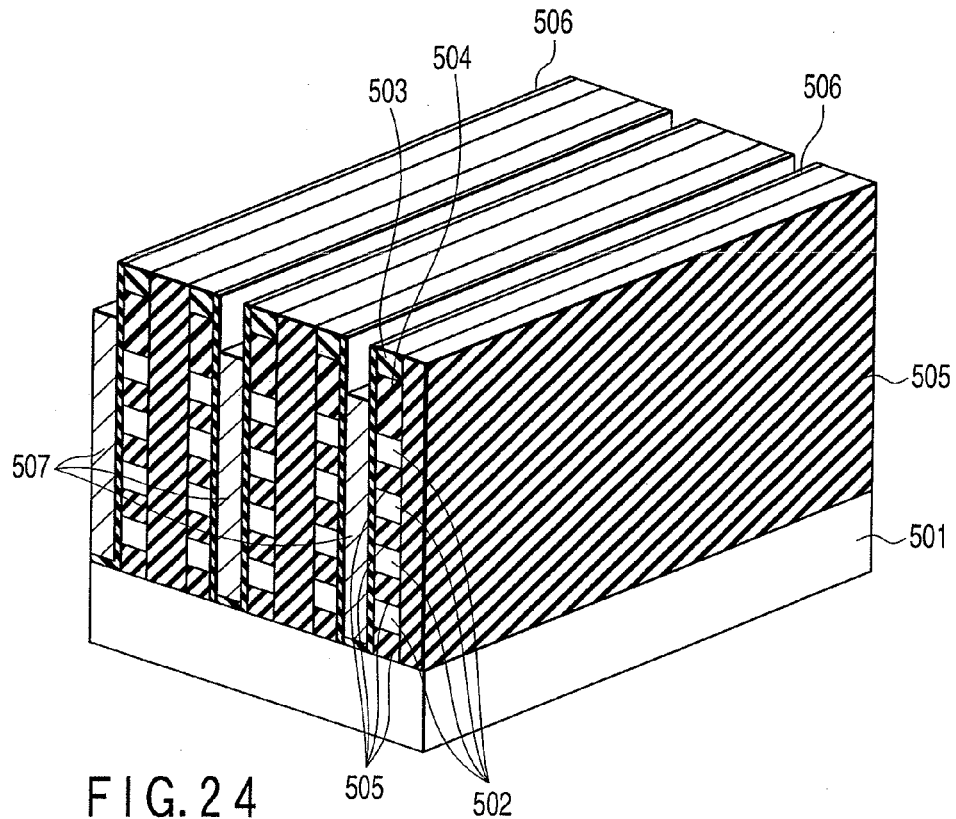
FIG. 24 is a perspective view showing a main manufacturing step of the semiconductor memory according to the fifth embodiment of the present invention.

As shown in FIG. 24, the end faces of the AA regions exposed by the processing are thermally oxidized, and the thermal oxide films are removed by dry pre-treatment, thereby removing the process damage. Then, gate oxide films 506 are formed, and a P-doped polysilicon film 507 for forming gate electrodes is filled. The P-doped polysilicon film is recessed to remain in only the gaps described above. Note that the upper portions of the P-doped polysilicon films are made lower than the uppermost surface of the substrate, so that the gaps remain above the P-doped polysilicon films.

Figure 25:
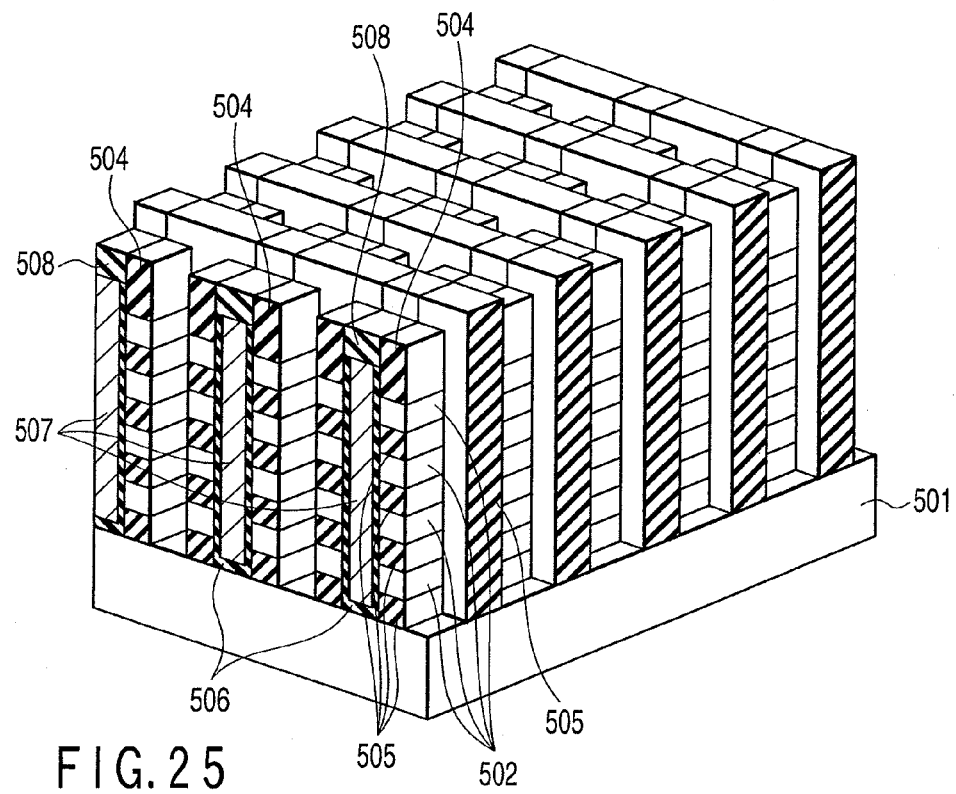
FIG. 25 is a perspective view showing a main manufacturing step of the semiconductor memory according to the fifth embodiment of the present invention.

Subsequently, as shown in FIG. 25, silicon nitride films 508 are filled in the gaps above the P-doped polysilicon films, and recessed by RIE again. After that, templates of GC electrodes to be formed into stripes in a direction perpendicular to the AAs are formed. The conventional lithography and reactive ion etching are used to etch back the plasma CVD silicon oxide films 503, further etch back every other SOG film 505 in the gap between the AAs where no back gate electrode is formed, and finally recess the silicon nitride films 508, thereby forming trenches as templates of GC electrodes.

Figure 26:
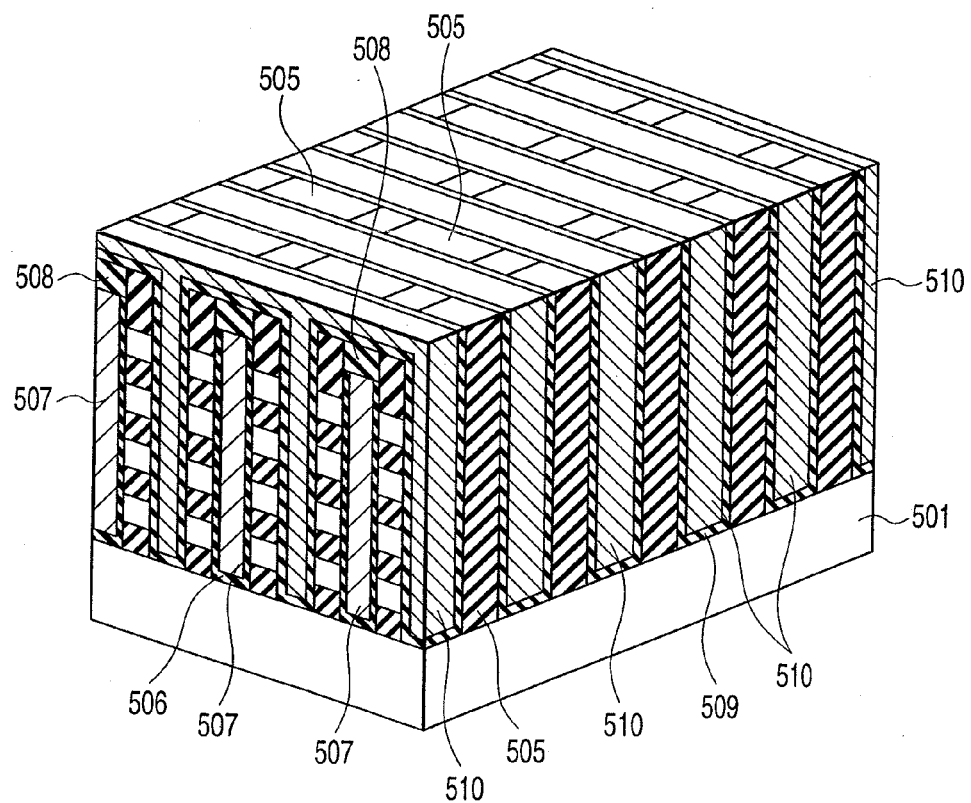
FIG. 26 is a perspective view showing a main manufacturing step of the semiconductor memory according to the fifth embodiment of the present invention.

Then, as shown in FIG. 26, the end faces of the AA regions exposed in the trenches by the processing are thermally oxidized, and the thermal oxide films are removed by dry pre-processing, thereby removing the process damage. Thermal oxide films/CVD silicon nitride films/ALD-hafnium aluminum oxide films 509 serving as memory dielectric layers and P-doped polysilicon films 510 are sequentially formed. Subsequently, CMP is used to leave the P-doped polysilicon films in only the trenches.

After that, contact plugs connecting to the AA regions and GC electrodes are formed, and interlayer dielectrics, interconnections, and the like are formed in multilayered interconnection formation steps, thereby forming a flash memory. However, the details will not be explained.

In this embodiment, the two gate electrodes sandwiching the AA region can be independently controlled, the gate electrode can be controlled with respect to each cell, and a plurality of AA regions share the back gate electrode. This structure does not change the write characteristic. However, the structure improves the erase characteristic because it is possible during data erase to forcedly remove electric charge from the hafnium aluminum oxide film/silicon nitride film/silicon oxide film by applying an electric field to the back gate electrode.

Also, similar to the first to third embodiments, the structure of this embodiment is tough against the short-channel effect and narrow-channel effect.

As described above, the structure of the fifth embodiment can increase the bit density without any special micropatterning, and does not increase the number of lithography steps requiring the minimum half pitch.

It is obvious that the effects of the present invention do not reduce even when the memory dielectric layers, gate electrode formation methods, contact plug formation methods, and the like described in the first to fifth embodiments are used in different combinations.

The differences between the structures of the first to fifth embodiments will be compared below with reference to FIGS. 27 to 29.

The present invention basically has three structures different in GC electrode arrangement, and each structure is identifiable by the section in a plane perpendicular to AA regions. The AAs are formed by alternately stacking epitaxial silicon films 601 and insulating films 602.

Figure 27:
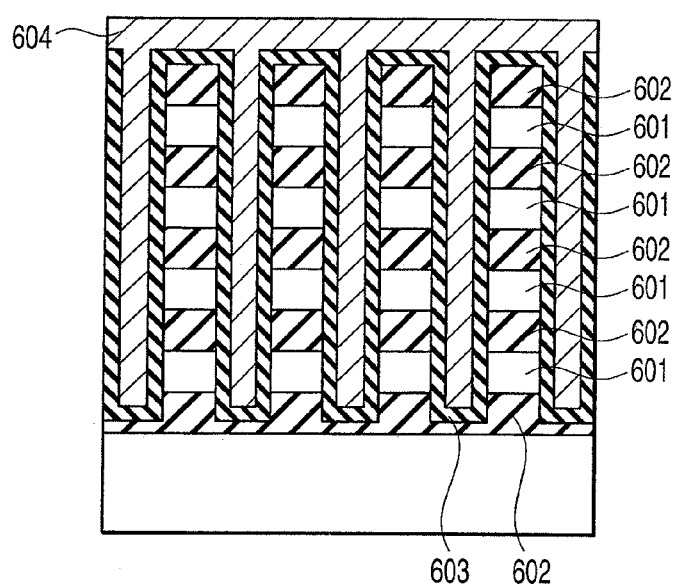
FIG. 27 is a sectional view showing a plane perpendicular to AA regions of the semiconductor memories according to the first to third embodiments.

As shown in FIG. 27, the first to third embodiments are directed to a double-gate structure in which gate electrodes 604 connected to each other and having the same potential sandwich each AA region via a memory dielectric layer 603.

Figure 28:
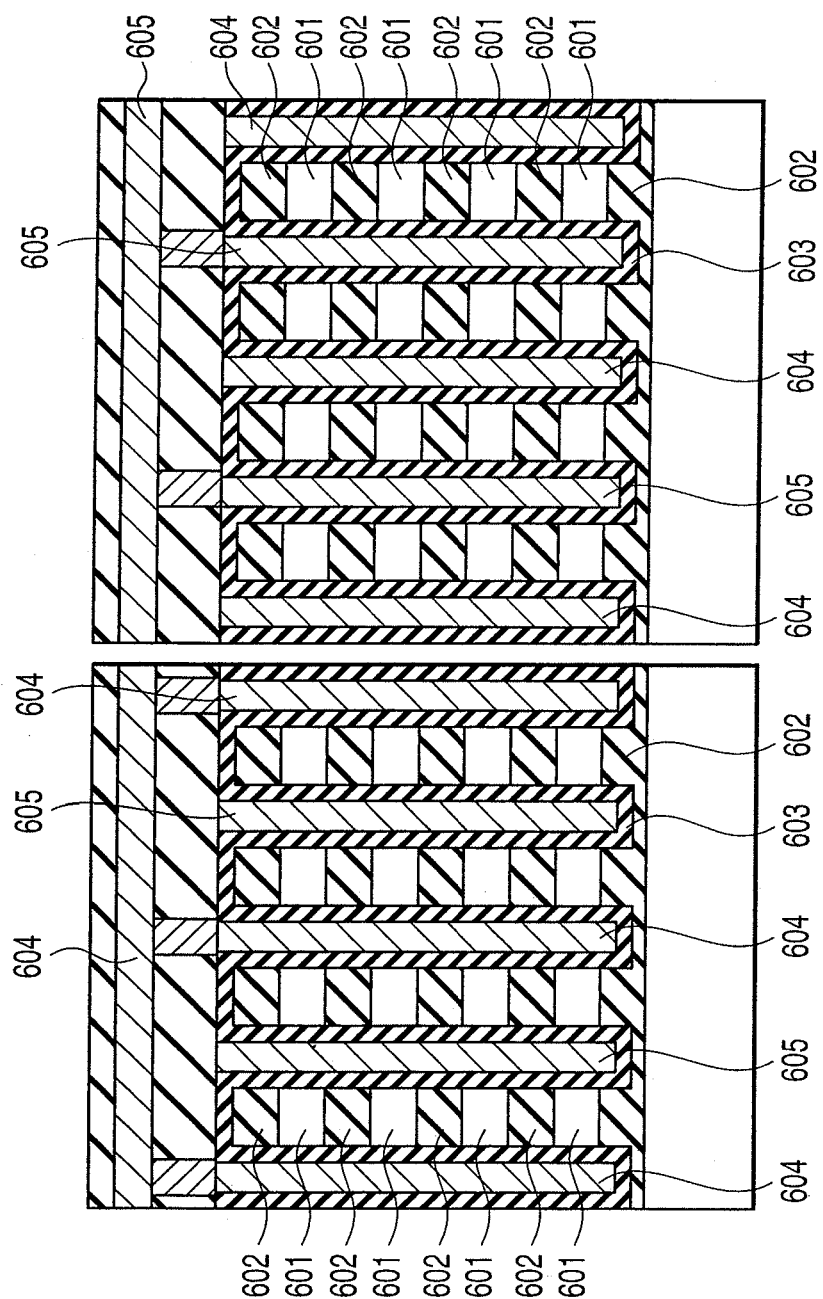
FIG. 28 is a sectional view showing a plane perpendicular to AA regions of the semiconductor memory according to the fourth embodiment.

As shown in FIG. 28, the fourth embodiment is directed to a dual-gate structure in which two types of gate electrodes 604 and 605 that are independently controllable sandwich each AA region via a memory dielectric layer 603. Note that FIG. 28 shows two different sections in order to illustrate zigzag interconnections to the gate electrodes.

Figure 29:
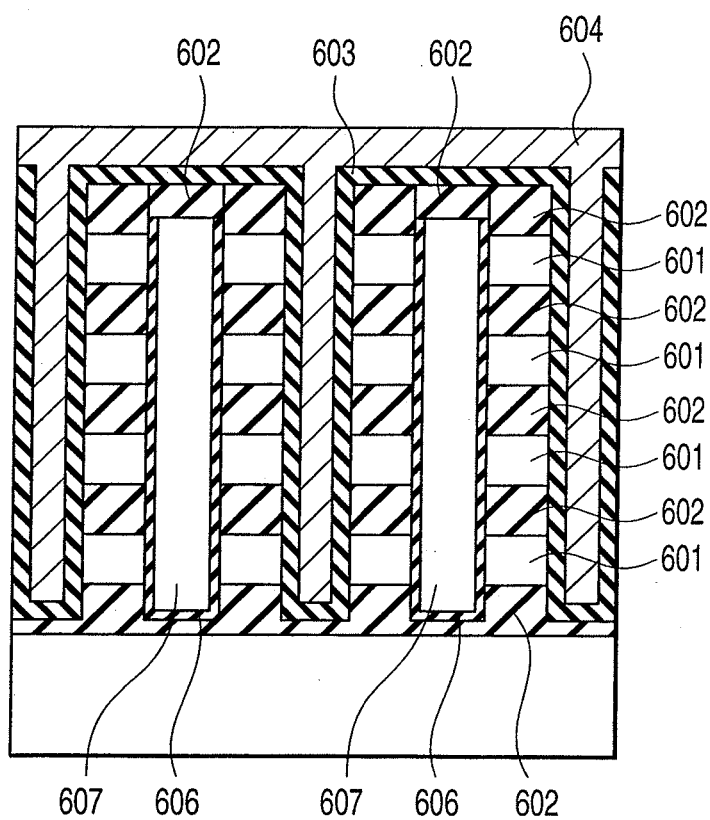
FIG. 29 is a sectional view showing a plane perpendicular to AA regions of the semiconductor memory according to the fifth embodiment.

As shown in FIG. 29, the fifth embodiment is directed to a dual-gate structure in which back gate electrodes 607 parallel to AA regions are filled between the AA regions via gate insulating films 605, gate electrodes 604 perpendicular to the AA regions are connected to each other, and the gate electrode 604 and back gate electrode 607 sandwich each AA region.

Also, to avoid the complexity of explanation, the first to fifth embodiments have shown the forms of two- and four-layered memories. However, the methods of these embodiments are evidently applicable to memories having larger numbers of layers. The use of these embodiments makes it possible to continuously increase the degree of integration of memories in the future, so various application fields presumably extend.

In the above embodiments, the stacked AA regions share the source contact, and are connected to the peripheral circuit by individually forming the drain contacts. In embodiments to be explained below, however, each AA region is selected on the source side.

(Sixth Embodiment)

Each of FIGS. 30 to 40 is a sectional or perspective view showing a semiconductor memory (flash memory) according to the sixth embodiment of the present invention in a predetermined main fabrication step.

This embodiment is directed to a four-layered stacked memory similar to the second to fourth embodiments. However, this embodiment uses polysilicon films obtained by crystallizing amorphous silicon films as AA regions, and uses layer selection transistors that select individual layers.

Figure 30:
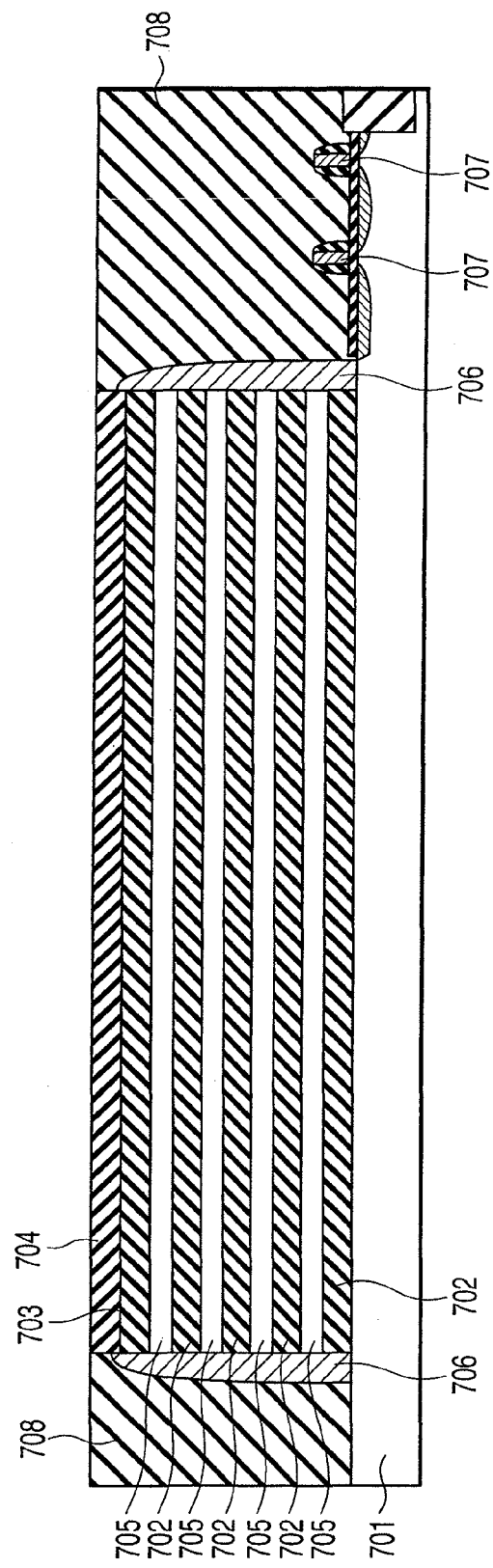
FIG. 30 is a sectional view showing a main manufacturing step of a semiconductor memory according to the sixth embodiment of the present invention.

First, as shown in FIG. 30, four silicon oxide films 702 and four amorphous silicon films are alternately stacked on a semiconductor substrate 701, and a silicon nitride film 703 and a silicon oxide film 704 serving as a hard mask are formed on top of the structure. Then, the amorphous silicon films are crystallized by annealing to form polysilicon films 705. Similar to the first to fifth embodiments, the stacked films are removed from a peripheral circuit portion, and B-doped polysilicon films 706 are formed on the sidewalls of the stacked films, thereby connecting the polysilicon films 705. Transistors 707 forming a peripheral circuit are formed on the surface of the semiconductor substrate 701 exposed by removing the stacked films. The obtained structure is planarized by filling an interlayer dielectric 708.

Figure 31:
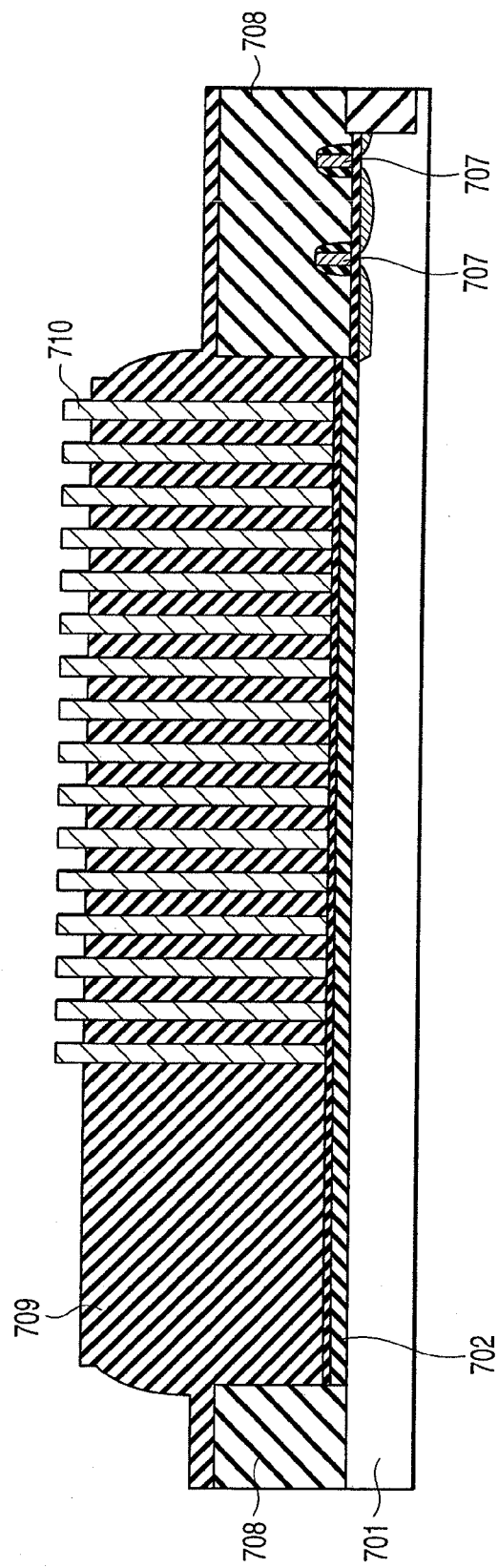
FIG. 31 is a sectional view showing a main manufacturing step of the semiconductor memory according to the sixth embodiment of the present invention.
Figure 32:
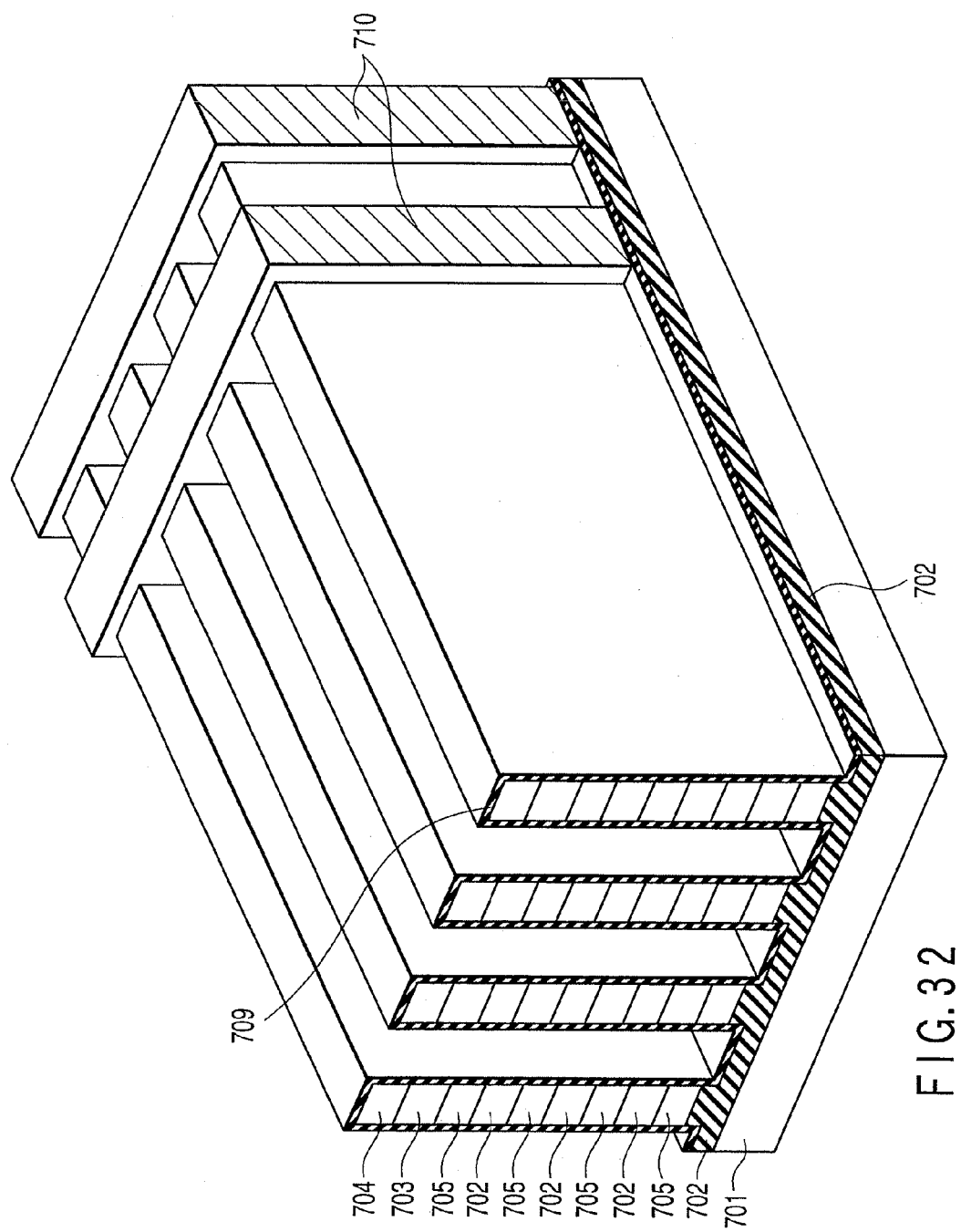
FIG. 32 is a perspective view showing a main manufacturing step of the semiconductor memory according to the sixth embodiment of the present invention.

Then, as shown in FIGS. 31 and 32, the conventional lithography technique and RIE technique are used to simultaneously process the stacked silicon oxide film 704, silicon nitride film 703, silicon oxide films 702, and polysilicon films 705 into stripe patterns of AA regions, thereby forming stacked AAs. The side surfaces of the polysilicon films are thermally oxidized, the thermal oxide films are removed by dry pre-treatment, and silicon thermal oxide films/CVD-silicon nitride films/ALD-alumina films 709 serving as memory dielectric layers are sequentially formed. Subsequently, P-doped polysilicon films serving as gate electrodes are filled and processed by using the conventional lithography technique and RIE technique, thereby forming gate electrodes 710 that the stacked AAs share. These gate electrodes are used as masks to ion-implant As by the conventional ion implantation technique. After that, the sidewalls of the gate electrodes are oxidized to activate diffusion layers and form extension regions.

In this embodiment, it is possible that it is used as a cell transistor of depletion type. For example, instead of forming the source/drain area by doping, it dopes impurities such as P at the time of depositing the polysilicon films 705 or it dopes impurities such as P after forming the polysilicon films 705. By this process, impurities are doped in the polysilicon films 705 of the cell region uniformly, the depletion layer which appears by applying a voltage to the gate electrode is used for ON/Off operation of the cell transistor.

Figure 33:
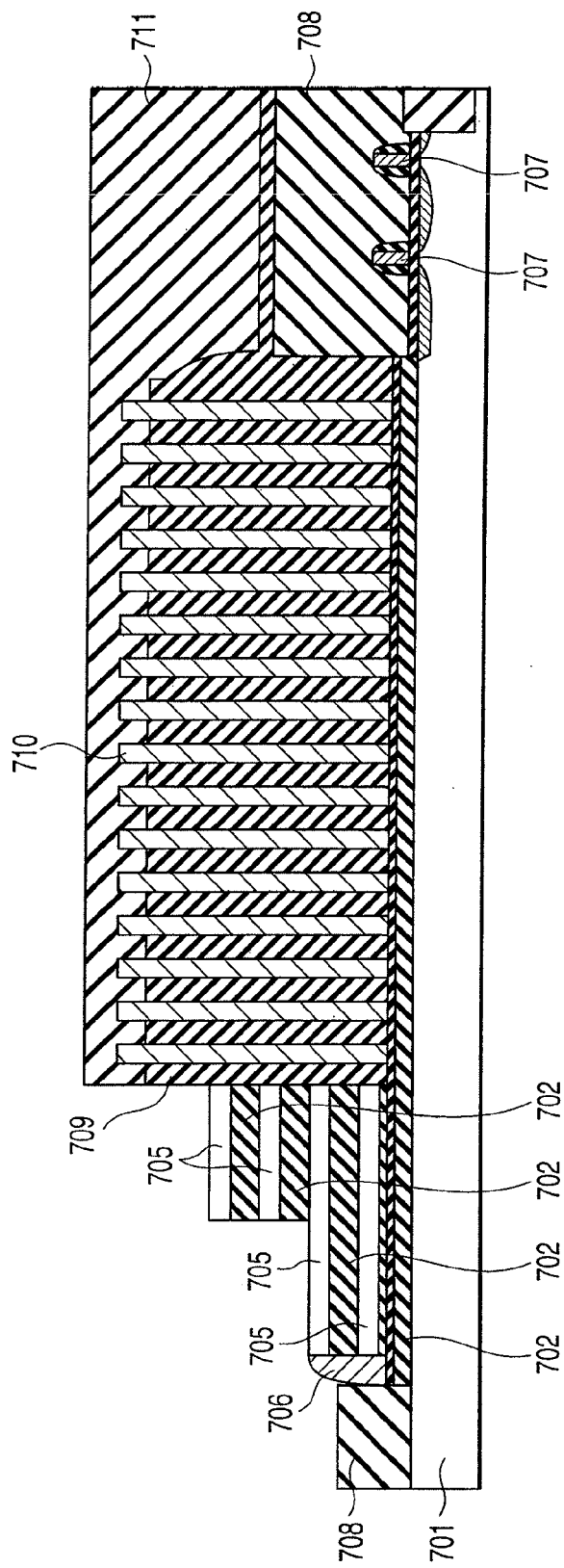
FIG. 33 is a sectional view showing a main manufacturing step of the semiconductor memory according to the sixth embodiment of the present invention.
Figure 34:
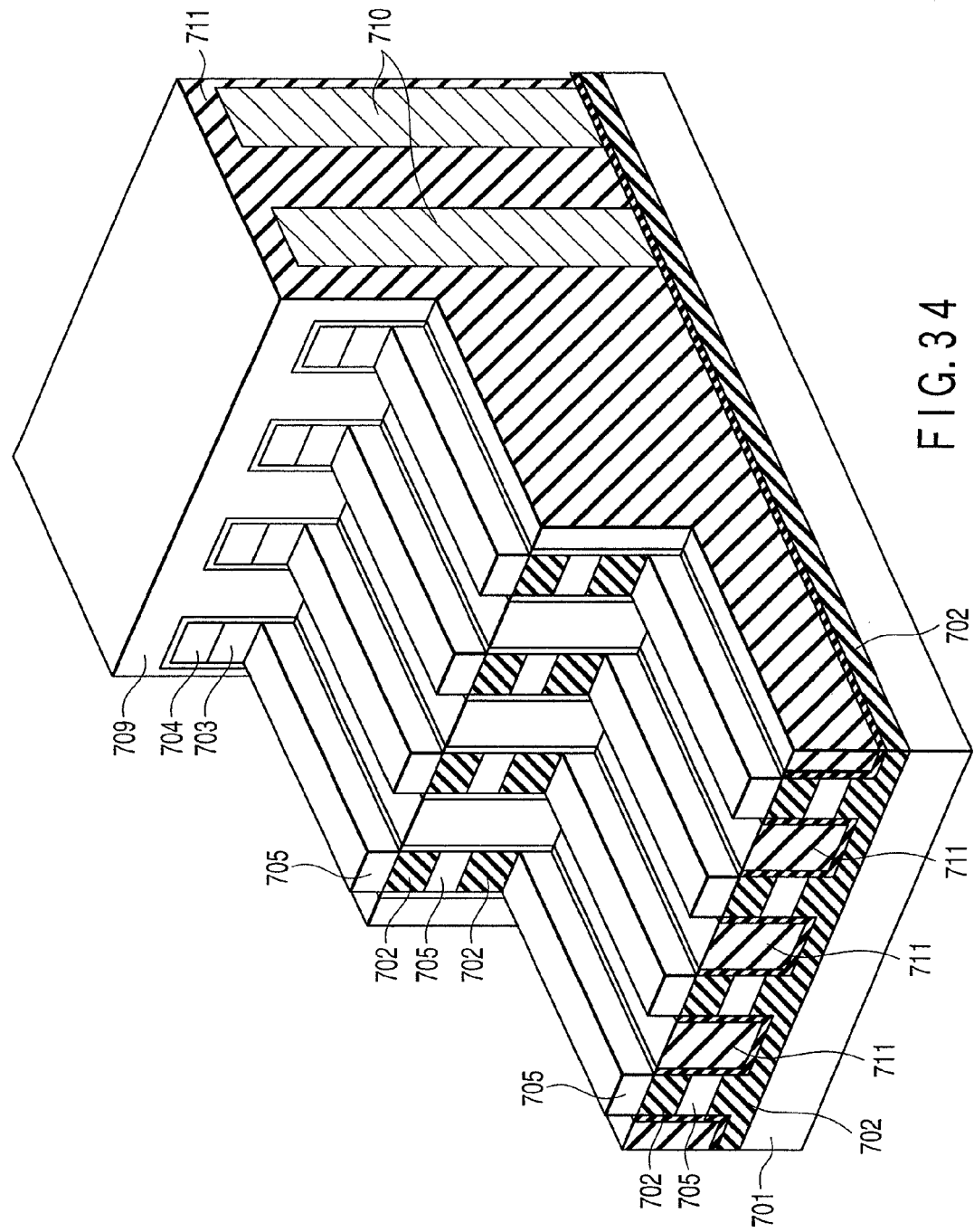
FIG. 34 is a perspective view showing a main manufacturing step of the semiconductor memory according to the sixth embodiment of the present invention.

As shown in FIGS. 33 and 34, an SOG film is filled between the gate electrodes and converted into a silicon oxide film, thereby forming an interlayer dielectric 711. The conventional lithography technique and RIE technique are used to expose the first and third polysilicon films 705.

Figure 35:
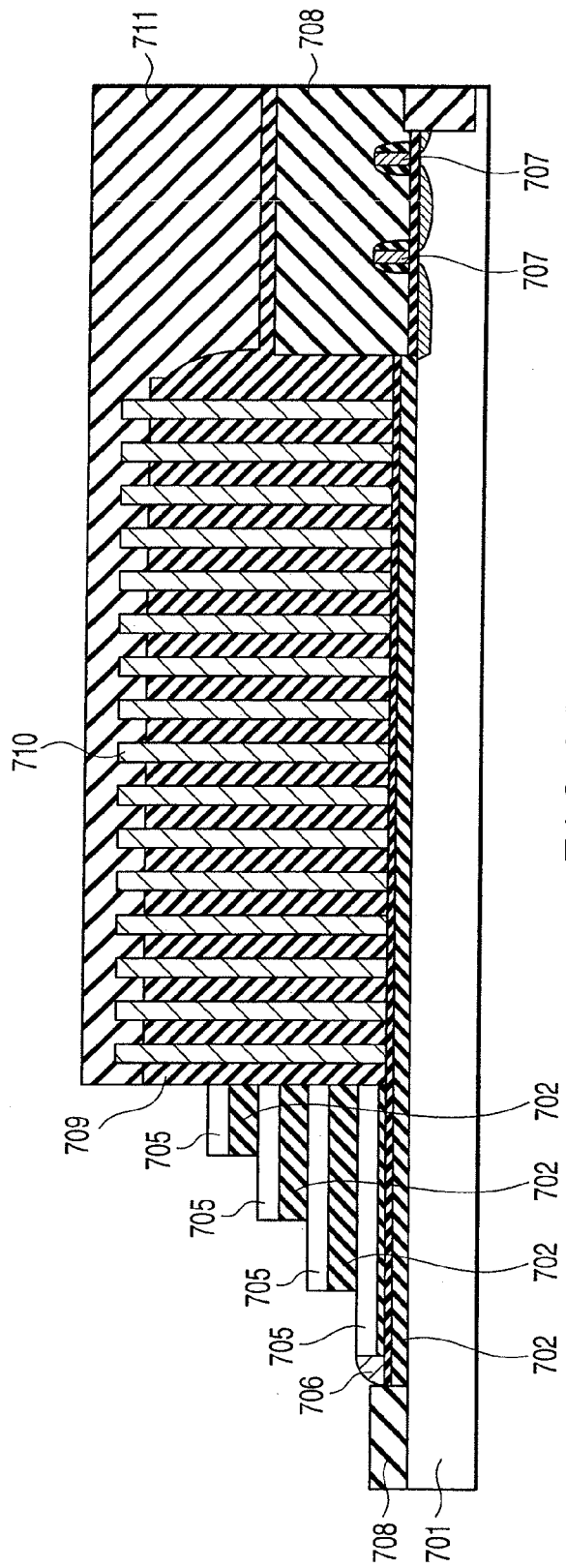
FIG. 35 is a sectional view showing a main manufacturing step of the semiconductor memory according to the sixth embodiment of the present invention.
Figure 36:
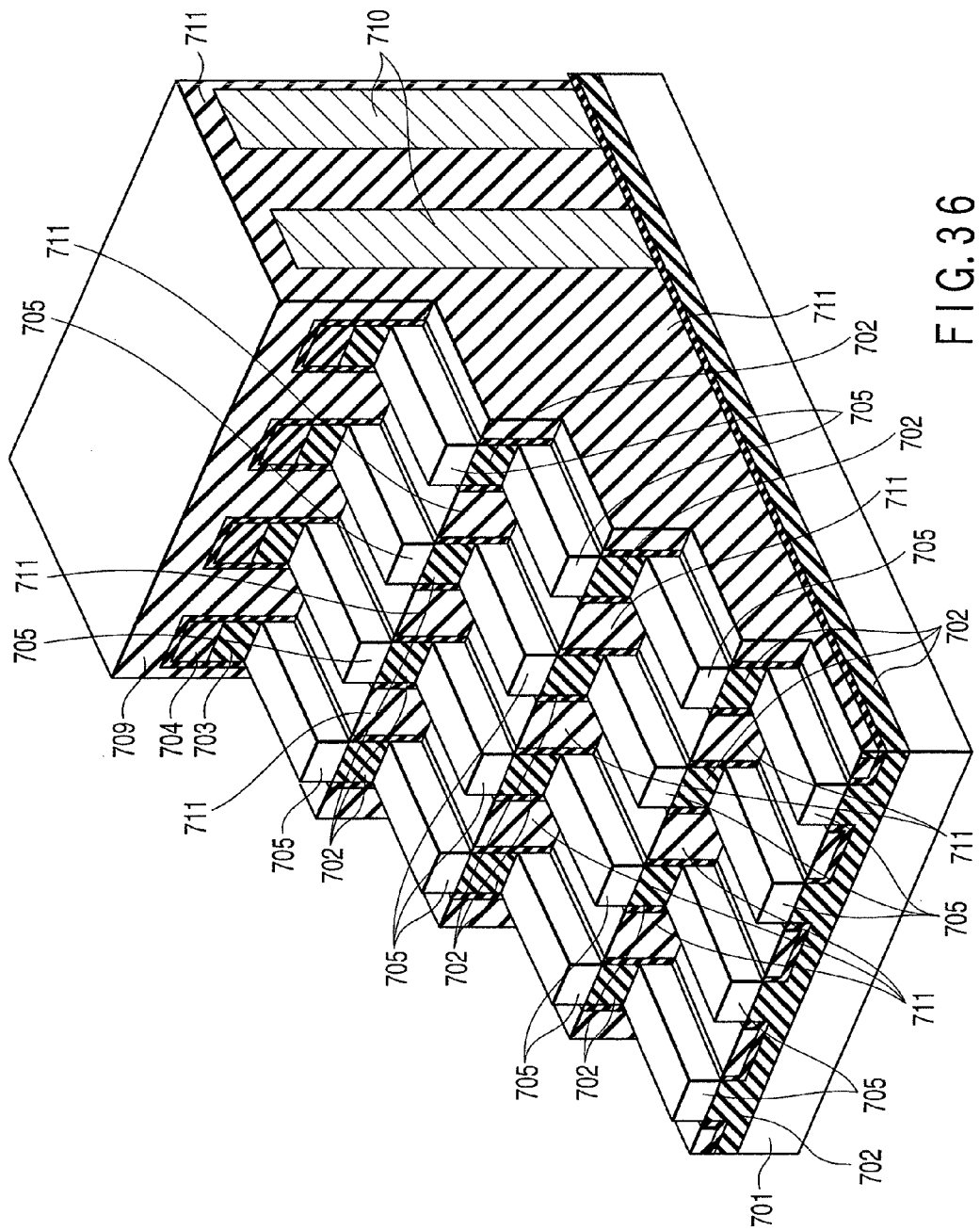
FIG. 36 is a perspective view showing a main manufacturing step of the semiconductor memory according to the sixth embodiment of the present invention.

Subsequently, as shown in FIGS. 35 and 36, the conventional lithography technique and RIE technique are used to expose the second and fourth polysilicon films 705.

Figure 37:
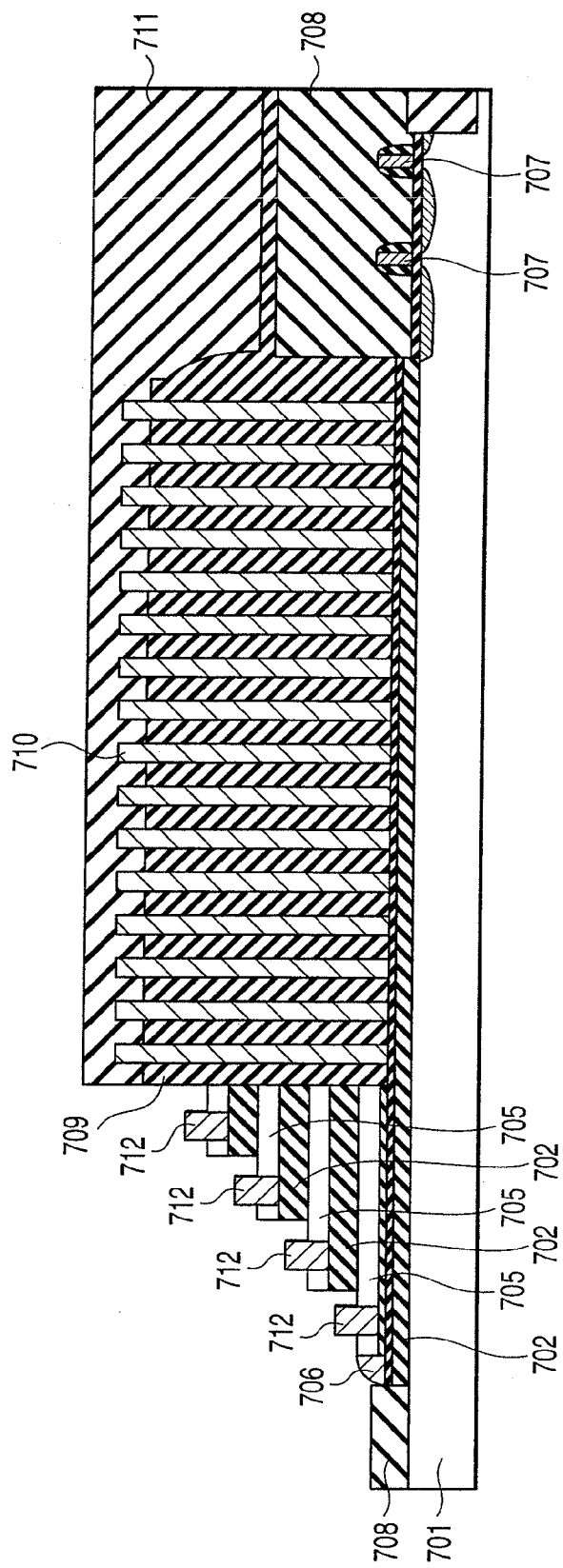
FIG. 37 is a sectional view showing a main manufacturing step of the semiconductor memory according to the sixth embodiment of the present invention.
Figure 38:
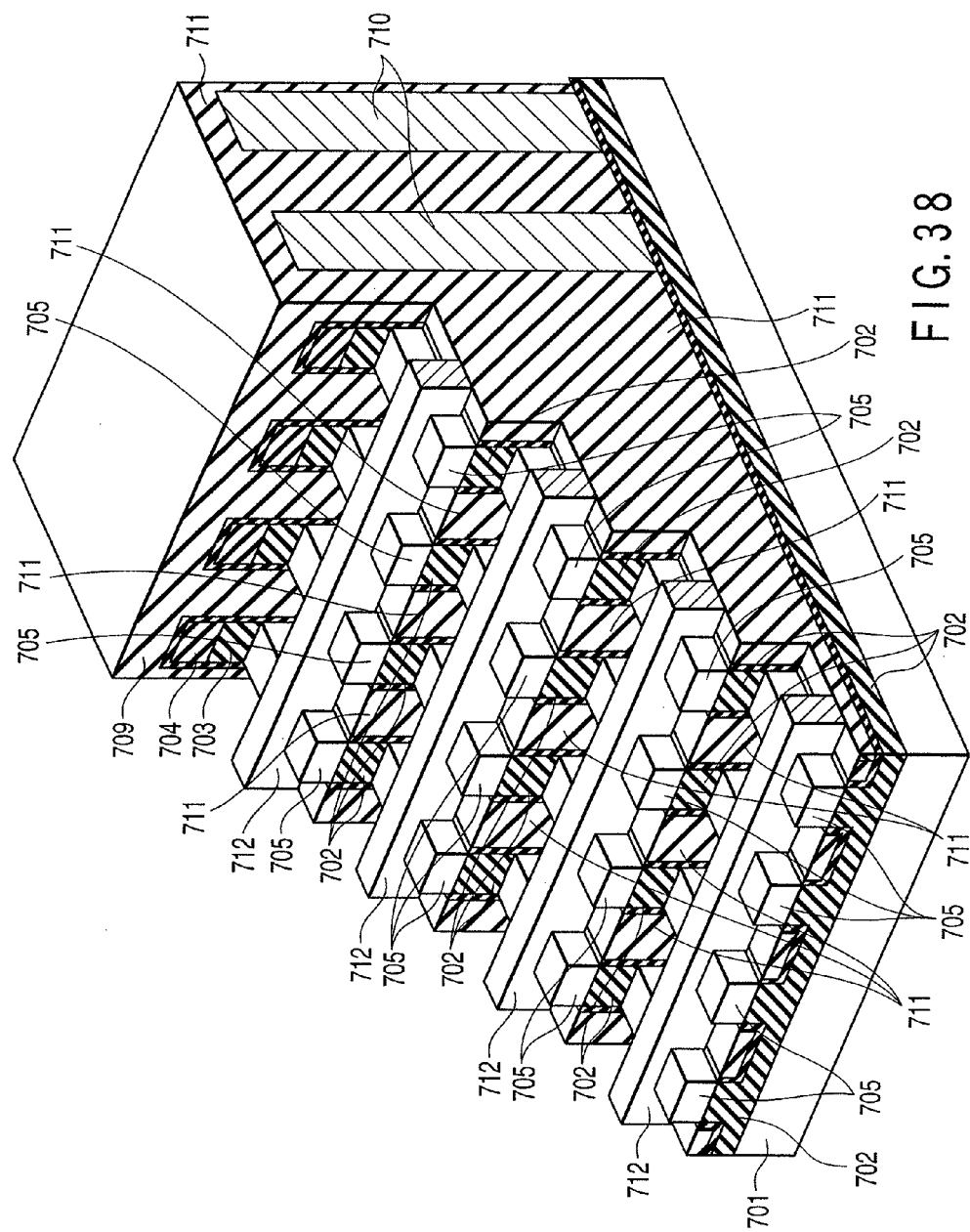
FIG. 38 is a perspective view showing a main manufacturing step of the semiconductor memory according to the sixth embodiment of the present invention.

As shown in FIGS. 37 and 38, the entire substrate surface is etched back to expose the surfaces and side surfaces of the polysilicon films 705. After that, gate oxide films/gate electrode films are formed and patterned by the conventional lithography technique and RIE technique, thereby forming layer selection gate transistors 712 for selecting layers. The formation of the layer selection gate transistors forms a tri-gate structure in which gate electrodes exist in three directions of the channel region. This increases the controllability of the gates and improves the cutoff performance.

Figure 39:
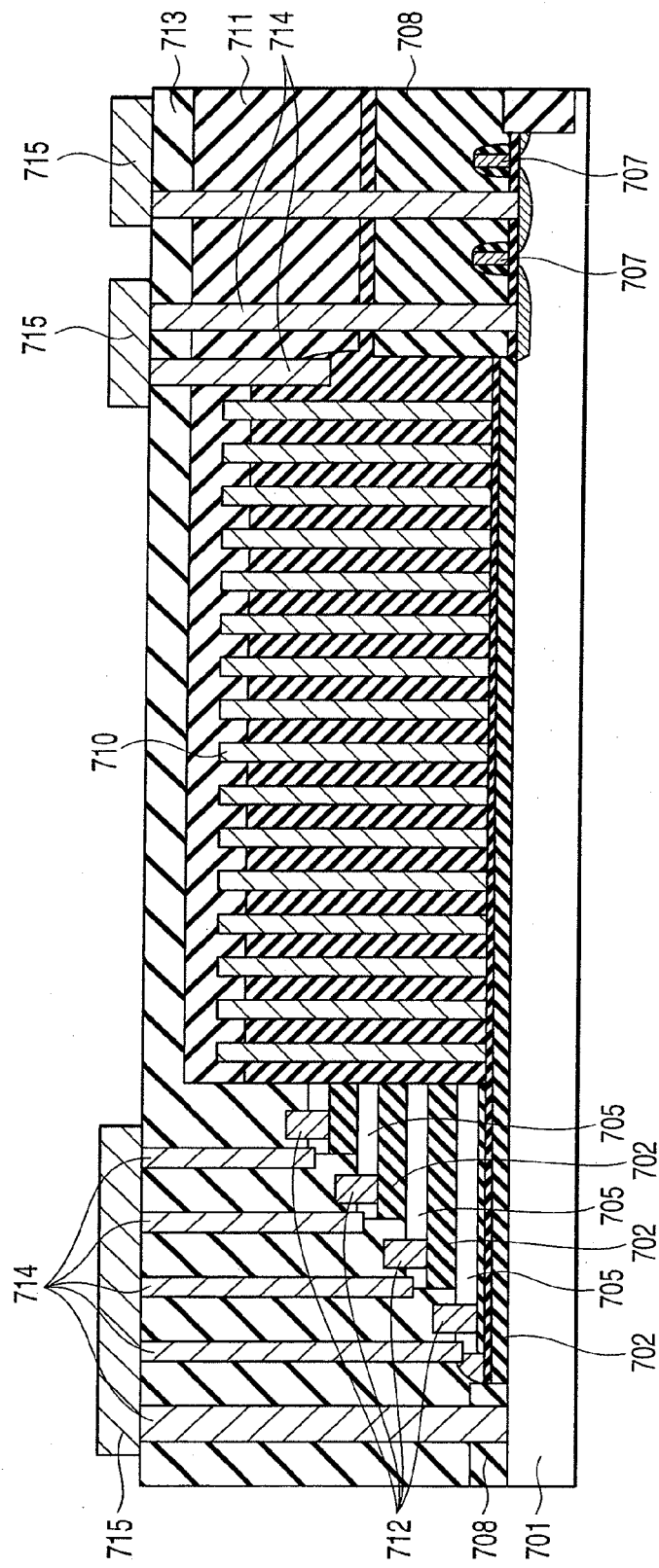
FIG. 39 is a sectional view showing a main manufacturing step of the semiconductor memory according to the sixth embodiment of the present invention.

As shown in FIG. 39, an interlayer dielectric 713 is formed on the entire substrate surface, contact holes connecting to the AA regions, gate electrodes, and peripheral circuit are formed, and a conductor film is filled, thereby forming contact plugs 714 on the source and drain sides, interconnections 715 between the layer selection gates and source-side contacts and between the drain-side contacts and peripheral circuit, and word line contact plugs connecting to the gate electrodes.

Figure 40:
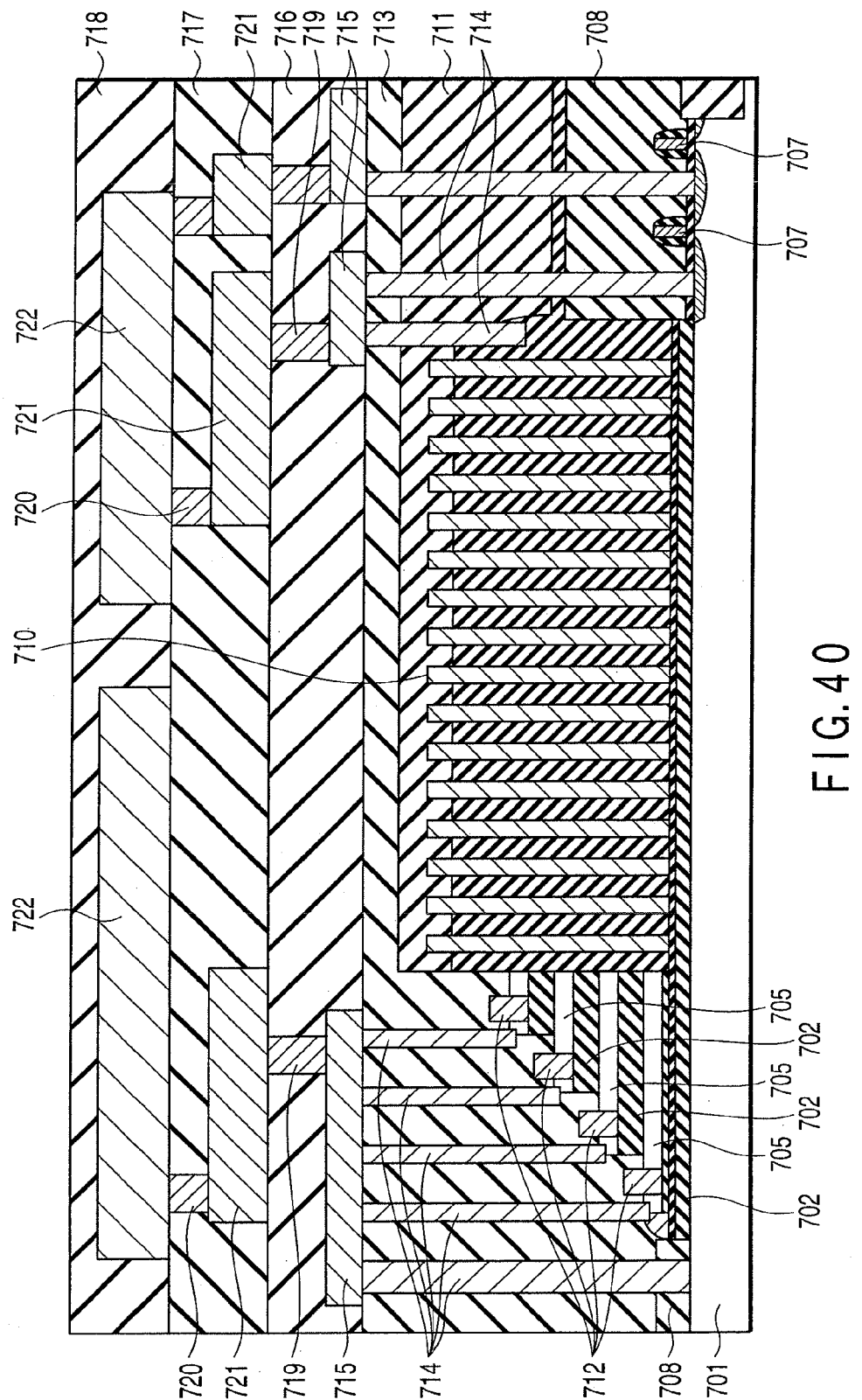
FIG. 40 is a sectional view showing a main manufacturing step of the semiconductor memory according to the sixth embodiment of the present invention.

After that, as shown in FIG. 40, a flash memory is formed by forming interlayer dielectrics 716, 717, and 718, contact plugs 719 and 720, and interconnections 721 and 722 in multilayered interconnection formation steps. However, the details will not be explained.

To perform data write and read in this embodiment, an arbitrary cell can be selected by first selecting one of the first to fourth layers by the layer gate transistor, selecting an AA region in the layer by the drain-side contact plug, and then selecting a gate electrode. In the conventional NAND flash memory, an arbitrary cell can be selected by selecting two AA regions sharing a source contact by a select gate transistor, selecting a desired AA region from a plurality of AA regions sharing the select gate electrode by a drain-side contact plug, and selecting a gate electrode. Therefore, the cell selecting operation is substantially the same as that of this embodiment. This makes it possible to implement the peripheral circuit and the like by a circuit configuration similar to that of the conventional NAND flash memory. That is, this embodiment has high affinity for the design of the conventional NAND flash memory, compared to the method of extracting the drain-side contact for each layer disclosed in the first to fifth embodiments.

Note that this embodiment uses the polysilicon film as each AA region, but each AA region can also be formed by a single-crystal silicon film in the same manner as described in the first to fifth embodiments.

Figure 41:
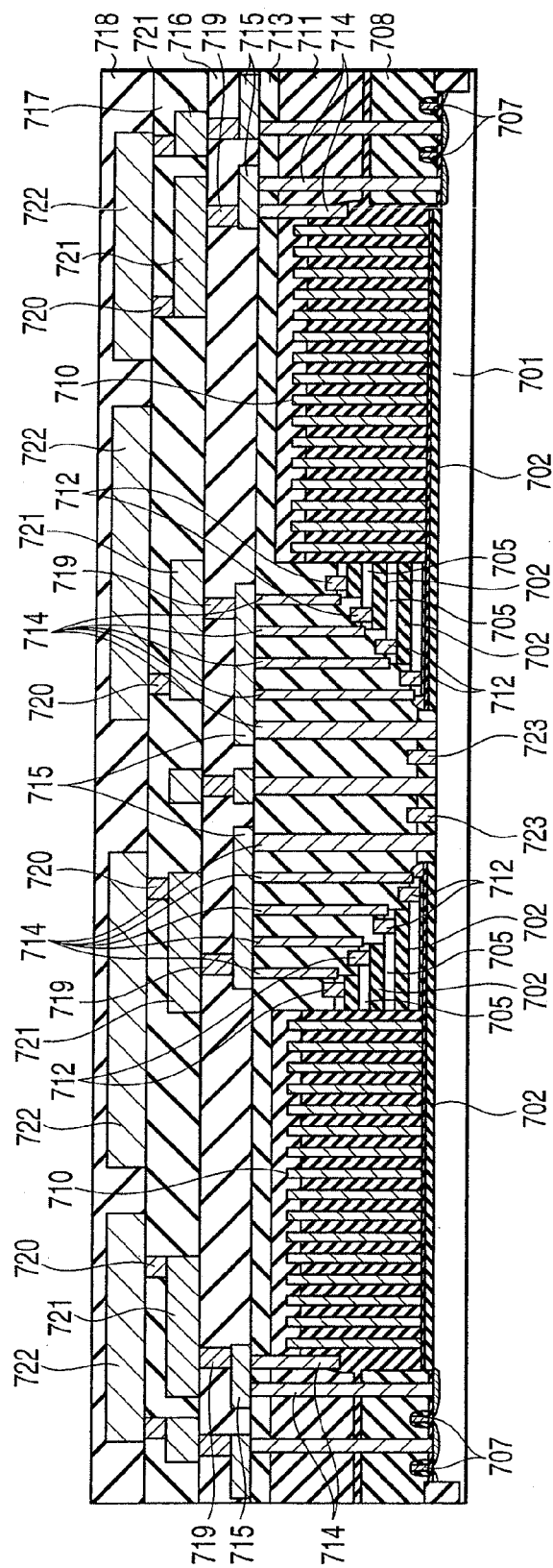
FIG. 41 is a sectional view of a semiconductor memory according to a modification of the sixth embodiment of the present invention.

Select gates 723 as used in the conventional NAND flash memory may also be formed in a cell structure similar to that of this embodiment. FIG. 41 shows an example.

In this structure, the select gate 723 selects one of stacked NAND chain arrays, the layer selection gate transistor 712 selects one of the first to fourth layers, the drain-side contact plug 714 selects an AA region in the layer, and the gate electrode 710 selects a cell in the same AA region.

Note that the select gates allow the above-mentioned layer selection gate transistors to be simultaneously formed, and high cutoff performance is readily achieved by forming the select gates on the semiconductor substrate.

The effect of suppressing the increase in number of steps that this embodiment has on the prior art will be explained below. Since estimating all steps is too complicated, the numbers of lithography steps requiring the highest process cost will be compared.

The number of times of lithography necessary to form the four-layered memory of this embodiment by the method of sequentially forming the individual layers according to the prior art is as follows:

(1) The number of times of lithography per layer: 3, i.e., 2 for AA processing and gate electrode (GC: Gate Conductor) processing, and 1 for formation of contact plugs between layers (2) Formation of contacts to stacked AAs: 1

Accordingly, a total of 3×4+1=13 lithography steps are necessary.

By contrast, this embodiment requires:

(1) Simultaneous processing of stacked AAs: 1
(2) Simultaneous processing of GCs: 1
(3) Processing for exposing end portions of stacked AA regions in order to form contact holes: 3
(4) Layer selection gate processing: 1
(5) Contact hole formation and connection of layer selection gates and source lines: 2

That is, a total of seven lithography steps can implement the embodiment.

The layer selection gates also have the following advantage in addition to implementing a stacked memory without largely increasing the number of times of lithography as described above.

When extracting the contact plugs from the stacked AA regions, it is difficult to extract interconnections parallel to the AA regions because the interval between adjacent AA regions is normally the minimum half pitch in the memory. Therefore, interconnections must be extracted perpendicularly to the AA regions. For this purpose, it is necessary to widen the intervals between the contact plugs arranged parallel to the AA regions so as to allow the interconnections to run between the contact plugs. This makes it difficult to increase the bit density.

By contrast, when the layer selection gate transistors are formed as in this embodiment, the numbers of contacts on the source and drain sides of the AA regions are the same as in the conventional unstacked NAND flash memory, and the connection to the peripheral circuit is also the same as in the conventional memory. The gate electrode that drives each layer selection gate transistor is extracted parallel to the control gate electrode of each cell. Therefore, the method of connecting the gate electrodes and the peripheral circuit is also basically the same as in the conventional unstacked NAND flash memory. That is, the number of select gates that originally each exist for one NAND chain increases in accordance with the number of stacked layers. This results in the big advantage that the peripheral circuit need not be largely changed.

(Seventh Embodiment)

FIGS. 42 to 52 are sectional views showing a semiconductor memory (flash memory) according to the seventh embodiment of the present invention in predetermined main manufacturing steps.

This embodiment is an example in which single-crystal silicon layers are stacked as in the first to fifth embodiments. In this example, however, a memory cell region is dug down beforehand in order to increase the flatness of the structure. Also, dummy gate electrodes are used to form diffusion layers.

Figure 42:
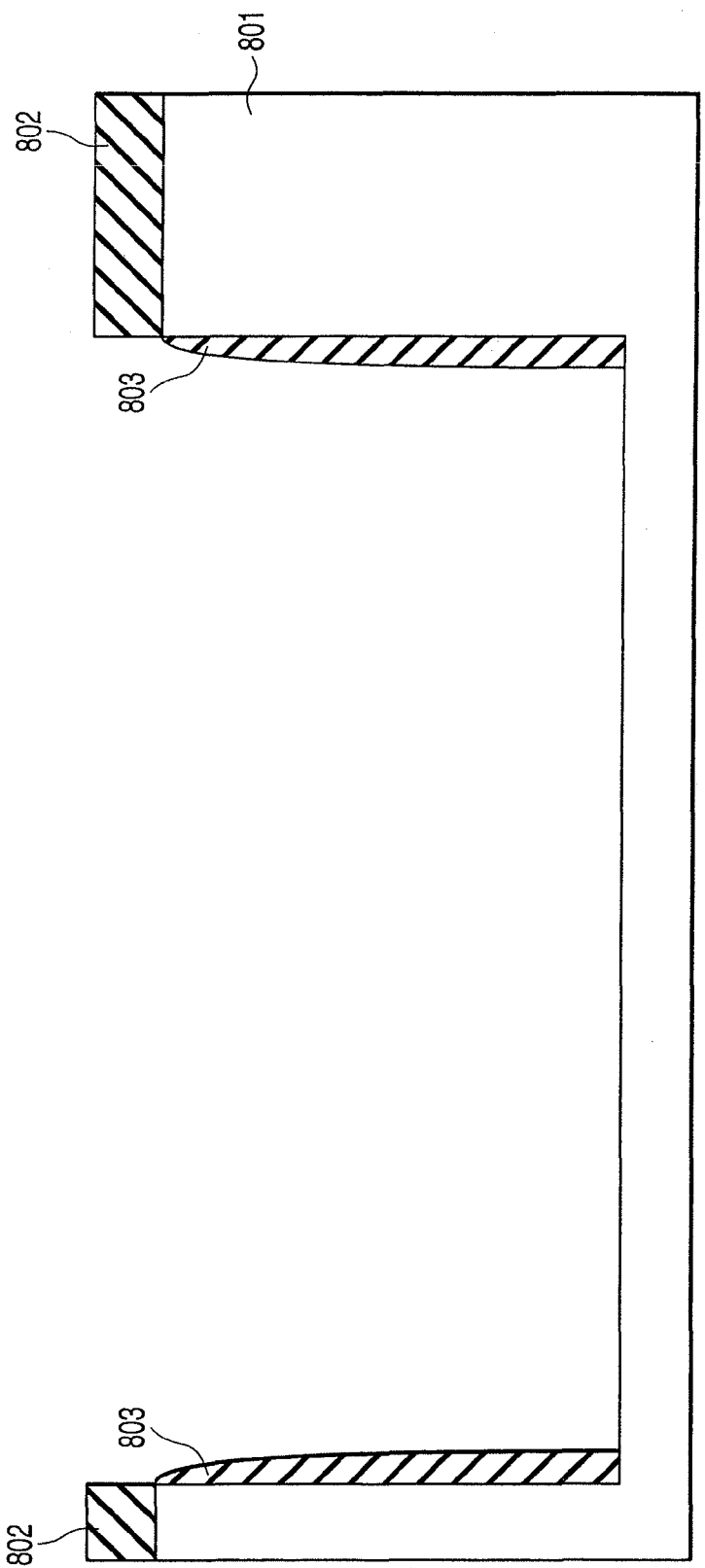
FIG. 42 is a sectional view showing a main manufacturing step of a semiconductor memory according to the seventh embodiment of the present invention.

First, as shown in FIG. 42, a silicon oxide film 802 as a hard mask is formed on a semiconductor substrate 801, and a memory cell region is dug down by the conventional lithography technique and RIE technique. In addition, a plasma CVD silicon oxide film 803 is formed on the entire surface, and left behind on only the sidewalls of the dug region by RIE that leaves sidewalls behind.

Figure 43:
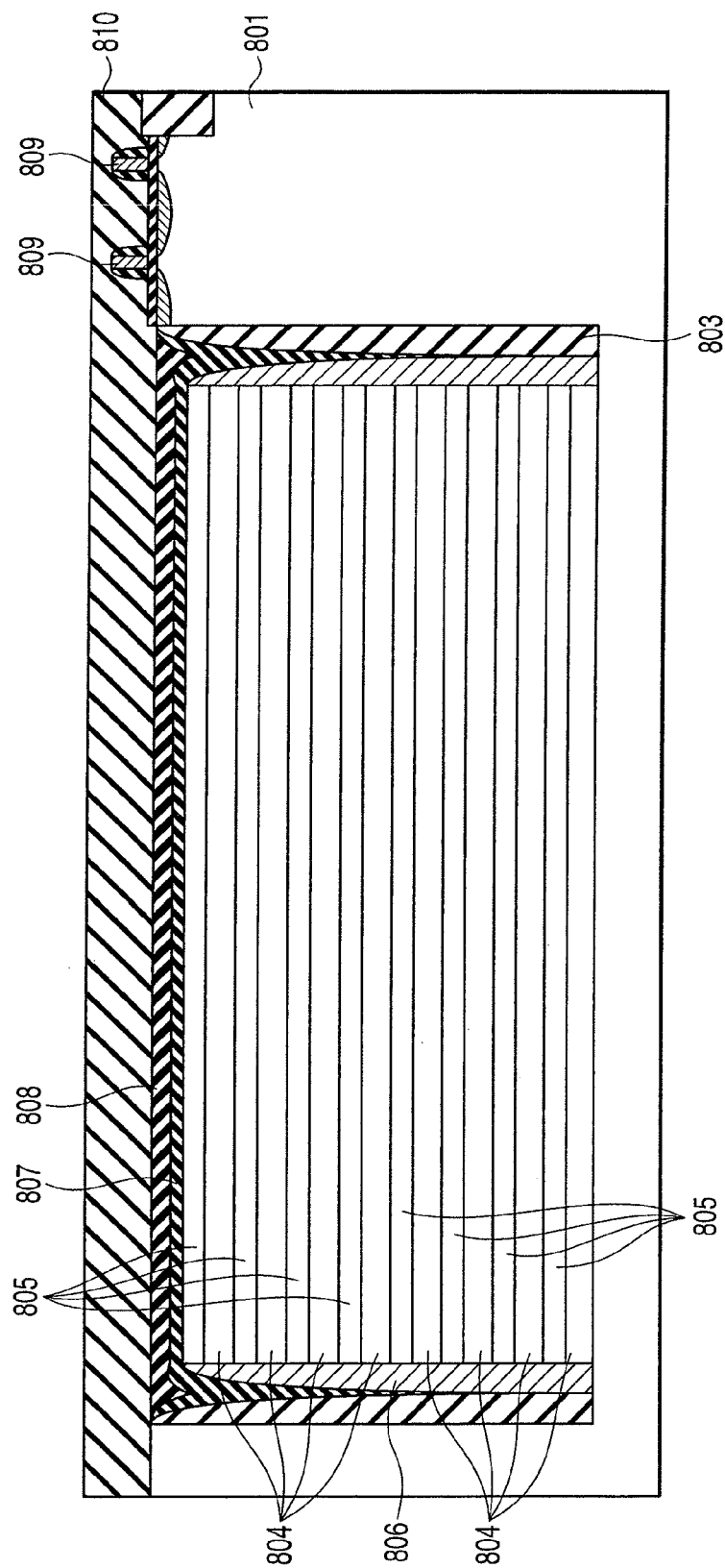
FIG. 43 is a sectional view showing a main manufacturing step of the semiconductor memory according to the seventh embodiment of the present invention.

Then, as shown in FIG. 43, eight epitaxial silicon germanium films 804 and eight epitaxial silicon films 805 are selectively sequentially stacked. In addition, a P-doped polysilicon film 806 is formed on the entire substrate surface, and left behind on only the sidewalls of the stacked epitaxial films by RIE etch back. A silicon nitride film 807 and a silicon oxide film 808 serving as a hard mask are formed on top of the structure. After that, transistors 809 forming a peripheral circuit are formed on the surface of the semiconductor substrate 801 except for the cell region, and the obtained structure is planarized by filling an interlayer dielectric 810.

Figure 44:
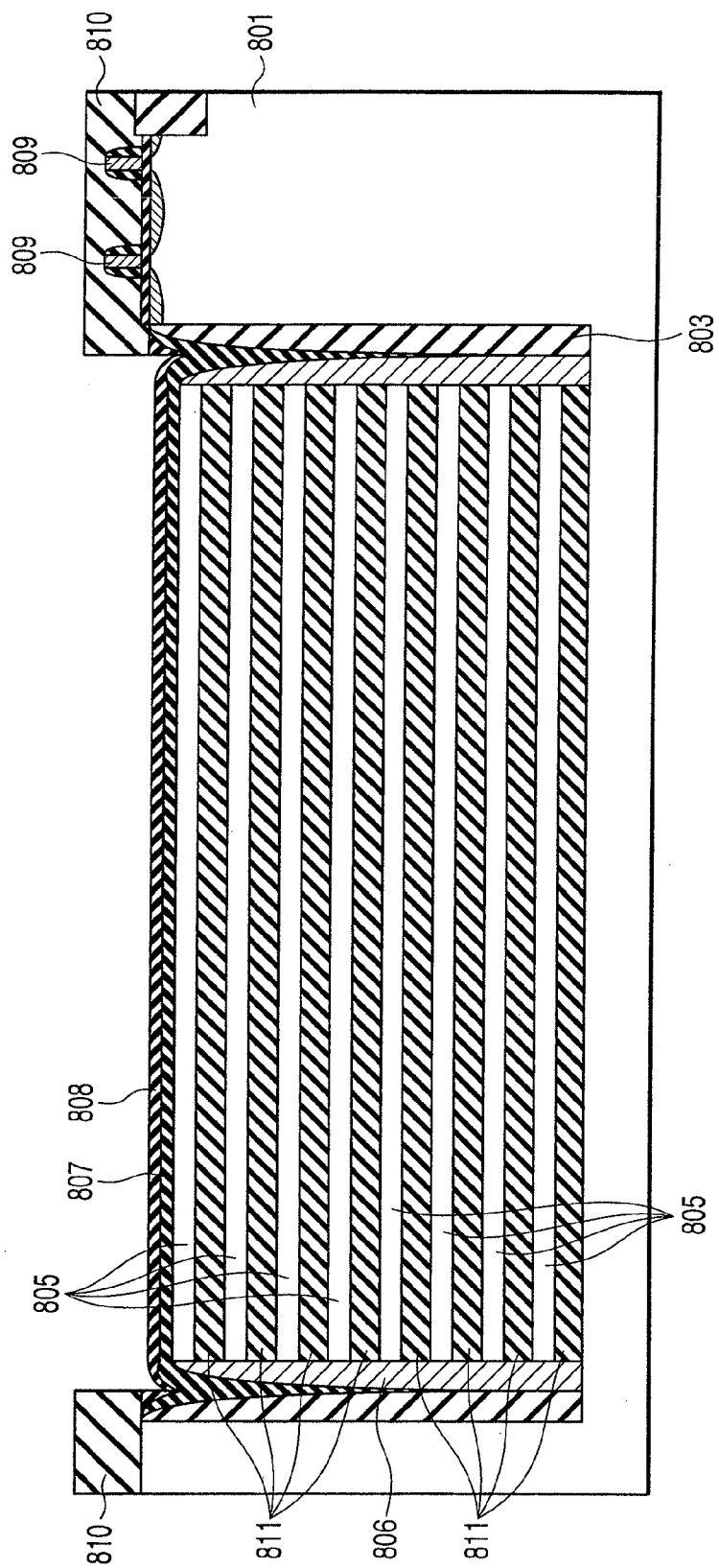
FIG. 44 is a sectional view showing a main manufacturing step of the semiconductor memory according to the seventh embodiment of the present invention.

Then, as shown in FIG. 44, the conventional lithography technique and RIE technique are used to simultaneously process the stacked silicon oxide film 808, silicon nitride film 807, epitaxial silicon films 805, and epitaxial silicon germanium films 804 into stripe patterns of AA regions. The epitaxial silicon germanium films 802 are selectively removed by wet etching. Subsequently, the entire substrate surface is coated with SOG, and SOG films 811 are filled in gaps formed by the selective wet etching of the silicon germanium films, thereby forming stacked AAs. Furthermore, the SCG films between the stacked AAs arrayed into stripes are etched back by RIE, thereby exposing the side surfaces of the epitaxial silicon films 805 forming the AAs.

As shown in FIG. 45, the side surfaces of the epitaxial silicon films 803 are thermally oxidized to form silicon thermal oxide films, and an amorphous silicon film for forming dummy gate electrodes is formed. Subsequently, the conventional lithography technique and RIE technique are used to process the amorphous silicon film, thereby forming dummy gate electrodes 812.

Figure 46:
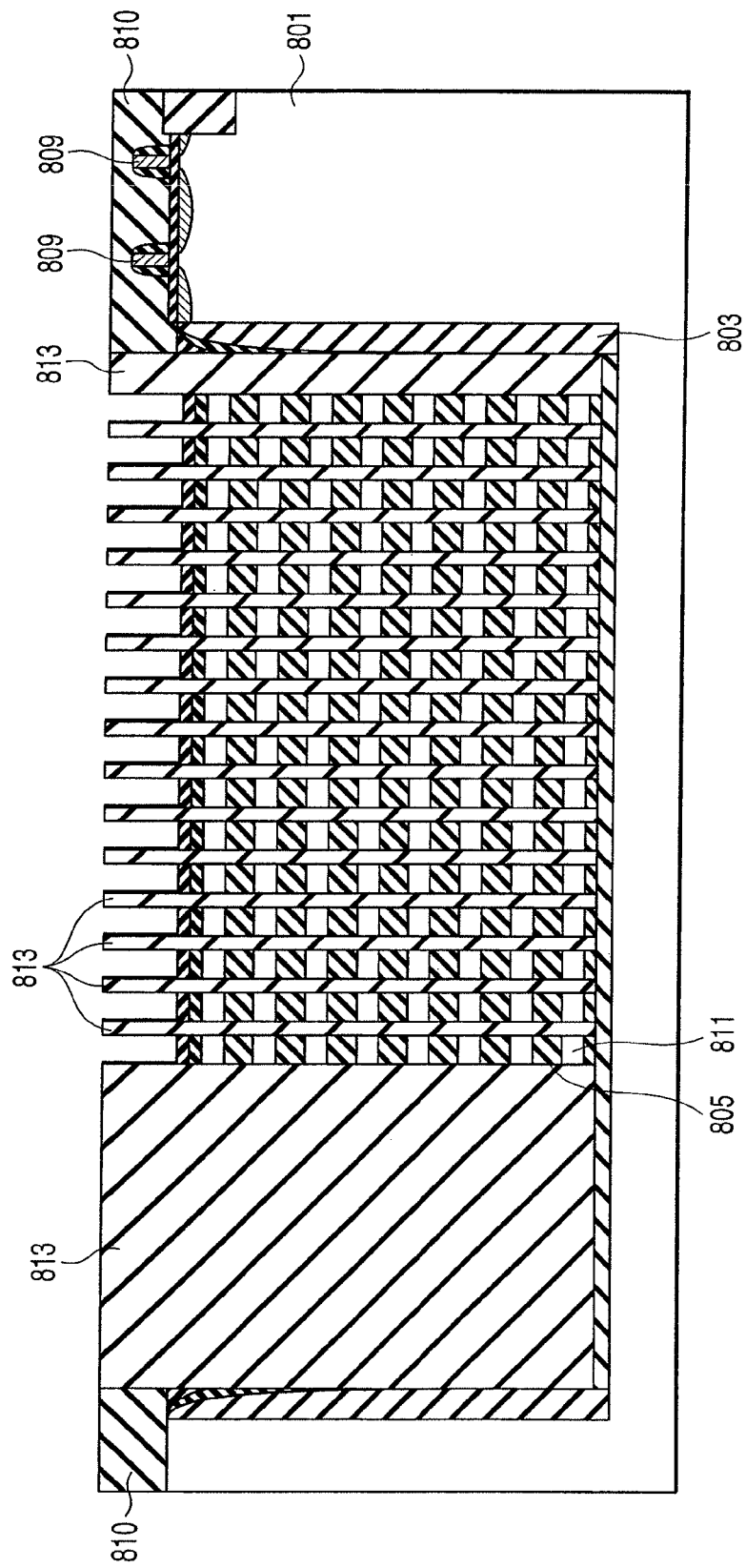
FIG. 46 is a sectional view showing a main manufacturing step of the semiconductor memory according to the seventh embodiment of the present invention.

Subsequently, as shown in FIG. 46, the dummy gate electrodes are used as masks to remove the silicon thermal oxide films by dry pre-treatment. After that, As-doped silicon oxide films 813 are filled by using LPCVD, and diffusion layers are formed by contact diffusion. The dummy gate electrodes 812 are then removed by chemical dry etching (CDE), and the silicon thermal oxide films are removed by dry pre-treatment, thereby forming gaps as templates of gate electrodes.

Figure 47:
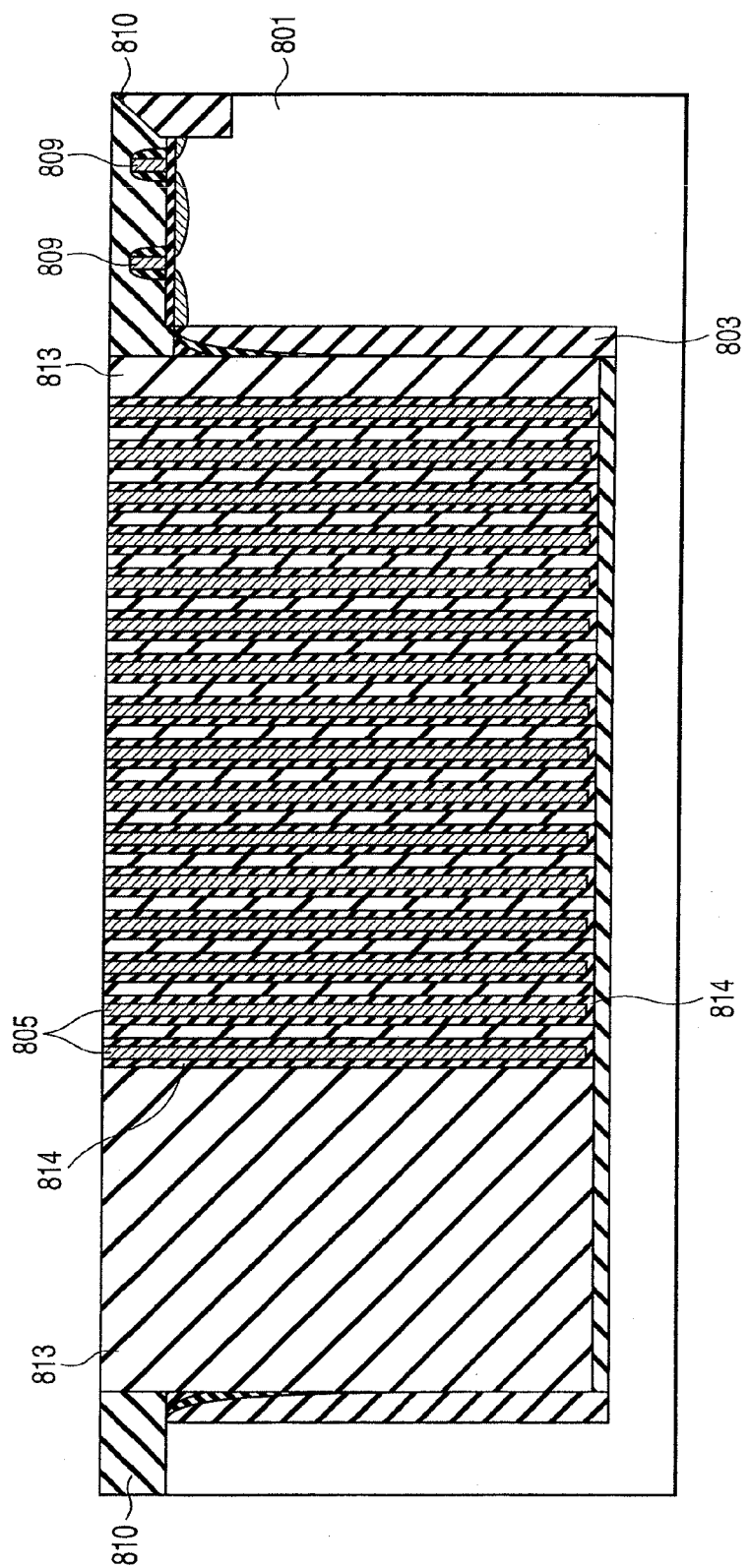
FIG. 47 is a sectional view showing a main manufacturing step of the semiconductor memory according to the seventh embodiment of the present invention.

As shown in FIG. 47, thermal oxide films/CVD-silicon nitride films/ALD-hafnium oxide films 814 serving as memory dielectric layers are sequentially formed. Then, CVD-TiN films serving as gate electrodes are filled and processed by CMP, thereby forming gate electrodes 815 that the stacked AA regions share.

Figure 48:
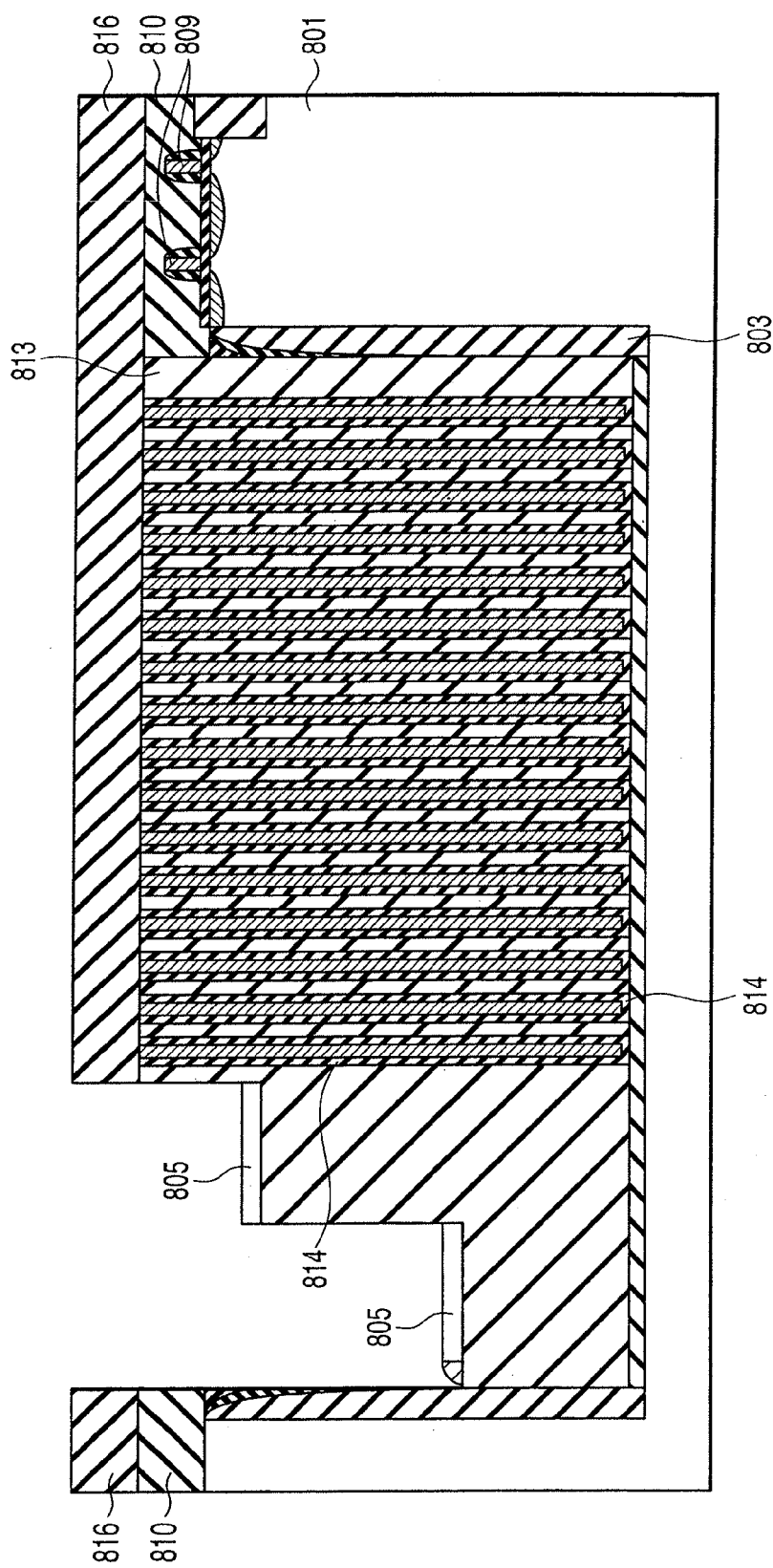
FIG. 48 is a sectional view showing a main manufacturing step of the semiconductor memory according to the seventh embodiment of the present invention.

As shown in FIG. 48, an interlayer dielectric 816 is formed. The conventional lithography technique and RIE technique are used to expose the eighth and fourth epitaxial silicon films 805.

Figure 49:
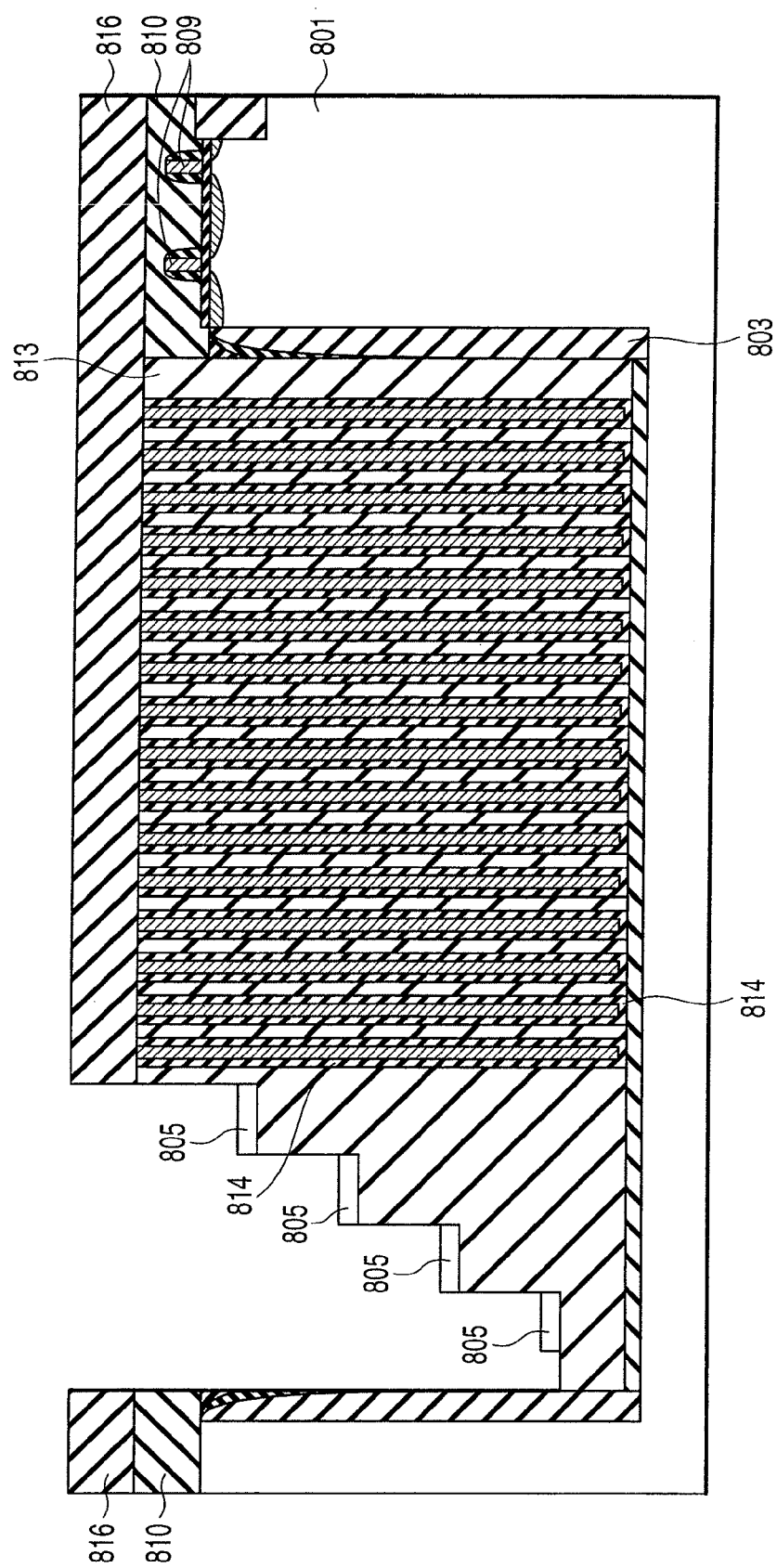
FIG. 49 is a sectional view showing a main manufacturing step of the semiconductor memory according to the seventh embodiment of the present invention.

As shown in FIG. 49, the conventional lithography technique and RIE technique are used to expose the sixth and second epitaxial silicon films 805.

Figure 50:
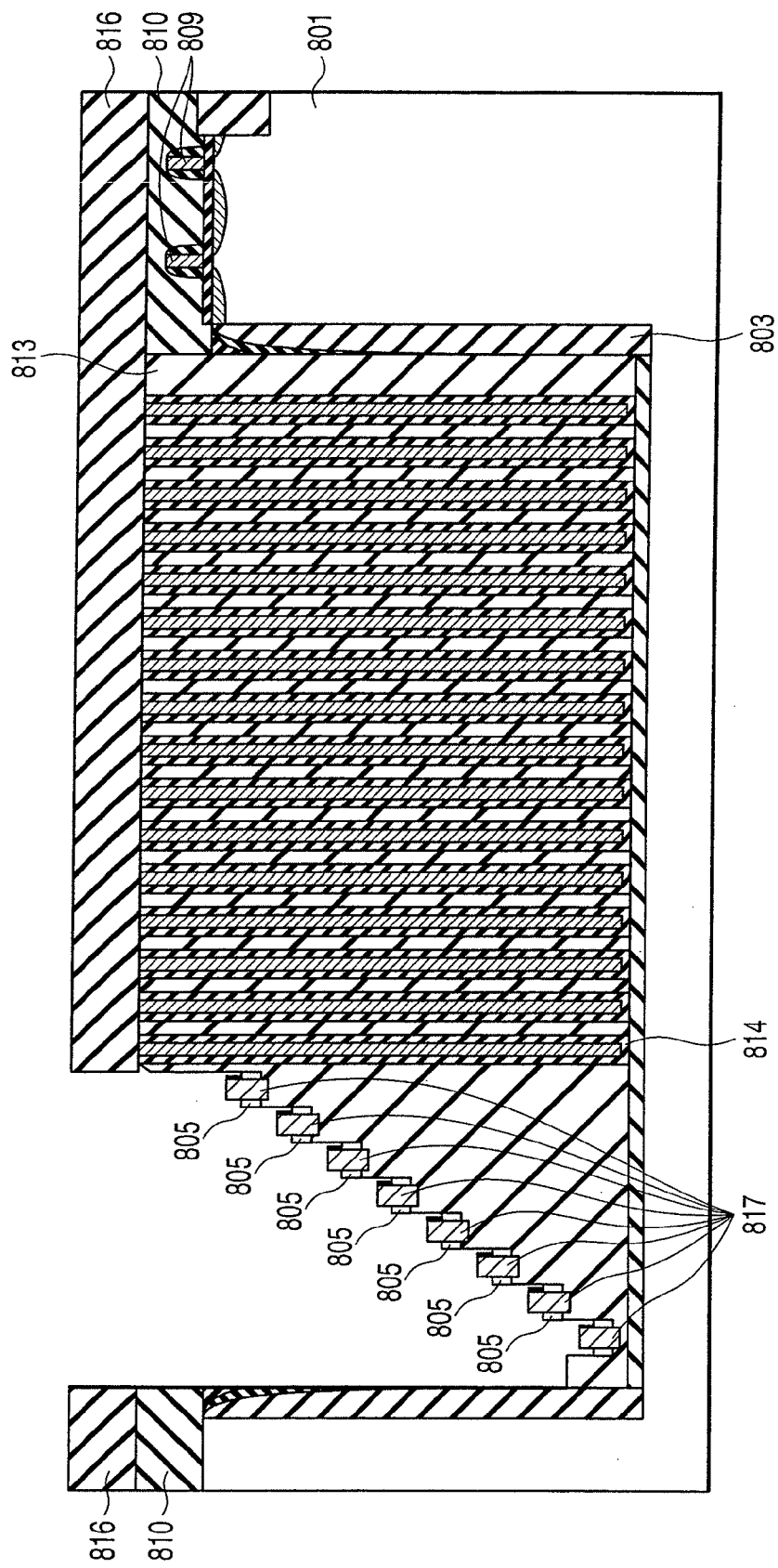
FIG. 50 is a sectional view showing a main manufacturing step of the semiconductor memory according to the seventh embodiment of the present invention.

As shown in FIG. 50, the conventional lithography technique and RIE technique are used to expose the seventh, fifth, third, and first epitaxial silicon films 805. Then, the entire substrate surface is etched back to expose the surfaces and side surfaces of the epitaxial silicon films 805. After that, gate oxide films/gate electrode films are formed and processed by the conventional lithography technique and RIE technique, thereby forming layer selection gate transistors 817 for selecting layers.

Figure 51:
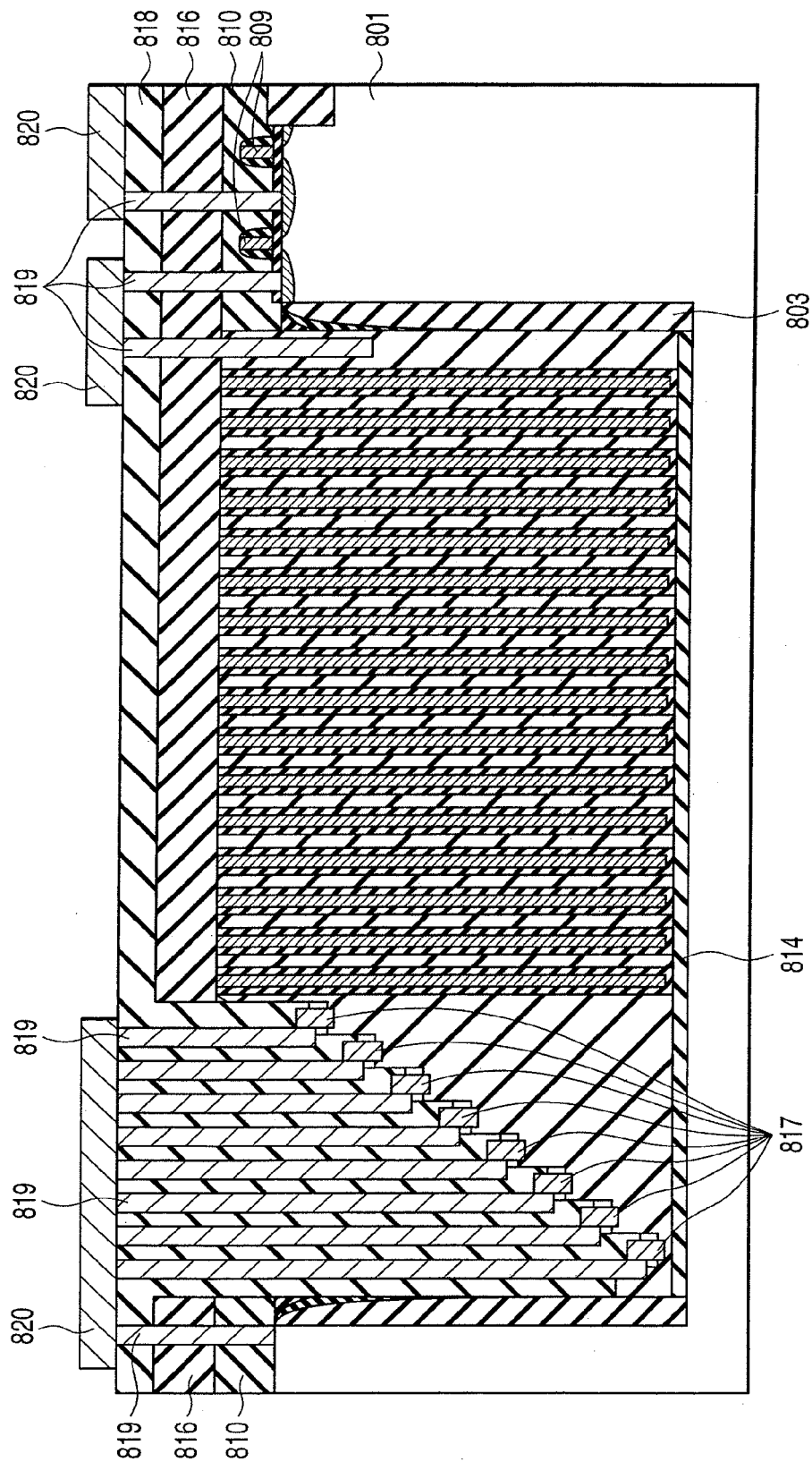
FIG. 51 is a sectional view showing a main manufacturing step of the semiconductor memory according to the seventh embodiment of the present invention.

As shown in FIG. 51, an interlayer dielectric 818 is formed on the entire substrate surface, contact holes connecting to the AA regions, gate electrodes, and peripheral circuit are formed, and a conductor film is filled, thereby forming contact plugs 819 on the source and drain sides, interconnections 820 that connect the layer selection gate transistors and source-side contacts, and word line contact plugs connecting to the gate electrodes.

Figure 52:
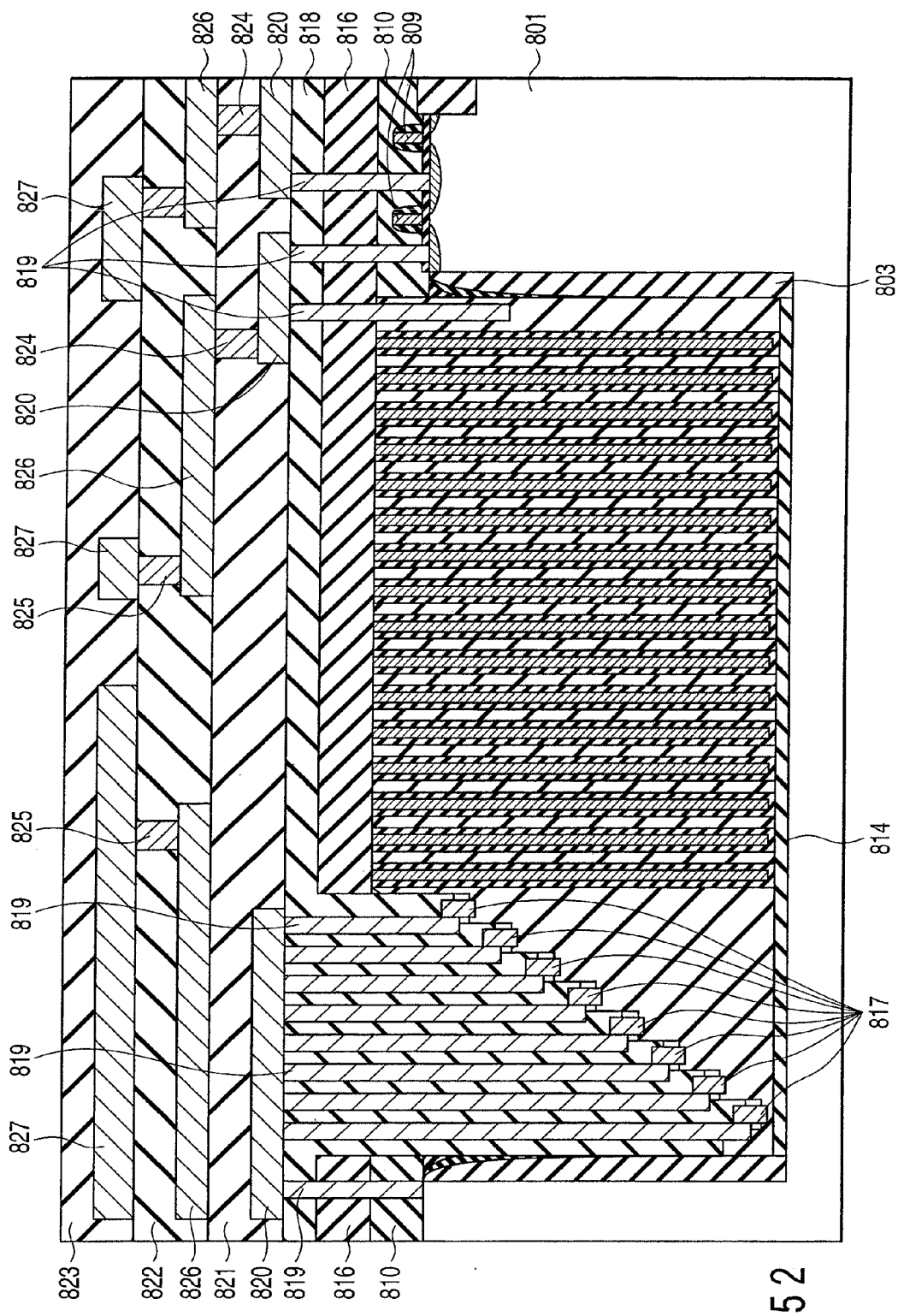
FIG. 52 is a sectional view showing a main manufacturing step of the semiconductor memory according to the seventh embodiment of the present invention.

After that, as shown in FIG. 52, a flash memory is formed by forming interlayer dielectrics 821, 822, and 823, contact plugs 824 and 825, and interconnections 826 and 827 in multilayered interconnection formation steps. However, the details will not be explained.

This embodiment recesses the stacked cell portion to be lower than the surface of the semiconductor substrate. This suppresses the substrate step when forming the multilayered interconnection, and facilitates the lithography steps and processing steps. This embodiment also has the advantage that the diffusion layers can be easily formed by using the dummy gate electrodes.

The effect of suppressing the increase in number of steps that the present invention has on the prior art will be explained below in this embodiment as well. Since estimating all steps is too complicated, the numbers of lithography steps requiring the highest process cost will be compared.

The number of times of lithography necessary to form the eight-layered memory of this embodiment by the method of sequentially forming the individual layers according to the prior art is as follows:

(1) The umber of times of lithography per layer: 3, i.e., 2 for AA processing and gate electrode (GC: Gate Conductor) processing, and 1 for formation of contact plugs between layers (2) Formation of contacts to stacked AAs: 1

Accordingly, a total of 3×8+1=25 lithography steps are necessary.

By contrast, this embodiment requires:

(1) Processing for digging down a cell region: 1
(2) Simultaneous processing of stacked AAs: 1
(3) Simultaneous processing of GCs: 1
(4) Processing for exposing end portions of stacked AAs in order to form contact holes: 3
(5) Layer selection gate processing: 1
(6) Contact hole formation and connection of layer selection gates and source lines: 2

Accordingly, a total of nine lithography steps can implement the embodiment. That is, the use of the present invention makes it possible to reduce the number of lithography steps to almost ⅓.

Each of the above embodiments has explained an example in which a planar MONOS memory widespread as a nonvolatile memory is used in a form in which a channel is formed parallel to a semiconductor substrate in a plane perpendicular to the substrate. However, the above embodiments are also effective in nonvolatile memories using different cell structures and different storage principles. Even in these cases, the contact or layer selection gate formation method remains the same. Therefore, an explanation will be limited to the cell portion formation method hereinafter in order avoid complexity.

(Eighth Embodiment)

Figure 53:
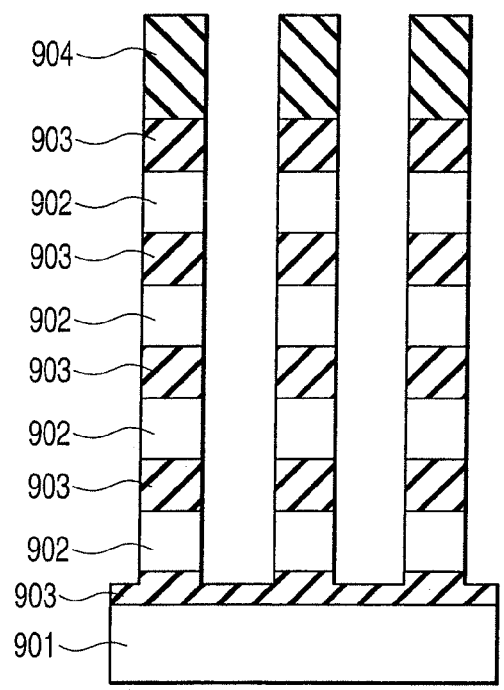
FIG. 53 is a sectional view showing a main manufacturing step of a semiconductor memory according to the eighth embodiment of the present invention.
Figure 54:
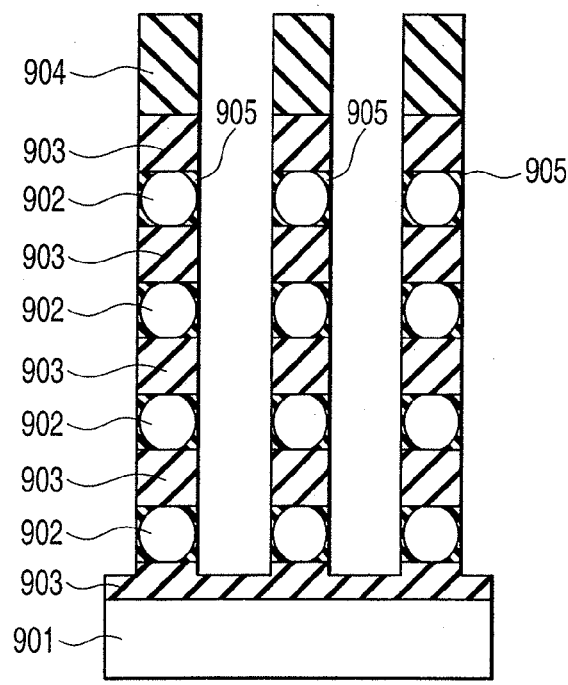
FIG. 54 is a sectional view showing a main manufacturing step of the semiconductor memory according to the eighth embodiment of the present invention.
Figure 55:
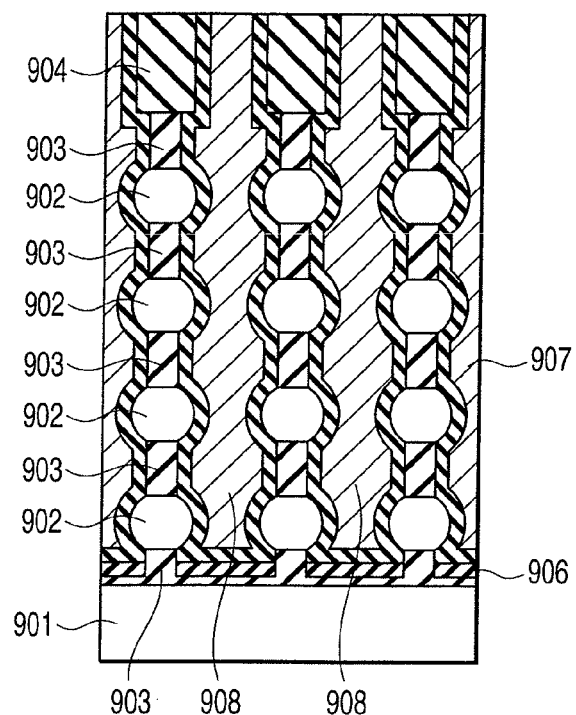
FIG. 55 is a sectional view showing a main manufacturing step of the semiconductor memory according to the eighth embodiment of the present invention.

FIGS. 53 to 55 are sectional views showing a semiconductor memory (flash memory) according to the eighth embodiment of the present invention in predetermined main manufacturing steps.

This embodiment is an example of a MONOS memory similar to the first to seventh embodiments, but gives the channel surface a curvature in order to improve the write/erase characteristics.

Stacked AA regions are formed in a memory cell portion in the same manner as in the embodiments explained above. For the sake of simplicity, an explanation will be made with reference to only sectional views of the AAs.

First, as shown in FIG. 53, in a memory cell region on a semiconductor substrate 901, epitaxial silicon films 902 serving as AA regions and silicon oxide films 903 that separate AA regions are stacked as they are processed by using hard masks 904 into a shape in which AA regions are simultaneously processed into stripes.

Then, as shown in FIG. 54, the exposed side surfaces of the epitaxial silicon films 902 are oxidized by steam oxidation, and bird's beak oxidation is caused by steam diffused in the silicon oxide films 903, thereby forming silicon thermal oxide films 905 such that the side surfaces of the epitaxial silicon films 902 processed into stripes have a sectional shape with a curvature.

As shown in FIG. 55, the silicon thermal oxide films 905 are removed by dry pre-treatment, and the silicon oxide films 903 are partially recessed, thereby forming a shape in which the epitaxial silicon films 902 whose side surfaces have a curvature are stacked. Subsequently, the entire substrate surface is coated with SOG to fill SOG films 906 in gaps between the stacked AA regions. The conventional lithography technique and wet etching technique are used to form gaps as templates of gate electrodes by etch back. Then, thermal oxide films/silicon nitride films/silicon oxide films 907 are sequentially formed, and P-doped polysilicon films 908 are filled and processed by CMP, thereby forming MONOS memory cells.

In this embodiment, the channel of each of the AA regions vertically arranged parallel to the substrate is formed into a shape having a curvature. Since electric field concentration raises the effective electric field, a memory cell operation at a lower write/erase voltage can be implemented.

(Ninth Embodiment)

Figure 56:
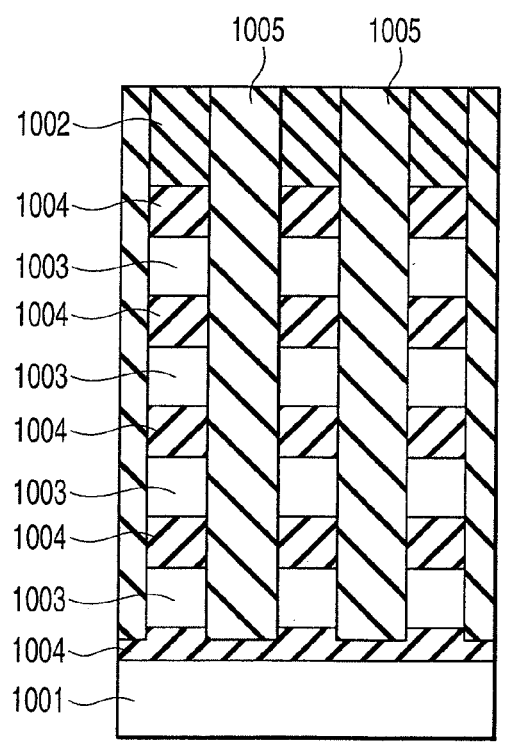
FIG. 56 is a sectional view showing a main manufacturing step of a semiconductor memory according to the ninth embodiment of the present invention.

FIGS. 56 to 58 are sectional views showing a semiconductor memory (flash memory) according to the ninth embodiment of the present invention in predetermined main manufacturing steps.

Unlike the first to eighth embodiments, this embodiment is an example in which the present invention is applied to a phase change RAM (PRAM). Similar to a resistive RAM (RRAM) to be described later, the PRAM senses the change in resistance of a memory element by the change in amount of an electric current flowing through the memory element. Accordingly, it is unnecessary to stack transistors as in a MONOS memory, but diodes need to be stacked.

Similar to the previous embodiments, this embodiment also forms stacked AA regions in a memory cell portion. An explanation will be made with reference to sectional views of the AA regions.

First, as shown in FIG. 56, in a memory cell region on a semiconductor substrate 1001, B-doped polysilicon films 1003 serving as AA regions and silicon oxide films 1004 that separate AA regions are stacked into a shape in which AA regions are simultaneously processed into stripes by hard masks 1002. Interlayer dielectrics 1005 are filled between the stacked AA regions.

Then, as shown in FIG. 57, the conventional lithography technique and RIE technique are used to form gaps as templates of diodes and memory elements. These gaps are formed in alternate spaces between the AA regions arranged into stripes for the reason explained below. That is, in a memory such as a PRAM or RRAM that senses a resistance change, even when elements are formed at the two ends of one AA, if the resistance of the element at one end lowers due to data write, it becomes difficult to apply a voltage to the element at the other end. Consequently, the following three states:

(1) The state in which the resistances of the elements at the two ends lower (2) The state in which the resistance of the element at the right end lowers (3) The state in which the resistance of the element at the left end lowers and intermediate states (because the element resistance of a PRAM or RRAM continuously changes) of these states coexist. This varies the threshold value of the memory operation.

As shown in FIG. 58, gaps are formed by selectively and isotropically recessing the B-doped polysilicon films 1003 by chemical dry etching. A P-doped polysilicon film 1006 is formed on the entire substrate surface, and left behind in only the gaps in the B-doped polysilicon films 1003 by non-masking RIE etch back, thereby forming diode portions. The P-doped polysilicon films are then recessed by chemical dry etching. Subsequently, tungsten films 1007 serving as heaters are selectively grown on the surfaces of the recessed P-doped polysilicon films by using CVD. After that, GST films ($Ge_2Sb_2Te_5$) 1008 and CVD titanium nitride films 1009 serving as electrode films are formed by using CVD, and processed by using the CMP technique, thereby forming PRAM memory cells.

This embodiment uses the method of filling an n-type semiconductor in a p-type semiconductor as the diode formation method. As shown in FIG. 59, however, it is also possible to form n-type semiconductor layers 1010 by diffusing an impurity on the surfaces of the gaps formed by selectively and isotropically recessing the B-doped polysilicon films 1003, and partially filling the GST films 1008 in the recesses of the tungsten films 1007 as heater films, thereby improving the write characteristic (reducing the write voltage).

(10th Embodiment)

FIGS. 60 to 62 are sectional views showing a semiconductor memory (flash memory) according to the 10th embodiment of the present invention in predetermined main manufacturing steps.

This embodiment is an example in which the present invention is applied to a resistive RAM (RRAM).

Similar to the previous embodiments, this embodiment also forms stacked AA regions in a memory cell portion. An explanation will be made with reference to sectional views of the AA regions.

First, as shown in FIG. 60, in a memory cell region on a semiconductor substrate 1101, B-doped polysilicon films 1103 serving as AA regions and silicon oxide films 1104 that separate AA regions are stacked into a shape in which AA regions are simultaneously patterned into stripes by using hard masks 1102. Interlayer dielectrics 1105 are filled between the stacked AA regions.

Then, as shown in FIG. 61, the conventional lithography technique and RIE technique are used to form gaps as templates of diodes and memory elements. These gaps are formed in alternate spaces between the AA regions arranged into stripes. The purpose is the same as described in the ninth embodiment. Subsequently, gaps are formed by selectively and isotropically recessing the B-doped polysilicon films 1103 by chemical dry etching. A P-doped polysilicon film 1106 is formed on the entire substrate surface, and left behind in only the gaps in the B-doped polysilicon films 1103 by non-masking RIE etch back, thereby forming diode portions. The P-doped polysilicon films 1106 are then recessed by chemical dry etching. A CVD titanium nitride film 1107 and ruthenium film 1108 are formed by using CVD, and etched back by using the conventional RIE technique so as to remain in only the gaps formed by recessing the P-doped polysilicon films.

Subsequently, as shown in FIG. 62, a zirconia film 1109 for forming resistive elements is formed on the entire substrate surface, and a ruthenium film 1110 for forming upper electrodes is formed by using ADL. These films are processed by using the conventional CMP technique, thereby forming RRAM memory cells.

This embodiment uses the method of filling an n-type semiconductor in a p-type semiconductor as the diode formation method. As described in the ninth embodiment, however, diodes may also be formed by forming n-type semiconductor layers by diffusing an impurity on the surfaces of the gaps formed by selectively and isotropically recessing the B-doped polysilicon films 1102.

As the insulating film serving as a resistive element, it is also possible to use, e.g., a titania film, hafnia film, or nickel oxide film, instead of a zirconia film. It is clear that the effect (of increasing the bit density per unit area) of this embodiment is obtained regardless of whether any of these films is used.

(11th Embodiment)

Figure 63:
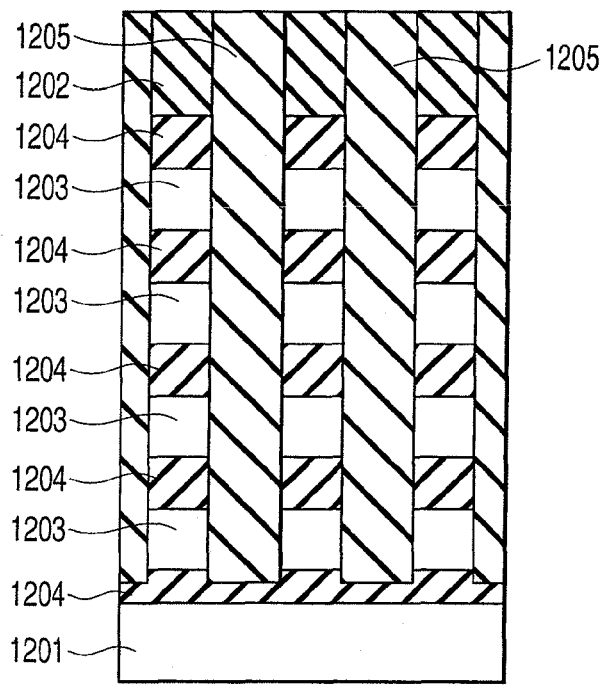
FIG. 63 is a sectional view showing a main manufacturing step of a semiconductor memory according to the 11th embodiment of the present invention.
Figure 64:
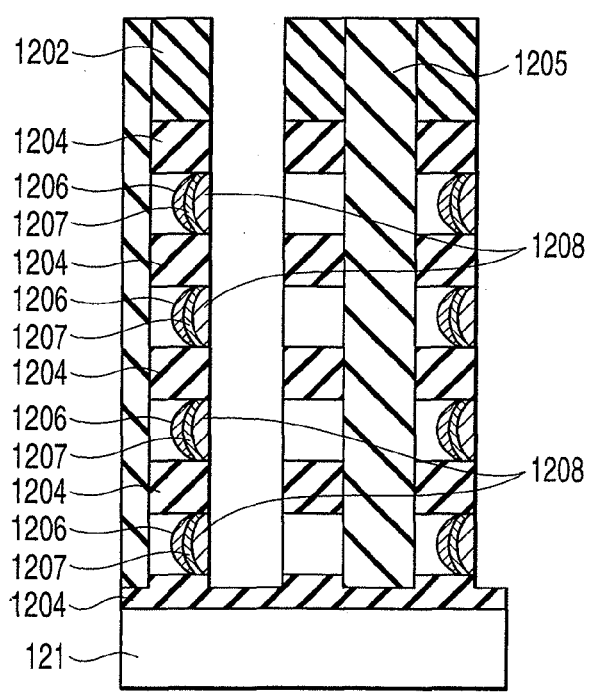
FIG. 64 is a sectional view showing a main manufacturing step of the semiconductor memory according to the 11th embodiment of the present invention.
Figure 65:
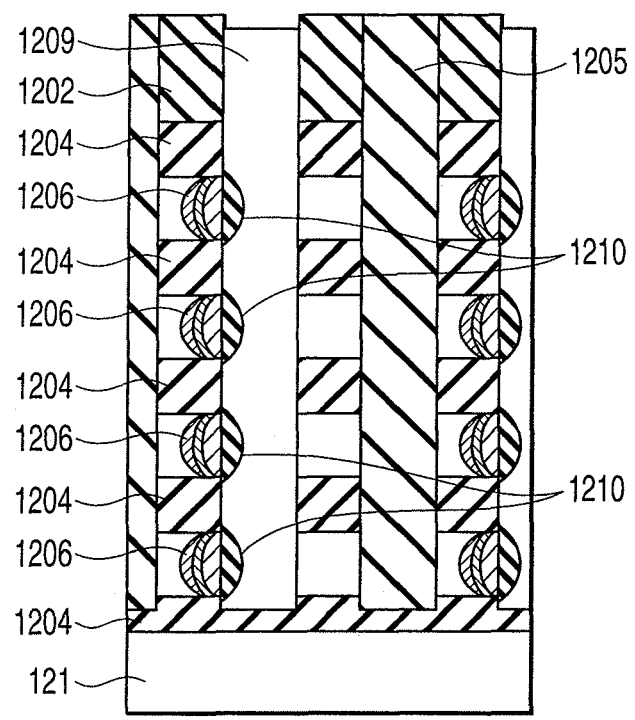
FIG. 65 is a sectional view showing a main manufacturing step of the semiconductor memory according to the 11th embodiment of the present invention.

FIGS. 63 to 65 are sectional views showing a semiconductor memory (flash memory) according to the 11th embodiment of the present invention in predetermined main manufacturing steps.

Similar to the 10th embodiment, this embodiment is also an example in which the present invention is applied to a resistive RAM (RRAM). However, a resistive element is selectively formed by using the plating technique.

Similar to the previous embodiments, this embodiment also forms stacked AA regions in a memory cell portion. An explanation will be made with reference to sectional views of the AA regions.

First, as shown in FIG. 63, similar to the 10th embodiment, in a memory cell region on a semiconductor substrate 1201, B-doped polysilicon films 1203 serving as AA regions and silicon oxide films 1204 that separate AA regions are stacked into a shape in which AA regions are simultaneously processed into stripes by using hard masks 1202. Interlayer dielectrics 1205 are filled between the stacked AA regions.

Then, as shown in FIG. 64, the conventional lithography technique and RIE technique are used to form gaps as templates of diodes and memory elements. These gaps are formed in alternate spaces between the AA regions arranged into stripes. The purpose is the same as described in the ninth embodiment. Subsequently, gaps are formed by selectively and isotropically recessing the B-doped polysilicon films 1203 by chemical dry etching. Diodes are formed by forming n-type semiconductor layers 1206 by diffusing P by gas phase doping (GPD) on the surfaces of the gaps formed by selectively and isotropically recessing the B-doped polysilicon films 1203. A CVD titanium nitride film 1207 and ruthenium film 1208 are formed by using CVD, and etched back by using the conventional RIE technique so as to remain in only the gaps formed in the B-doped polysilicon films 1203.

Subsequently, as shown in FIG. 65, nickel films are selectively formed on the surfaces of ruthenium by using electroplating (EP), and platinum films 1209 are also selectively formed by using the EP process, thereby completely filling the gaps formed between the AA regions. This forms upper electrodes of RRAM elements. At this point, however, no resistive elements are formed. Then, oxidation is performed in oxygen at 500° C. The platinum films 1209 do not oxidize but transmit oxygen. Since a low temperature of 500° C. is selected, however, this oxidation process oxidizes the nickel films without oxidizing the ruthenium films 1208 as lower electrodes, thereby forming nickel oxide films 1210 as resistive elements. In this manner, RRAM memory cells are formed.

Although the first to 11th embodiments of the present invention have been explained above, forms and methods of practicing the present invention are not limited to these embodiments. That is, it is possible to appropriately combine the AA region formation methods, gate electrode processing methods, contact hole formation methods, layer selection gate formation methods, materials, and the like disclosed in the embodiments. Even in these cases, it is possible to achieve the effect expected from the embodiments of the present invention, i.e., increase the degree of integration per unit area without largely increasing the number of manufacturing steps. Accordingly, a high density memory can be manufactured relatively easily.

In addition, the above embodiments include the following modes.

(1) A semiconductor memory is characterized by comprising stripe-like active areas (AAs) stacked parallel to a substrate, wherein the AAs stacked perpendicularly to the substrate are patterned in self-alignment with each other, each AA uses, as a channel region, one or both of the side surfaces perpendicular to the substrate, and intersects a plurality of gate electrodes (GCs) in the longitudinal direction, the intersections of the AAs and GCs form memory cells, and a plurality of cells in an intersecting plane share the gate electrode.

(Effects of Mode (1))

(a) The bit density per unit area can be increased by stacking the memory cells. That is, the degree of integration can be increased without any micropatterning.

(b) Since an SOI structure is formed, a transistor tough against the short-channel effect can be implemented.

(c) The structure is basically a double-gate electrode structure. This improves the controllability of a transistor.

(2) A semiconductor memory is characterized by comprising stripe-like active areas (AAs) stacked parallel to a substrate, wherein the AAs stacked perpendicularly to the substrate are patterned in self-alignment with each other, a memory dielectric layer and gate electrode are formed on a side surface, which is perpendicular to the substrate, of each AA, each AA intersects a plurality of gate electrodes (GCs) in the longitudinal direction, the intersections of the AAs and GCs form memory cells, each cell in an intersecting plane shares the gate electrode with an adjacent cell, and gate electrodes sandwiching each AA are connected by interconnections so as to be driven independently of each other.

(Effect of Mode (2))

(a) Since two independent gate electrodes are formed for one cell, multilevel storage is possible. This makes it possible to increase the bit density without any special micropatterning.

(3) A semiconductor memory is characterized by comprising stripe-like active areas (AAs) stacked parallel to a substrate, wherein the AAs stacked perpendicularly to the substrate are processed in self-alignment with each other, a memory dielectric layer and gate electrode are formed on a side surface, which is perpendicular to the substrate, of each AA, each AA intersects a plurality of gate electrodes (GCs) in the longitudinal direction, the intersections of the AAs and GCs form memory cells, each cell has a structure sandwiched between first and second gate electrodes, cells in a plane perpendicular to the AAs share the first gate electrode, and the second gate electrode is formed parallel to the AAs and shared by a plurality of cells in a plane parallel to the AA direction and perpendicular to the substrate.

(Effect of Mode (3))

(a) Since a back gate electrode is formed for each AA, electric charge written in the memory dielectric layer can be readily removed in data erase. That is, the erase characteristic improves.

(4) A semiconductor memory is characterized by comprising stripe-like active areas (AAs) stacked parallel to a substrate, wherein the AAs stacked perpendicularly to the substrate are patterned in self-alignment with each other, a memory layer and gate electrode are formed on a side surface, which is perpendicular to the substrate, of each AA, each AA intersects a plurality of gate electrodes (GCs) in the longitudinal direction, the intersections of the AAs and GCs form memory cells, each cell has a structure sandwiched between an insulating film and the gate electrode, and a plurality of cells in a plane parallel to the AA direction and perpendicular to the substrate share the gate electrode.

(Effect of Mode (4))

(a) When memory layers sharing a gate electrode are formed on the two sides of an AA in a cell such as a PRAM cell or RRAM cell that senses the change in current amount by the change in resistance of a memory layer, if one memory layer is turned on and the resistance lowers, no electric current flows through the other memory layer having a high resistance. This makes the other memory layer difficult to turn on. However, the memory layers on the two sides of the AA are sometimes turned on in a certain cell. This makes it difficult to set the state of each cell constant. Since the electrode is formed on every other row, each AA is controlled by only the gate electrode on one side. This eliminates the instability of the write/erase characteristics.

(Effect of Mode (4) & (5))

(a) the cell transistor uses the depletion-type.

By this, the source/drain of the transistor is not formed in particular. This facilitates transistor shrinkage.

(5) A semiconductor memory described in any one of modes (1) to (4) is characterized by comprising stripe-like active areas (AAs) stacked parallel to a substrate, and gate electrodes (GCs) shared by the AAs, wherein each AA is made of single-crystal silicon or polysilicon.

(6) A semiconductor memory described in any one of modes (1) to (5) is characterized by comprising stripe-like active areas (AAs) stacked parallel to a substrate, gate electrodes (GCs) shared by the AAs, and a layer selection gate transistor for selecting a layer to which a group of AAs, among other AAs arranged into stripes, in a plane parallel to the substrate belongs.

(Effects of Mode (6))

(a) The use of the layer selection gate transistor obviates the need to extract interconnections from the stacked AAs in the direction perpendicular to them, and makes it possible to extract all the interconnections by the minimum pitch. This facilitates increasing the bit density.

(b) Peripheral circuits can be basically the same as in the conventional NAND flash memories. This facilitates circuit design.

(c) In the forming the layered select gate transistor which is selected each layers of stripe-like active area (AA) stacked parallel to a substrate, it is not necessary to increase the large number of process steps in this case that lithography process to expose each AA in the stairs-shaped, etching process and forming process the layer select gate transistor in each AA by simultaneous patterning. lithography process to expose AA for layer selection gate transistor formation is three times in 4 layer lamination, four times in 8 layer lamination, n+1 times in $2^n$ layer lamination.

(7) A semiconductor memory described in any one of modes (1) to (6) is characterized by comprising stripe-like active areas (AAs) stacked parallel to a substrate, and gate electrodes (GCs) shared by the AAs, wherein each of the stacked AAs is formed in a recess dug down from the substrate surface.

(Effect of Mode (7))

(a) Since the memory cell portion is formed in the recess dug down from the substrate surface, difference in level on the substrate surface can be suppressed. This facilitates lithography steps, processing steps, and interconnection formation.

(8) A semiconductor memory described in any one of modes (1) to (3) and (5) to (7) is characterized by comprising stripe-like active areas (AAs) stacked parallel to a substrate, and gate electrodes (GCs) shared by the AAs, wherein a memory element is a MONOS (Metal-Oxide-Nitride-Oxide-Silicon) element.

(9) A semiconductor memory described in mode (8) is characterized by comprising stripe-like active areas (AAs) stacked parallel to a substrate, gate electrodes (GCs) shared by the AAs, wherein a memory element is a MONOS (Metal-Oxide-Nitride-Oxide-Silicon) element, and the shape of the AA sidewall on which the memory element is formed has a curvature outward.

(Effect of Mode (9))

(a) Since the channel has a curvature, electric field concentration raises the effective electric field. This makes it possible to improve the write/erase characteristics.

(10) A semiconductor memory described in any one of modes (1) and (4) to (7) is characterized by comprising stripe-like active areas (AAs) stacked parallel to a substrate, and gate electrodes (GCs) shared by the AAs, wherein a memory element is a PRAM (Phase Change RAM).

(11) A semiconductor memory described in any one of modes (1) and (4) to (7) is characterized by comprising stripe-like active areas (AAs) stacked parallel to a substrate, and gate electrodes (GCs) shared by the AAs, wherein a memory element is an RRAM (Resistive RAM).

(12) A semiconductor memory manufacturing method which has stripe-like active areas (AAs) stacked parallel to a substrate described in mode (1), and forms the AAs stacked perpendicularly to the substrate in self-alignment with each other is characterized by alternately stacking insulating films and epitaxial silicon films or polysilicon films on a semiconductor substrate, and simultaneously processing the stacked films into AA shapes.

(13) A semiconductor memory manufacturing method which has stripe-like active areas (AAs) stacked parallel to a substrate described in mode (1), and forms the AAs stacked perpendicularly to the substrate in self-alignment with each other is characterized by alternately stacking epitaxial silicon germanium films and epitaxial silicon films on a semiconductor substrate, simultaneously processing the stacked films into AA shapes, removing the epitaxial silicon germanium films by wet etching, and filling insulating films in the gaps.

(Effect of Modes (12) & (13))

(a) Since the AAs are simultaneously processed, each of AA lithography and GC lithography requiring minimum half pitch patterning need only be performed once regardless of the number of stacked memory layers.

(Effects of Mode (13))

(a) In AA processing, it is only necessary to process the stacked films made of similar materials, i.e., epitaxial silicon and epitaxial silicon germanium. This facilitates RIE.

(b) Each epitaxial silicon layer as an AA is formed by epitaxial growth. This makes it possible to form a channel region of a transistor having good crystallinity without any complicated procedure such as solid-phase epitaxial growth.

(14) A semiconductor memory manufacturing method of forming gate electrodes that intersect stripe-like active areas (AAs) stacked parallel to a substrate described in mode (1) is characterized by filling conductor films in gaps between the stripe-like active areas (AAs) stacked parallel to the substrate and insulating films formed between the AAs, and patterning the conductor films by reactive ion etching.

(15) A semiconductor memory manufacturing method of forming gate electrodes that intersect stripe-like active areas (AAs) stacked parallel to a substrate described in mode (1) is characterized by filling insulator films in gaps between the stripe-like active areas (AAs) stacked parallel to the substrate and insulating films formed between the AAs, forming gaps as templates of gate electrodes, filling memory dielectric layers and conductor films in the gaps, and patterning the filled films by CMP.

(Effect of Modes (14) & (15))

(a) Since the GCs are simultaneously processed, each of AA lithography and GC lithography requiring minimum half pitch patterning need only be performed once regardless of the number of stacked memory layers.

(Effect of Mode (15))

(a) The GCs can be formed by a metal that is difficult to be processed by RIE.

(16) A semiconductor memory manufacturing method of forming contact plugs connecting to stripe-like active areas (AAs) stacked parallel to a substrate described in mode (1) is characterized by arranging contact plugs at two ends of each active area, each of which is formed over two adjacent AAs, so as to be in zigzag alignment with each other by one active area.

(Effect of Mode (16))

(a) Especially when two layers are stacked, contact plugs equal in number to AAs in the same plane are formed at the two ends of the AAs. Therefore, it is possible to access each AA by selecting two contact plugs. This facilitates formation of interconnections.

(17) A semiconductor memory manufacturing method of forming diodes in stripe-like active areas (AAs) stacked parallel to a substrate described in mode (1) is characterized by comprising steps of filling insulating films between rows of the stacked AAs, forming gaps as templates of gate electrodes in the insulating films, forming recesses in the AA sidewalls by using the insulating films as masks, and forming diodes by filling, in the recesses, semiconductor films having a conductivity type different from the AAs or by forming, on the surfaces of the recesses, semiconductor layers having a conductivity type different from the AAs by gas phase doping.

(Effect of Modes (17))

(a) It is possible to stack layers in a nonvolatile memory such as an RRAM or PRAM that senses the change in resistance.

(18) A semiconductor memory manufacturing method of forming electrodes of, e.g., an RRAM or PRAM in stripe-like active areas (AAs) stacked parallel to a substrate described in mode (1) is characterized by comprising steps of filling insulating films between rows of the stacked AAs, forming gaps as templates of gate electrodes in the insulating films, forming recessed diodes filled in the AA sidewalls by using the insulating films as masks, and filling electrode films in the recesses.

(19) A semiconductor memory manufacturing method of forming an RRAM described in mode (18) is characterized by comprising steps of filling first electrode films in recessed diodes filled in the sidewalls of stacked AAs, and forming memory dielectric films and second electrode films between rows of the AAs.

(Effects of Modes (17)-(19))

(a) It is possible to stack layers in a nonvolatile memory such as an RRAM or PRAM that senses the change in resistance.

(b) It is unnecessary to process the memory layer (a chalcogenide film that largely changes the resistance (normally, increases the resistance by thousand times) when heated in the case of a PRAM, and a metal oxide film such as $TiO_2$, $HfO_2$, $ZrO_2$, or nickel oxide in the case of an RRAM). This makes RIE processing of any new material unnecessary.

As described above, the embodiments of the present invention can provide a semiconductor memory having a structure in which memory layers can be stacked without largely increasing the number of process steps, and provide a method of manufacturing the semiconductor memory. In addition, the semiconductor memories disclosed in the embodiments make it possible to continuously increase the degree of integration of semiconductor memories, particularly, flash memories in the future. Accordingly, the range of applications of flash memories presumably further extends in the future.

Additional advantages and modifications will readily occur to those skilled in the art. Therefore, the invention in its broader modes is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory, comprising:
    a plurality of insulating layers stacked above a substrate;
    a plurality of stripe-shaped semiconductor layers stacked above the substrate and extending parallel to the substrate, each of the semiconductor layers being arranged between the insulating layers and having one end and an other end parallel to the substrate, the one end being a source, and the other end being a drain;
    a gate electrode formed only on both, side surfaces of the semiconductor layers and extending perpendicular to the substrate; and
    a plurality of cell transistors formed at intersections of the gate electrode and the semiconductor layers and being driven by the gate electrode in common, and
    wherein impurities are doped in each of the semiconductor layers constituting the cell transistors uniformly, and the cell transistors are transistors of depletion type.

2. The memory according to claim 1, in which the other ends of the stacked semiconductor layers form a stairs-shape, which further comprises a plurality of layer selecting transistors formed respectively on the other ends of the semiconductor layers of the stairs-shape and selecting each of the semiconductor layers.

3. The memory according to claim 1, further comprising a plurality of layer selecting transistors selecting each of the semiconductor layers, each of the layer selecting transistors being a tri-gate type in which a gate electrode covers a top surface and the both side surfaces of the semiconductor layer.

4. The memory according to claim 1, wherein the drains of the semiconductor layers are connected to an interconnection in common.

5. The memory according to claim 1, wherein the sources of the semiconductor layers are connected to an interconnection in common.

6. The memory according to claim 1, wherein a number of the semiconductor layers is four or more.

7. The memory according to claim 1, wherein the cell transistors are made of single-crystal silicon.

8. The memory according to claim 1, wherein the semiconductor layers are formed in a recess dug down from a top surface of the substrate, and a top most surface of the semiconductor layers is below the top surface of the substrate.

9. The memory according to claim 1, wherein a plurality of gate electrodes extending perpendicular to the substrate are formed only on side surfaces of the semiconductor layers and a plurality of cell transistors formed at intersections of the plurality of gate electrodes and one of the semiconductor layers form a NAND chain of a NAND flash memory.

10. The memory according to claim 1, wherein the semiconductor layers are equal in thickness.

11. The memory according to claim 1, wherein a plurality of stacked structures, each including the plurality of stripe-shaped semiconductor layers and extending in parallel with each other, are provided on the substrate, wherein a plurality of gate electrodes extending perpendicular to the substrate are filled between the plurality of stacked structures respectively, and the plurality of gate electrodes are connected with each other at a top most surface of the semiconductor layers.

* * * * *

UNITED STATES PATENT AND TRADEMARK OFFICE
CERTIFICATE OF CORRECTION

PATENT NO.       : 8,766,373 B2                                    Page 1 of 1
APPLICATION NO.  : 13/185930
DATED            : July 1, 2014
INVENTOR(S)      : Kiyotoshi et al.

It is certified that error appears in the above-identified patent and that said Letters Patent is hereby corrected as shown below:

On the Title page, Item (63) under Related U.S. Application Data, delete "Continuation of application No. 11/858,732, filed on Sep. 20, 2007, now Pat. No. 7,518,011." and insert therefor --Continuation of application No. 11/858,731, filed on Sep. 20, 2007, now Pat. No. 8,008,732.--.

Signed and Sealed this
Third Day of March, 2015

Michelle K. Lee
*Deputy Director of the United States Patent and Trademark Office*